(12) United States Patent
Shigematsu et al.

(10) Patent No.: US 6,898,002 B2
(45) Date of Patent: May 24, 2005

(54) OPTICAL DEVICE, OPTICAL MODULE, OPTICAL AMPLIFIER, AND OPTICAL TRANSMISSION SYSTEM

(75) Inventors: Masayuki Shigematsu, Yokohama (JP); Kenichiro Takahashi, Yokohama (JP); Tomomi Sano, Yokohama (JP); Akira Inoue, Yokohama (JP); Toshikazu Shibata, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 246 days.

(21) Appl. No.: 10/192,847

(22) Filed: Jul. 11, 2002

(65) Prior Publication Data

US 2003/0053197 A1 Mar. 20, 2003

Related U.S. Application Data
(60) Provisional application No. 60/367,772, filed on Mar. 28, 2002.

(30) Foreign Application Priority Data

Jul. 11, 2001 (JP) .................................... P2001-211222
Oct. 23, 2001 (JP) .................................... P2001-325259

(51) Int. Cl.[7] .............................................. H01S 3/00
(52) U.S. Cl. ................................ 359/337; 359/337.21
(58) Field of Search ........................... 359/337, 337.1, 359/337.21

(56) References Cited

U.S. PATENT DOCUMENTS

| | | | |
|---|---|---|---|
| 5,694,501 A | | 12/1997 | Alavie et al. |
| 6,055,348 A | * | 4/2000 | Jin et al. ...................... 385/37 |
| 6,148,128 A | * | 11/2000 | Jin et al. ...................... 385/37 |
| 6,154,590 A | * | 11/2000 | Jin et al. ...................... 385/37 |
| 6,360,042 B1 | * | 3/2002 | Long ........................... 385/37 |
| 6,633,695 B2 | * | 10/2003 | Bailey et al. ................. 385/24 |
| 6,633,702 B2 | * | 10/2003 | Hoshino ....................... 385/37 |

FOREIGN PATENT DOCUMENTS

| | | |
|---|---|---|
| JP | 7-128524 | 5/1995 |
| JP | 10-48425 | 2/1998 |
| JP | 2000-98146 | 4/2000 |
| JP | 2000-235170 | 8/2000 |

OTHER PUBLICATIONS

M.M. Ohn et al., "Dispersion variable fibre Bragg grating using a piezoelectric stack", Electronics Letters, Oct. 10, 1996, vol. 32, No. 21.

M. Wilkinson et al., "D–Fibre for Erbium Gain Spectrum Flattening", Electronics Letters, Jan. 16, 1992, vol. 28, No. 2, pp. 131–132.

Osamu Ogawa et al., "A Basic Study on Tunable Fiber Grating for Dispersion Compensation", Feb. 16, 2001, vol. OQD–01, No. 16–22, pp. 1–6.

Ken'ichiro Takahashi et al., "Tunable dispersion compensator using chirped fiber Bragg grating with strain control", Mar. 7, 2002, p. 272.

\* cited by examiner

*Primary Examiner*—Mark Hellner
(74) *Attorney, Agent, or Firm*—McDermott Will & Emery LLP

(57) ABSTRACT

The present invention relates to an optical device and the like which can facilitate a fine adjustment for an optical waveguide type diffraction grating device. The optical device includes a flexible member in which the optical waveguide type diffraction grating device is secured to a predetermined position, and bending means for applying a stress to said optical waveguide type diffraction grating device by bending said flexible member. The optical device changes the optical characteristics of the optical waveguide type diffraction grating device by adjusting the stress applied thereto by the bending means, to thereby perform easily various functions such as optical multiplexing, optical demultiplexing, path changing, and adjustment of dispersion characteristics.

79 Claims, 23 Drawing Sheets

*Fig.15A*
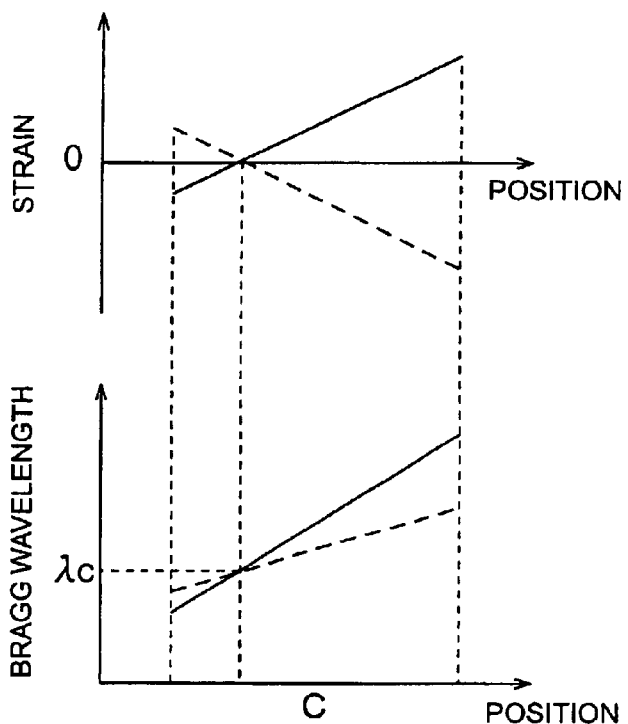
*Fig.15B*
*Fig.15C*
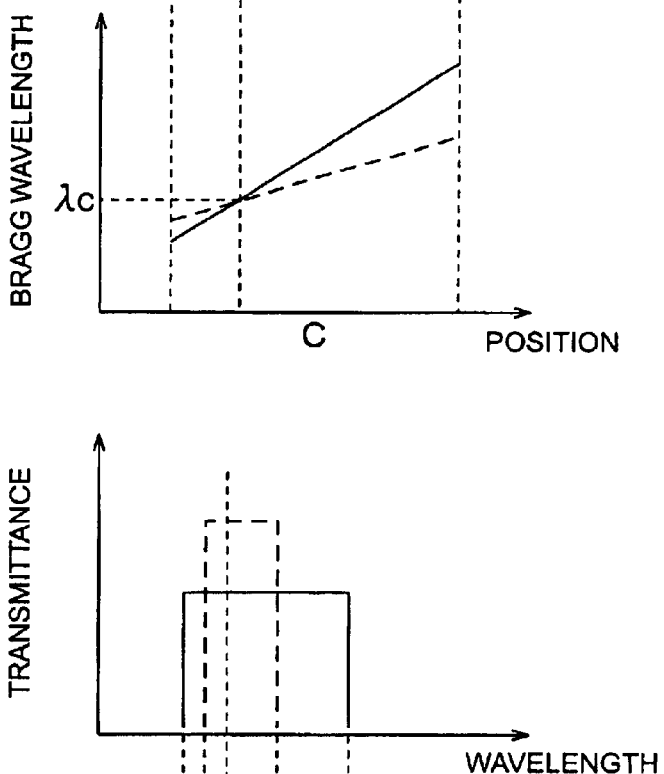
*Fig.15D*
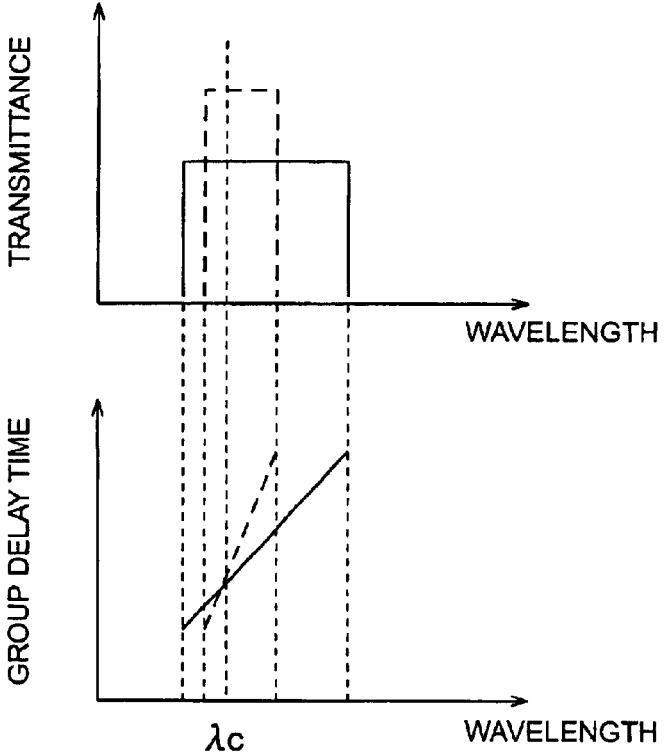

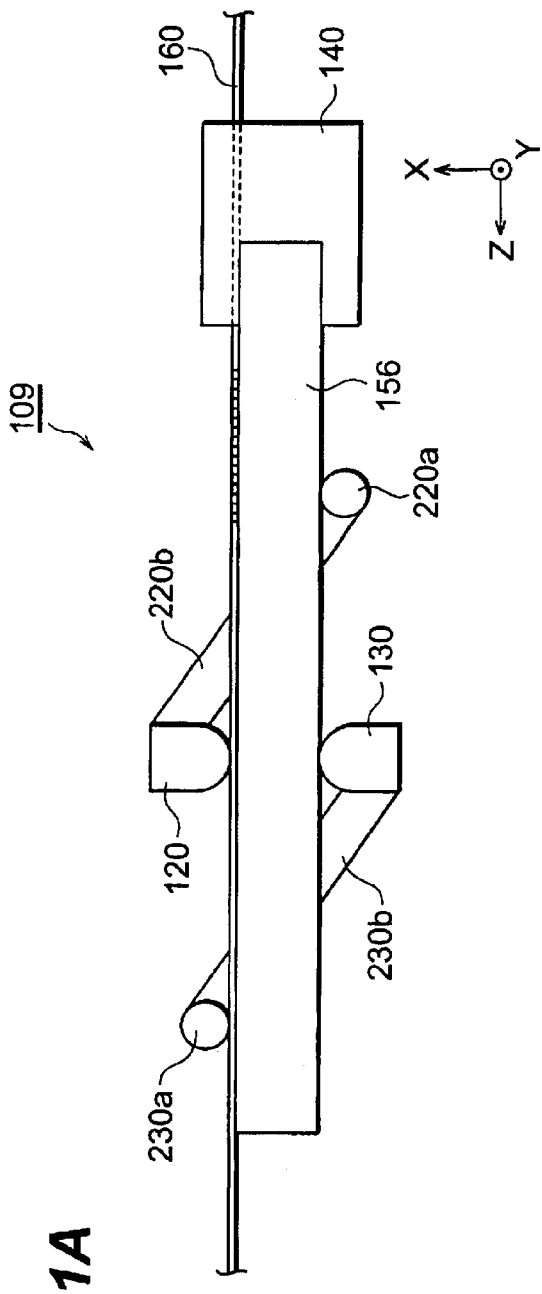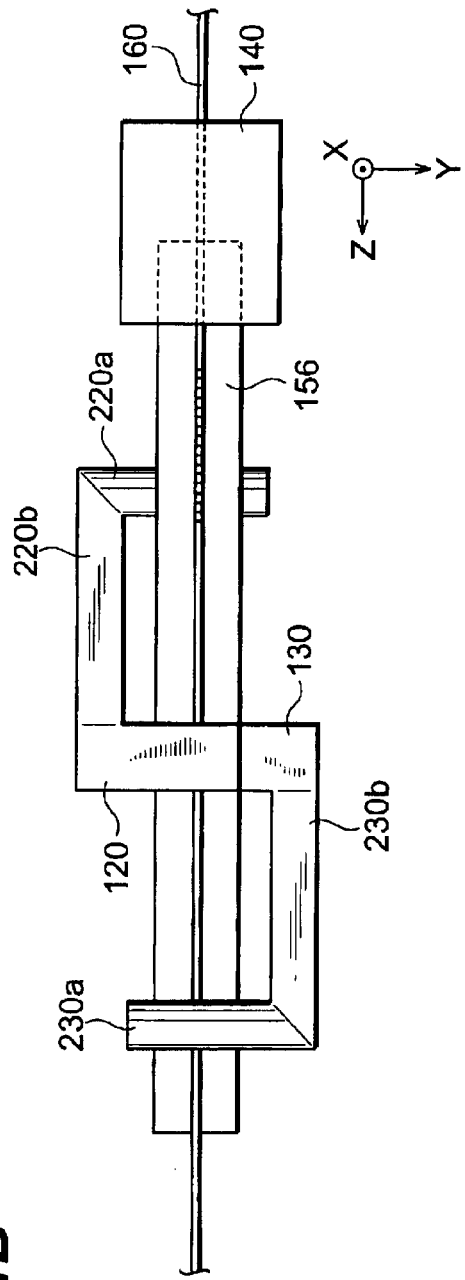

OPTICAL DEVICE, OPTICAL MODULE, OPTICAL AMPLIFIER, AND OPTICAL TRANSMISSION SYSTEM

CROSS-REFERENCE TO RELATED APPLICATIONS

The present application claims a priority of the Provisional Application (Ser. No. 60/367,772) in the United States (Title of the Invention: "Optical device, Optical Module, Optical Amplifier, and Optical transmission System") filed on Mar. 28, 2002 and incorporated by reference in its entirety.

BACKGROUND OF THE INVENTION

1. Field of the Invention

The present invention relates to an optical device having an optical waveguide type diffraction grating device, an optical module including this optical device, an optical amplifier including this optical device, and an optical transmission system including at least either of these optical module and optical amplifier.

2. Related Background Art

An optical waveguide type diffraction grating device is an optical device in which an optical waveguide (e.g., an optical fiber) is formed with a grating based on refractive index modulation over a predetermined range along the longitudinal direction of the optical waveguide, and can selectively reflect or attenuate light of a specific wavelength from the light propagating through the optical waveguide by way of the grating. Here, the "grating" simply referred to in this specification includes: Bragg gratings for Bragg-reflecting light of a specific wavelength having propagated through an optical waveguide to transmit thus reflected light in the opposite direction; tilted Bragg gratings having a tilted refractive index modulation for Bragg-reflecting light of a specific wavelength having propagated through the optical waveguide and causing a loss thereto; and long-period gratings for converting core-mode light of a specific wavelength having propagated through an optical waveguide into cladding-mode light and causing a loss thereto.

An optical waveguide type diffraction grating device having a Bragg grating is applied as a constituent of an optical module for reflecting light of a specific wavelength to multiplex or demultiplex the light or change a path of the light (e.g., optical multiplexer, optical demultiplexer, optical ADM (Add-Drop Multiplexer), or optical XC (Cross Connect)). An optical waveguide type diffraction grating device having a tilted Bragg grating or long-period grating acts as a loss filter for causing a loss in light of a predetermined wavelength, and is applied as a constituent to a gain equalizer for equalizing gain in an optical amplifier, for example. The optical module or optical amplifier is widely used in a wavelength division multiplexing (WDM) communication system for transmitting multiplexed signal light of a plurality of channels, and the like.

Meanwhile, an optical waveguide type diffraction grating device which can dynamically adjust its reflection spectrum is disclosed in Japanese Patent Application Laid-Open No. 2000-98146 (First Reference). The optical waveguide type diffraction grating device disclosed in this First Reference is one in which an optical fiber is formed with a Bragg grating, the optical fiber being longitudinally expanded by a mechanical or magnetic force (with a solenoid, for example), so as to extend the grating period, thereby shifting the reflection wavelength to the longer wavelength side. Optical modules using such an optical waveguide type diffraction grating device can dynamically adjust multiplexing and demultiplexing of light or changing of the optical path.

On the other hand, an optical waveguide type diffraction grating device can selectively reflect or attenuate light of a specific wavelength from light propagating through an optical waveguide by way of a grating. Particularly, the optical waveguide type diffraction grating device having a chirped Bragg grating whose refractive index modulation grating period changes along the longitudinal direction can reflect light of a wavelength satisfying a Bragg condition at each position in the longitudinal direction of the grating, and thus can be used as a constituent of a dispersion-adjusting module for adjusting the chromatic dispersion of light in a fixed wavelength region. The dispersion-adjusting module is provided in a repeater or the like, or just in front of a receiver in an optical transmission system which transmits signal light, and can compensate for the chromatic dispersion of an optical fiber transmission line.

In the dispersion-adjusting module including an optical waveguide type diffraction grating device having a chirped Bragg grating, its dispersion characteristic is preferably adjustable. For example, each of dispersion-adjusting modules mass-produced with a predetermined spec can be installed in a repeater or the like, or just in front of a receiver, so that the dispersion characteristic of the dispersion-adjusting module can be adjusted according to the dispersion characteristic of the optical fiber transmission line to be subjected to dispersion compensation, whereby dispersion-adjusting modules can be made inexpensively. Also, when the dispersion characteristic of the optical fiber transmission line to be subjected to dispersion compensation varies due to a temperature change, the dispersion characteristic of the dispersion-adjusting module can be adjusted according to the variation, whereby the chromatic dispersion of the optical fiber transmission line can always be compensated for by the dispersion-adjusting module favorably.

As an optical member including an optical waveguide type diffraction grating device which is applicable to such a dispersion-adjusting module having a variable dispersion characteristic, those disclosed in Japanese Patent Application Laid-Open No. 2000-235170 (Second Reference) and a literature,—M. M. Ohn, et al., "Dispersion variable fibre Bragg grating using a piezoelectric stack", Electronics Letters, Vol. 32, No. 21 (1996) (Third Reference)—have been known.

A technique disclosed in the above-mentioned Second Reference has an optical fiber that is an optical waveguide, and is formed with a grating over a predetermined range along the longitudinal direction thereof, whereas a plurality of microheaters are disposed in contact with the optical fiber in the predetermined range. These plurality of microheaters form a temperature distribution in the above predetermined range of the optical fiber, which adjusts the effective refractive index of the grating at each position, thereby regulating the dispersion characteristic of the grating upon reflection of light.

The above-mentioned Third Reference disclose a structure in which a grating is formed over a predetermined range along the longitudinal direction of an optical fiber which is an optical waveguide, and a plurality of piezoelectric devices are disposed in contact with the optical fiber in the predetermined range. These plurality of piezoelectric devices form a stress distribution in the predetermined range of the optical fiber, which adjusts the grating spacing of the grating at each position, thereby regulating the dispersion characteristic of the grating upon reflection of light.

SUMMARY OF THE INVENTION

After reviewing the aforementioned prior art, the following problem has been found out.

That is, there is a problem such that a mechanism for modifying a reflection wavelength of the optical waveguide type diffraction grating device, disclosed in the above First Reference is enlarged. For example, with respect to a fiber grating of 50 mm in length, in a case where its reflection wavelength is changed by 0.8 nm (frequency spacing of 100 GHz), a fiber dislocation to be needed is 33 μm. On the other hand, a stroke of a solenoid to extend the fiber grating in the longitudinal direction is approximately 1 mm or more. Therefore, the solenoid cannot be used directly, and any dislocation transferring mechanism is necessary, which cannot prevent an enlarged mechanism to adjust minutely the reflective wavelength in gratings. This is applicable similarly to an optical waveguide type diffraction grating device which has tilted Bragg gratings or long-period gratings.

In addition, in the optical waveguide type diffraction grating device disclosed in the aforementioned Second and Third References, it is necessary to control the plurality of microheaters or piezo devices, but the controlling is not easy.

The present invention is made to overcome the aforementioned problems. It is therefor an object to provide: an optical device in which a fine adjustment for a reflection spectrum or loss spectrum of an optical waveguide type diffraction grating device having a grating can be easily performed; an optical module including the optical device; an optical amplifier including the optical device; and an optical transmission system including this optical module and/or optical amplifier.

An optical device in accordance with the present invention includes at least an optical waveguide type diffraction grating device, a flexible member, and first bending means. The optical waveguide type diffraction grating device has an optical waveguide and a Bragg grating formed in the optical waveguide, and Bragg-reflects, through the Bragg grating, the light of a specific wavelength which propagates the optical waveguide in a first direction, and transmits through thus reflected light in a second direction opposite to the first direction. The flexible member has a flexibility, and at least apart of the optical waveguide type diffraction grating device is secured at a part to which a compressive stress or tensile stress is applied upon bending. In addition, the first bending means adjusts the reflective wavelength in the optical waveguide type diffraction grating device by bending the flexible member along a first reference axis. Specifically, when the first bending means applies the compressive stress to the part of the flexible member to which the optical waveguide type diffraction grating device is secured, the reflective wavelength in the optical waveguide type diffraction grating device becomes a first wavelength $\lambda_1$, while when the first bending means applies the tensile stress to the part of the flexible member to which the optical waveguide type diffraction grating device is secured, the reflective wavelength in the optical waveguide type diffraction grating device becomes a second wavelength $\lambda_2$. Here, $\lambda_1 \neq \lambda_2$.

Here, in addition to the first bending means, the optical device in accordance with the present invention may further include second bending means for bending the flexible member along a second reference axis different from the first reference axis. The second bending means has a function similar to the first bending means.

In the optical device in accordance with the present invention, it is preferable that the optical waveguide type diffraction grating device has a reflection wavelength between the first and second wavelengths when the flexible member is not bent by the first bending means. Further, it is preferable that the first and second wavelengths are two wavelengths adjacent each other in signal light of a plurality of channels in an optical transmission system or the like applied by this optical device. In this case, the reflection wavelength can be changed over without affecting signal light of other wavelengths.

An optical module in accordance with the present invention includes the optical device having the aforementioned structure. By reflecting light of a specific wavelength, the optical module can perform easily multiplexing or demultiplexing of light, or path changing of light. Such an optical module includes an optical multiplexer, an optical demultiplexer, an optical ADM, or an optical XC, for example. This optical module can multiplex or demultiplex light or change a path thereof by reflecting the light of a specific wavelength through the optical device, whereby the wavelength of light to be subjected to multiplexing, demultiplexing, or path changing can be easily changed.

It is preferable that the optical module in accordance with the present invention further includes equalizing means for equalizing the wavelength dependence of loss upon reflecting or transmitting light in the optical device. In this case, since the wavelength dependence of loss upon reflecting or transmitting light in the optical device is equalized by the equalizing means, the loss spectrum in the optical module becomes flat.

In the optical device in accordance with the present invention, the optical waveguide type diffraction grating device may have an optical waveguide and a long period grating formed in the optical waveguide. In this case, the first bending means provides a compressive or tensile stress to a part of the flexible member to which the optical waveguide type diffraction grating device is secured by bending the flexible member along the first reference axis, to thus adjust the loss spectrum in the optical waveguide type diffraction grating device. In the optical device, the optical waveguide type diffraction grating device having a long period grating is secured to the flexible member, and is provided with a stress when the flexible member is bent under the action of the bending means (the second bending means as well). The loss spectrum in the optical waveguide type diffraction grating device is adjusted according to the stress applied thereto. In addition to the first bending means, the optical device also may have the second bending means which can provide bending along the second reference axis which is different from the first reference axis.

Further, in the optical device in accordance with the present invention, the optical waveguide type diffraction grating device may have a Bragg grating formed in a tilted state to the optical waveguide. Thus, the optical waveguide type diffraction grating device having a tilted Brag grating Bragg-reflects by way of the Bragg grating the light of a specific wavelength which has propagated through the optical waveguide so as to cause a loss in the light of a specific wavelength propagating through the optical waveguide. In this case, the first bending means provides a compressive or tensile stress to a part of the flexible member to which the optical waveguide type diffraction grating device of the flexible member is secured by bending the flexible member along the first reference axis, to thus adjust the loss spectrum in the optical waveguide type diffraction grating device. In the optical device, the optical waveguide type diffraction grating device having a tilted Bragg grating is secured to a flexible member and is provided with a stress when the flexible member is bent under the action of the bending means. Then, the loss spectrum in the optical waveguide type diffraction grating device is adjusted according to the stress applied thereto. Incidentally, in addition to the first bending means, the optical device also may have the second bending means for providing bending along the second reference axis which is different from the first reference axis.

An optical amplifier in accordance with the present invention includes an optical amplification medium for amplifying light; and the optical device (optical device in accordance with the present invention), having the aforementioned structure, for equalizing a gain of amplification in the optical amplification medium. In this optical amplifier, the loss spectrum in the optical device has substantially the same form as that of the gain spectrum in the optical amplification medium, whereby the gain of amplification can be equalized. In such an optical amplifier, even when the gain spectrum in the optical amplification medium fluctuates, the loss spectrum in the optical device can be dynamically adjusted, and thereby the gain of amplification can always be equalized.

In the optical device in accordance with the present invention which is provided with the aforementioned structure, it is preferable to employ a solenoid for the bending means (corresponding to the first and second bending means). The solenoid requires an exciting coil to be energized only upon the transition between an attracted state and a detached or free state, without requiring the exciting coil to be energized for keeping the attracted state or detached state, thereby being preferable in terms of reduced power consumption. The solenoid is also preferable in that even when power supply is stopped upon power failure, it can keep the state immediately before that. Incidentally, in a case where a stress is applied to the optical waveguide type diffraction grating device by the bending means, the reflection wavelength of the optical waveguide type diffraction grating device may vary or vibrate when the solenoid is in direct contact with the optical waveguide type diffraction grating device. In order to prevent such a chattering, the optical device preferably further includes a shock absorber arranged between the solenoid included in the bending means and the flexible member secured with the optical waveguide type diffraction grating device. To the contrary, in a state where a stress is not applied to the optical waveguide type diffraction grating device by the bending means, it is necessary to avoid the variation of the central reflection wavelength in the optical waveguide type diffraction grating device. Therefore, it is preferable that the bending means (corresponding to the first and second bending means) has a structure to maintain a neural state of the flexible member.

Preferably, the optical device in accordance with the present invention further includes compensating means for compensating for a characteristic change of the optical waveguide type diffraction grating device caused by a temperature change. In this case, even when the characteristic of the optical waveguide type diffraction grating device changes due to a temperature change, the characteristic change can be compensated by the compensating means, and thereby the temperature dependence of the optical waveguide type diffraction grating device can be reduced.

In the optical device in accordance with the present invention, the flexible member preferably changes thickness along a predetermined direction. On the other hand, preferably, the bending means secures one end side of the flexible member with a greater thickness and displaces the other end side of the flexible member with a smaller thickness in the thickness direction, thereby bending the flexible member. In this case, as compared with a case where the flexible member has a constant thickness along a predetermined direction, the stress applied to the optical waveguide type diffraction grating device can be made uniform along the longitudinal direction thereof.

In the optical device in accordance with the present invention, the optical waveguide type diffraction grating device may be secured within the flexible member and changes the distance from a surface of the flexible member along a predetermined direction of the flexible member. On the other hand, the bending means may secure one end side of the flexible member where the distance is greater and displace the other end side of the flexible member where the distance is smaller in the thickness direction, thereby bending the flexible member. In this case, as compared with a case where the flexible member has a constant distance between the surface of the flexible member and the optical waveguide type diffraction grating device along a predetermined direction, the stress applied to the optical waveguide type diffraction grating device can be made uniform along the longitudinal direction thereof.

In addition, in the optical device in accordance with the present invention, the optical waveguide device is preferably secured to the flexible member so that a tensile stress can be applied to the optical waveguide type diffraction grating device in a state where the flexible member is not bent. Additionally, the tensile stress applied to the optical waveguide type diffraction grating device in a state where the flexible member is not bent is adjusted so that the optical waveguide type diffraction grating can attain a predetermined optical characteristic. In such a way, the optical waveguide type diffraction grating device is provided with a stress even when the flexible member is not bent, whereby the optical waveguide type diffraction grating device exhibits a desirable optical characteristic.

An optical transmission system in accordance with the present invention is an optical transmission system which transmits multiplexed signal light of a plurality of channels, the optical transmission system having the optical module including the optical device having the aforementioned structure. The optical transmission system can perform easily multiplexing, demultiplexing, or path-changing the multiplex signal light by the optical module. Incidentally, in this optical transmission system, the multiplexing, demultiplexing, or path-changing of the multiplex signal light can dynamically be altered by the optical module.

The optical transmission system according to the present invention is one which transmits multiplex signal light of a plurality of channels, the optical transmission system including the aforementioned optical amplifier, by which the signal light of a plurality of channels is amplified. In this optical transmission system, since the optical amplifier has a flat gain spectrum, an optical transmission can be carried out with a high quality.

Further, in the optical device in accordance with the present invention, an optical waveguide type diffraction grating device may have an optical waveguide and a Bragg grating formed in the optical waveguide, and maybe provided for the flexible member so as to obliquely intersect a neutral plane upon bending of the flexible member when a stress is applied by the first bending means. In addition, a dispersion-adjusting module as an optical module in accordance with the present invention includes an optical device having the aforementioned structure, and reflects light through the optical waveguide type diffraction grating device included in the optical device, to thus adjust the wavelength dispersion of the light.

According to the optical device, in the optical waveguide type diffraction grating device disposed so as to intersect a neutral plane upon bending of the flexible member when the flexible member is bent under the action of the first bending means, a tensile stress acts along the longitudinal direction on one side of the intersection with the neutral plane and thus generates an expanding strain there, whereas a compressive stress acts along the longitudinal direction on the other side of the intersection with the neutral plane and thus generates a compressive strain there. As a result, in the optical waveguide type diffraction grating device, the Bragg wavelength becomes longer at each position on one side of the intersection according to the degree of the expanding strain, whereas the Bragg wavelength becomes shorter at each position on the other side of the intersection according to the degree of the compressive strain. The respective longitudinal distributions (polarity and absolute value of inclination) of the strain and Bragg wavelength in the optical waveguide type diffraction grating device correspond to the bending direction and the degrees of flexure of the flexible member. The band, reflectance, and dispersion characteristic of light reflected by the optical waveguide type diffraction grating device vary depending on the bending direction and degree of flexure of the flexible member. Further, the group delay characteristic of the dispersion-adjusting module including the optical device in accordance with the present invention also varies depending on the bending direction and degree of flexure of the flexible member.

Also, the optical device having the aforementioned structure may further include second bending means for bending the flexible member by applying a stress to the flexible member along a second reference axis, which is different from the first reference axis. Incidentally, the optical waveguide type diffraction grating device is preferably secured to the flexible member to be in parallel to the neutral face upon bending of the flexible member when the stress is applied thereto by the second bending means. In this case, the group delay characteristic in the optical waveguide type diffraction grating device upon reflection is adjusted under the action of the first bending means (dispersion-adjusting function); whereas the band in the optical waveguide type diffraction grating device upon reflection also is adjusted under the action of the second bending means (temperature-compensating function).

The flexible member included in the optical device is preferably made of a resin, and the optical waveguide type diffraction grating device is preferably molded with the resin by the flexible member. In addition, the flexible member may include first and second members for holding and securing the optical waveguide type diffraction grating device between the first and second members, and also have an elongated groove portion for securing the optical waveguide type diffraction grating device. Any one of these cases is most favorable as a structure which secures the optical waveguide type diffraction grating device at a desirable position with respect to the flexible member.

In addition, the flexible member included in the optical device preferably has a shape such that at least one of the cross-sectional area and rigidity changes along the longitudinal direction. In this case, since the distribution of the tensile stress or compressive stress in the optical waveguide type diffraction grating device upon bending of the flexible member can be made favorable, the reflection characteristic of light in the optical waveguide type diffraction grating device can be optimized.

Here, an optical device adjusting method having the aforementioned structure (an optical device adjusting method in accordance with the present invention) includes the steps of: monitoring a dispersion characteristic of light reflected by the optical waveguide type diffraction grating device; and adjusting, according to a result of the monitoring, the amount of flexure of the flexible member caused by the first bending means. When the optical device is adjusted as such, the reflection characteristic of light in the optical waveguide type diffraction grating device included in the optical device can be easily adjusted, and the transmission characteristic of light in the dispersion-adjusting module including the optical device can be easily regulated.

The optical transmission system in accordance with the present invention is one which transmits signal light of a plurality of channels which are different in wavelength from one another, this system including a dispersion-adjusting module having the aforementioned structure (an optical module in accordance with the present invention), and the chromatic dispersion of optical fiber transmission lines can be compensated by the dispersion-adjusting module. In accordance with to the optical transmission system, a high-quality signal light transmission can be performed since the dispersion-adjusting module compensates for the chromatic dispersion of the optical fiber transmission line. Also, since the dispersion characteristic of the dispersion-adjusting module is adjustable, the dispersion-adjusting module can be mass-produced with a predetermined spec, and the dispersion characteristic thereof can be adjusted after the installation according to the dispersion characteristic of the optical fiber transmission line to be subjected to dispersion compensation. Therefore, the dispersion-adjusting module can be made inexpensively, and the optical transmission system becomes inexpensive. Also, when the dispersion characteristic of the optical fiber transmission line which is subjected to dispersion compensation varies due to a temperature change, the dispersion characteristic of the dispersion-adjusting module can be adjusted according to the variation; therefore, the chromatic dispersion of the optical fiber transmission line can be always compensated most favorably for by the dispersion-adjusting module.

BRIEF DESCRIPTION OF THE DRAWINGS

FIGS. 15A–15D are graphs for explaining another operative example of the optical module and the optical module including the same (first embodiment) in accordance with the fourth embodiment;

FIGS. 31A and 31B are plan views showing a configuration of a seventh embodiment in the optical device in accordance with the present invention;

DETAILED DESCRIPTION OF THE PREFERRED EMBODIMENTS

In the following, embodiments of optical devices and the like according to the present invention will be explained in detail with reference to FIGS. 1–13, 14A–15D, 16–22, 23A–25B, 26–30, 31A, 31B and 32–37. In the explanation of the drawings, constituents identical to each other will be referred to with numerals identical to each other without repeating their overlapping descriptions.

Figure 1:
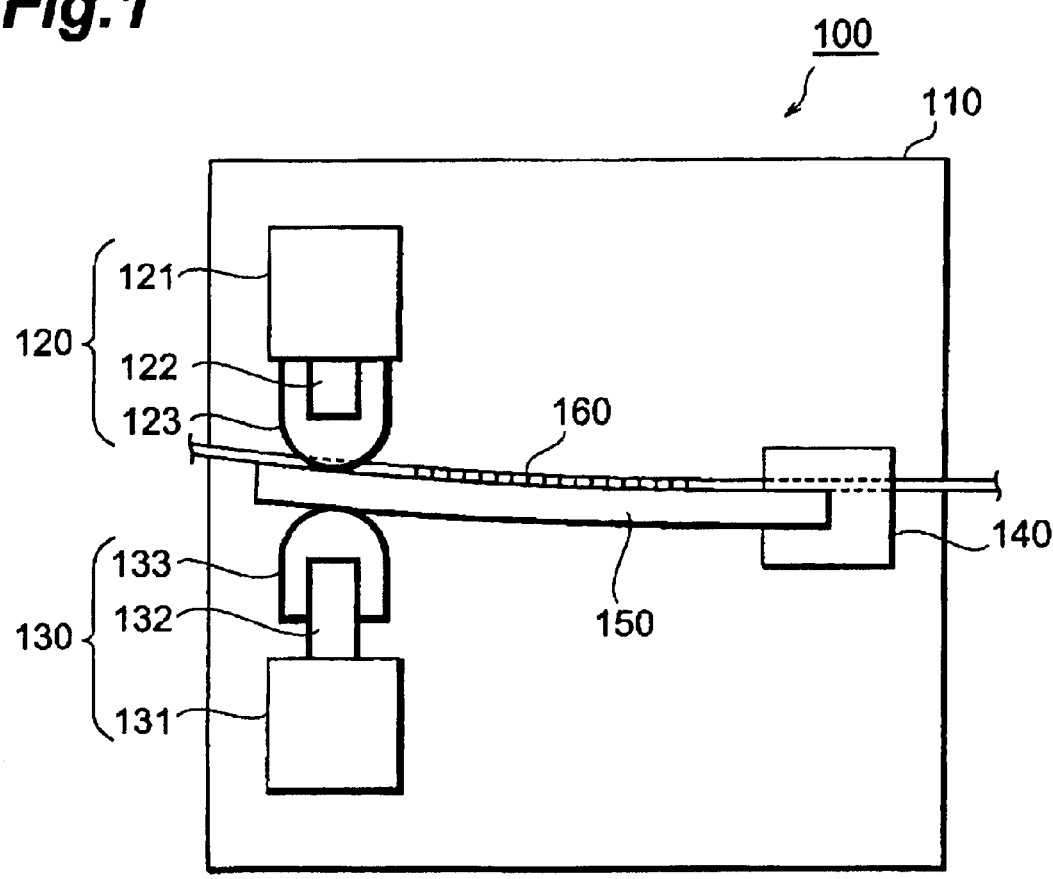
FIG. 1 is a plan view showing a configuration of a first embodiment in an optical device in accordance with the present invention.
Figure 2:
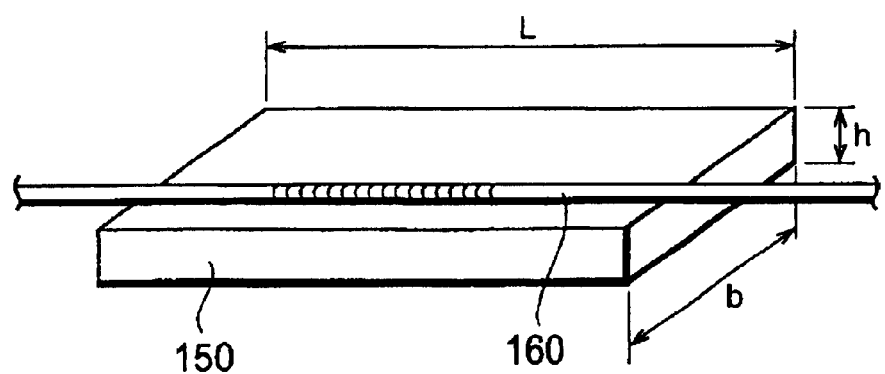
FIG. 2 is a perspective view showing a flexible member and an optical waveguide type diffraction grating device included in the optical device in accordance with the first embodiment.

FIG. 1 is a plan view of an optical device 100 in accordance with the present invention. FIG. 2 is a perspective view of a flexible member 150 and an optical waveguide type diffraction grating device 160 included in the optical device 100 in accordance with the first embodiment. This optical device 100 includes a substrate 110, solenoids 120, 130, a securing member 140, the flexible member 150, and the optical waveguide type diffraction grating device 160.

A body part 121 of the solenoid 120, a body part 131 of the solenoid 130, and the securing member 140 are secured onto the substrate 110. One end side of the flexible member 150 is secured to the securing member 140. The other end side of the flexible member 150 is positioned between a cap part 123 disposed at the leading end of a movable part 122 of one solenoid 120 and a cap part 133 disposed at the leading end of a movable part 132 of the other solenoid 130.

The solenoid 120 also includes an exciting coil in addition to the body part 121, movable part 122, and cap part 123, and can move the movable part 122 with respect to the body part 121 when the exciting coil is energized. The solenoid 120 attains one of a state where the movable part 122 is attracted to the body 121 (hereinafter referred to as "attracted state") or a state where the movable part 122 is held at a position apart from the body 121 by a predetermined distance (hereinafter referred to as "detached state"). In particular, the solenoid 120 requires the exciting coil to be energized only upon transitions between the attracted state and the detached state, without requiring the exciting coil to be energized for keeping the attracted state or detached state, which is favorable in terms of reduced power consumption. The solenoid 120 also is favorable in that even when power supply is stopped upon a power failure, it can keep the state immediately before that. The same holds for the solenoid 130.

The solenoids 120, 130 and the securing member 140 act as bending means for bending the flexible member 150. Namely, when the solenoid 120 is in the attracted state while the solenoid 130 is in the detached state, the flexible member 150 is bent to be convex toward the solenoid 130, as shown in FIG. 1. When the solenoid 120 is in the detached state while the solenoid 130 is in the attracted state, the flexible member 150 is bent to be convex toward the solenoid 120, contrary to the manner shown in FIG. 1.

The flexible member 150 is made of a material having a flexibility, while having the optical waveguide type diffraction grating device 160 secured to a part (e.g., on the surface on the solenoid 120 side or the inside shifted toward the solenoid 120 from the center) to which a compressive stress or tensile stress is applied upon bending. The flexible member 150 is preferably made of fiber-reinforced plastics, for example. In FIG. 2, "L" is the length of the flexible member 150 from the position of the free end which is held between the cap part 123 of the solenoid 120 and the cap part 133 of the solenoid 130 to the position of the fixed end which is secured by the securing member 140. Here, "h" is the thickness of the flexible member 150 in the direction connecting the solenoids 120 and 130 to each other. On the other hand, "b" is the width of the flexible member 150.

The optical waveguide type diffraction grating device 160 has an optical fiber that is an optical waveguide, and a grating formed on the optical fiber, and a compressive stress or tensile stress is applied to the device 160 in the longitudinal direction by bending of the flexible member 150.

The optical fiber which constitutes the optical waveguide type diffraction grating device 160 is based on silica type glass; and has a core region doped with $GeO_2$ and a cladding region surrounding this core region. When this optical fiber is irradiated with refractive index change inducing light (e.g., UV laser light of a wavelength of 248 nm outputted from a KrF excimer laser light source) spatially intensity-modulated in the longitudinal direction, a grating is formed in the core region of the optical fiber, whereby the optical waveguide type diffraction grating device 160 is obtained. When a phase grating mask is disposed beside the optical fiber, which is irradiated with refractive index change inducing light by way of the phase grating mask, (+) first-order diffracted light and (−) first-order diffracted light are generated upon the action of the phase grating mask along with the irradiation, and their interference fringes are formed in the core region, whereby a Bragg grating or tilted Bragg grating is formed in conformity to the power distribution of refractive index change inducing light in the interference fringes. On the other hand, when an intensity modulation mask is disposed beside the optical fiber, which is irradiated with the refractive index change inducing light by way of the intensity modulation mask, a long-period grating is formed in conformity to the power distribution of the refractive index change inducing light transmitted through the intensity modulation mask.

In the optical device 100, the flexible member 150 is bent under the action of the solenoids 120 and 130, and the optical waveguide type diffraction grating device 160 secured to the flexible member 150 is provided with a compressive stress or tensile stress according to this bending. This stress changes the grating period, whereby the optical characteristic (reflection spectrum or loss spectrum) of the optical waveguide type diffraction grating device 160 changes. In the optical device in accordance with the present invention, since the optical waveguide type diffraction grating device 160 is compressed/expanded by bending the flexible member 150, the amount of strain in the optical waveguide type diffraction grating device 160 is still small even when the amount of flexure of the flexible member 150 is larger, and the optical characteristic of the optical waveguide type diffraction grating device 160 can be adjusted minutely, as compared with a conventional optical device where the optical waveguide type diffraction grating device is directly compressed/expanded in the longitudinal direction thereof.

The optical characteristic of the optical waveguide type diffraction grating device 160 is changed not only by the stress applied thereto but also by temperature. Namely, the effective refractive index and grating period vary due to a temperature change, and thereby the optical characteristic of the optical waveguide type diffraction grating device 160 changes. Therefore, there is preferably provided compensating means for compensating for the characteristic change in the optical waveguide type diffraction grating device 160 caused by a temperature change. Specific examples of the compensating means will now be explained below. When the flexible member 150 is made of a material having an appropriate coefficient of thermal expansion, thermal expansions/contractions of the flexible member 150 are utilized so as to compensate for the characteristic change of the optical waveguide type diffraction grating device 160. Or, when the movable parts 122, 132 and cap parts 123, 133 each are made of a material having an appropriate coefficient of thermal expansion, their expansions/contractions are utilized so as to compensate for the characteristic change of the optical waveguide type diffraction grating device 160. Or, in addition to (or in place of) the solenoids 120, 130, a mechanism for adjusting the amount of flexure of the flexible member 150 is installed, and adjusts the amount of flexure, thereby compensating for the characteristic change of the optical waveguide type diffraction grating device 160. In such a configuration, the temperature dependence of the optical characteristic of the optical waveguide type diffraction grating device 160 will be improved.

It is preferable that the optical waveguide type diffraction grating device 160 is secured to the flexible member 150 by applying a stress to the optical waveguide type diffraction grating device 160 in a state where the flexible member 150 is not bent. In such a configuration, even when the flexible member 150 is not bent, a stress is applied to the optical waveguide type diffraction grating device 160, whereby the optical waveguide type diffraction grating device 160 exhibits a desirable optical characteristic.

The optical device 100 including the optical waveguide type diffraction grating device 160 having a Bragg grating will now be explained. In this case, the optical waveguide type diffraction grating device 160 Bragg-reflects the light of a specific wavelength propagating through an optical fiber and transmits through thus reflected light through the optical fiber in the opposite direction. When the flexible member 150 is not bent, the reflection wavelength o is represented by the following expression (1):

$$\lambda_0 = 2n\Lambda_0 \tag{1}$$

where $\Lambda_0$ is the period of the Bragg grating, and n is the effective refractive index in the Bragg grating forming area.

In the optical device 100, when the solenoid 120 is in the attracted state while the solenoid 130 is in the detached state, the flexible member 150 is bent to be convex toward the solenoid 130, thus providing the optical waveguide type diffraction grating device 160 with a compressive stress, so that the grating period becomes $\Lambda_1$, whereas the reflection wavelength becomes 80 $_1$. On the other hand, when the solenoid 120 is in the detached state while the solenoid 130 is in the attracted state, the flexible member 150 is bent to be convex toward the solenoid 120, thus providing the optical waveguide type diffraction grating device 160 with a tensile stress, so that the grating period becomes $\Lambda_2$, whereas the reflection wavelength becomes $\lambda_2$. Relations expressed by the following expressions (2a)–(2d) are held among these parameters:

$$\lambda_1 = 2n\Lambda_1 \tag{2a}$$

$$\lambda_2 = 2n\Lambda_2 \tag{2b}$$

$$\Lambda_1 < \Lambda_0 < \Lambda_2 \tag{2c}$$

$$\lambda_1 < \lambda_0 < \lambda_2 \tag{2d}$$

Assuming a case where the optical device 100 is used in an optical transmission system for WDM-transmitting signal light of a plurality of channels at a wavelength spacing of 1.6 nm (frequency spacing of 200 GHz) in the wavelength band of 1.55 $\mu$m, preferably, a signal light wavelength is $\lambda_1$ whereas its adjacent signal light wavelength is $\lambda_2$. Namely, it is preferable to satisfy a relation expressed by the following expression (3):

$$\Delta\lambda = \lambda 2 - \lambda 1 = 1.6 \text{ nm}. \tag{3}$$

Here, the reflection wavelength $\lambda_0$ at the time when flexible member 150 is not bent is a wavelength between the two signal light wavelengths $\lambda_1$ and $\lambda_2$ adjacent each other. Therefore, when the bending state of the flexible member 150 transits between the state where the flexible member 150 is bent so as to become convex toward the solenoid 130 side and the state where the flexible member 150 is bent so as to become convex toward the solenoid 120 side, the reflection wavelength of the optical waveguide type diffraction grating device 160 never coincides with other signal light wavelengths.

A specific configuration of such an optical device 100 will be described as follows: The reference wavelength $\lambda$ is 1550 nm, whereas the reflection wavelength shift amount $\Delta\lambda$ is 1.6 nm. The length of the Bragg grating forming area is 50 mm. The flexible member 150 is made of fiber-reinforced plastics, exhibits a Young's modulus of $6\times10^9$ Pa, and has dimensions of L=50 mm, h=2 mm, and b=5 mm (see FIG. 2). The optical waveguide type diffraction grating device 16 is secured to the inside of the flexible member 150, so that the distance y from the center of the flexible member 150 to the solenoid 120 side is 0.5 mm.

In the optical device 100 of the aforementioned configuration, the strain $\epsilon$ required for the optical waveguide type diffraction grating device 160 in the longitudinal direction thereof is provided by the following expression (4):

$$\epsilon = \Delta\lambda/(0.78\lambda) = 6.62\times10^{-4} \tag{4}$$

Assuming that $\delta$ is the displacement (i.e., the stroke of solenoid 120, 130) required for the flexible member 150 at the position of the free end held between the cap part 123 of the solenoid 120 and the cap part 133 of the solenoid 130, and R is the radius of curvature of the flexible member 150 upon bending, the following relational expressions (5a), (5b) hold:

$$\epsilon = y/R \tag{5a}$$

$$\delta = R(1-\cos(L/R)) \tag{5b}$$

Thus, the displacement $\delta$ required for the flexible member 150 at the position of the free end is 1.654 mm. The load required therefor is 774 mN (79 gf). These values of stroke and load are provided by the solenoids 120, 130.

The optical device 100 including the optical waveguide type diffraction grating device 160 having a tilted Bragg grating or long-period grating will now be explained. The optical waveguide type diffraction grating device 160 formed with the tilted Bragg grating Bragg-reflects the light of a specific wavelength propagating through an optical fiber and emits thus reflected light laterally from the optical fiber, thereby causing a loss in the light of the specific wavelength. In this case, the wavelength yielding a loss peak depends not only on the effective refractive index and grating period in the grating forming area but also on the angle of inclination of the grating. On the other hand, the optical waveguide type diffraction grating device 160 formed with a long-period grating converts the core-mode light of a specific wavelength propagating through an optical fiber into cladding-mode light, thereby causing a loss in the light of the specific wavelength. In this case, the wavelength yielding a loss peak is a wavelength satisfying a phase-matching condition between the core-mode light and cladding-mode light, and depends on the respective effective refractive indices and grating periods for the core-mode light and cladding-mode light in the grating forming area. Thus, the optical waveguide type diffraction grating device 160 formed with a tilted Bragg grating or long-period grating acts as a loss filter for causing a loss in the light of the specific wavelength.

In the optical device 100, when the solenoid 120 is in the attracted state while the solenoid 130 is in the detached state, the flexible member 150 is bent to be convex toward the solenoid 130 side, and a compressive stress is applied to the optical waveguide type diffraction grating device 160, so that the grating period is $\Lambda_1$. On the other hand, when the solenoid 120 is in the detached state while the solenoid 130 is in the attracted state, the flexible member 150 is bent to be convex toward the solenoid 120, and a tensile stress is applied to the optical waveguide type diffraction grating device 160, so that the grating period is $\Lambda_2$. Between these parameters, a relation expressed by the following expression (6) holds:

$$\Lambda_1 < \Lambda_2 \tag{6}$$

Thus, when the optical waveguide type diffraction grating device 160 is provided with a stress as such, the grating period changes, whereby the loss spectrum changes.

In this case, although the solenoids 120, 130 may provide the flexible member 150 with a flexure so as to adjust the grating period of the optical waveguide type diffraction grating device 160, it is preferable that a mechanism which can adjust the amount of flexure of the flexible member 150 is installed in addition to (or in place of) the solenoids 120, 130 to regulate the amount of flexure continuously, thereby compensating for the characteristic change of the optical waveguide type diffraction grating device 160 continuously.

Figure 3:
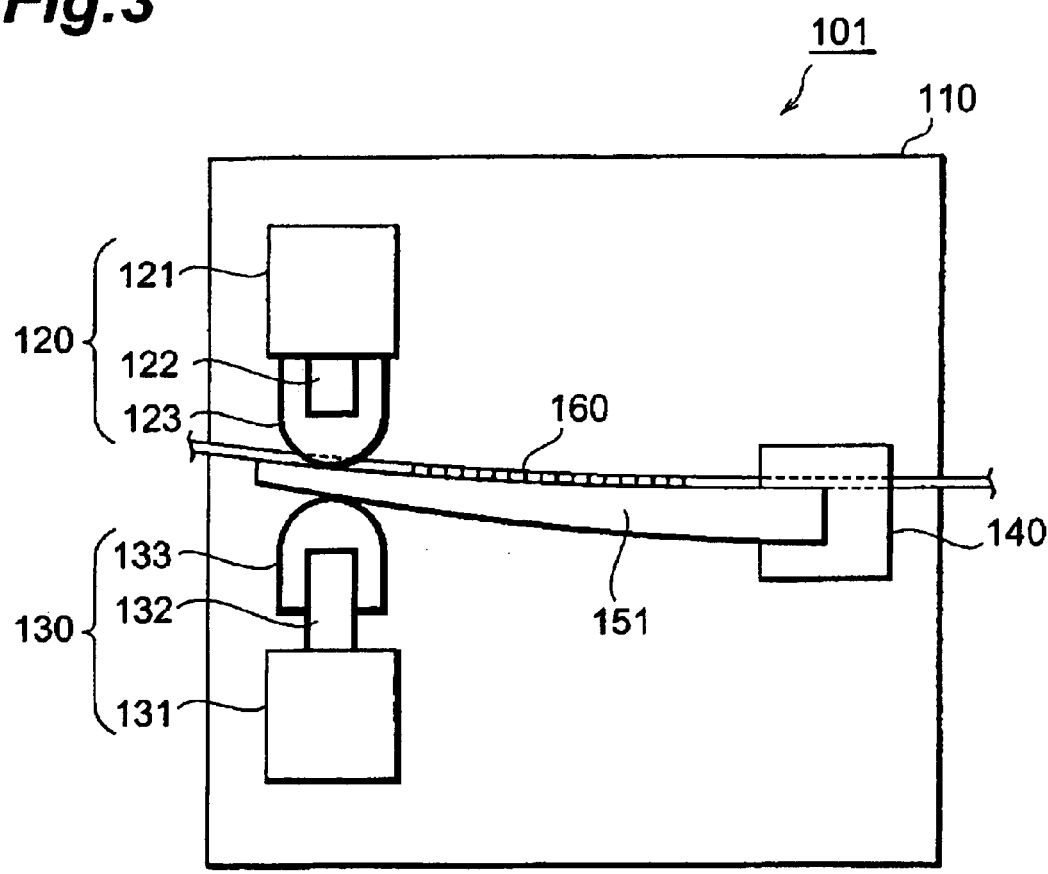
FIG. 3 is a plan view showing a configuration of a second embodiment in the optical device in accordance with the present invention.
Figure 4:
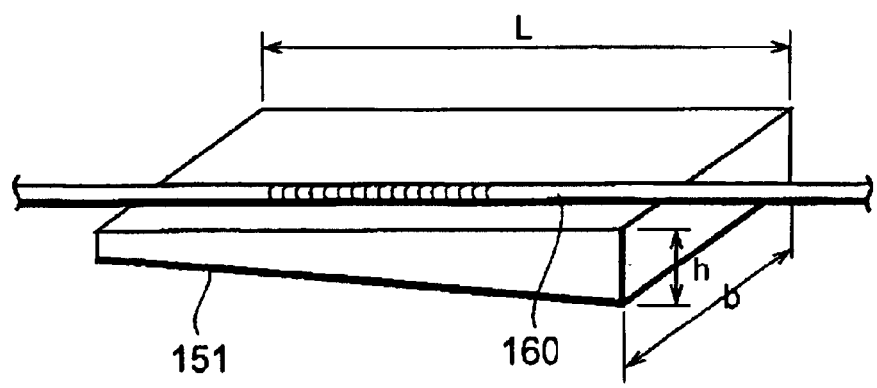
FIG. 4 is a perspective view showing a flexible member and an optical waveguide type diffraction grating device included in the optical device in accordance with the second embodiment.

A second embodiment in the optical device in accordance with the present invention will now be explained. FIG. 3 is a plan view showing a configuration of the second embodiment in the optical device in accordance with the present invention. In addition, FIG. 4 is a perspective view of a flexible member 151 and an optical waveguide type diffraction grating device 160 included in this optical device 101 in accordance with the second embodiment. As compared to the optical device 100 in accordance with the first embodiment as shown in FIGS. 1 and 2, the optical device 101 in accordance with the second embodiment differs from the optical device 100 in that the thickness of the flexible member 151 provided in place of the flexible member 150 has a shape changing along the longitudinal direction. One end side of the flexible member 151 having a greater thickness is secured by a securing member 140, whereas the other end side of the flexible member 151 having a smaller thickness is displaced in the thickness direction by solenoids 120 and 130, whereby the flexible member 151 is bent.

Figure 5:
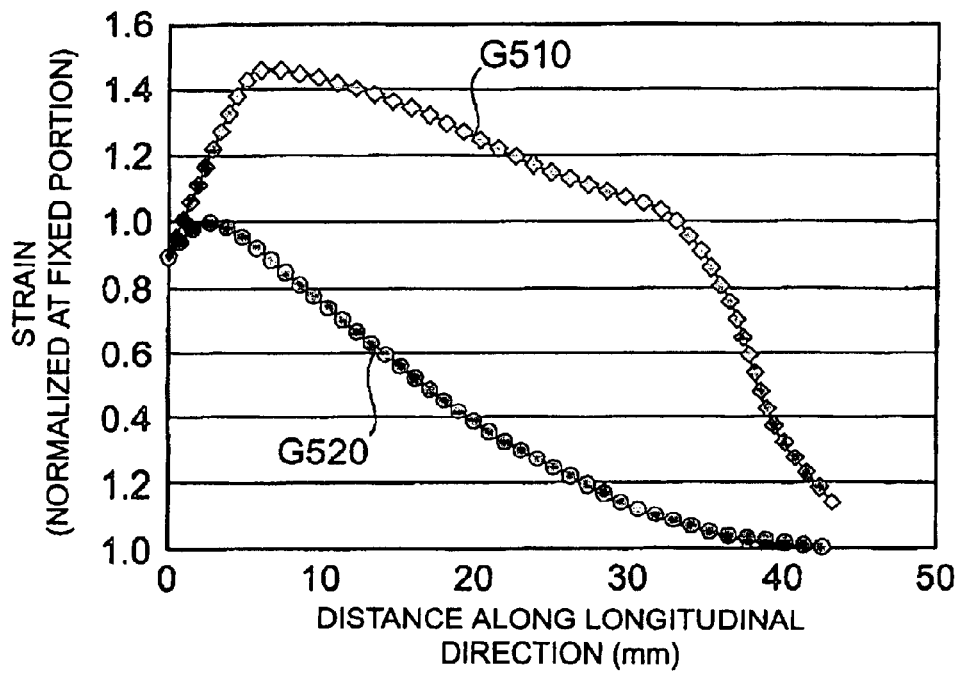
FIG. 5 is a distribution of strain of the optical waveguide diffraction grating device in the optical device In accordance with the second embodiment.

FIG. 5 shows the strain distribution of the optical waveguide type diffraction grating device 160 in a sample of the optical device 101 in accordance with the second embodiment. In this sample, the flexible member 151 was made of SUS (Stainless Steal), and was a thickness h linearly changing from 2 mm to 5 mm over an area having a length of 50 mm in the longitudinal direction of bending. A flexible member of a comparative example was made of SUS, and a constant thickness of h=2 mm over an area having a length of 50 mm in the longitudinal direction of bending. In the graph of FIG. 5, the abscissa indicates the distance along the longitudinal direction of the flexible member from the position as a reference secured by the securing member 140. On the other hand, in the graph of FIG. 5, the ordinate indicates the strain normalized with the amount of strain of the optical waveguide type diffraction grating device 160 at the position secured by the securing member 140. Additionally, in FIG. 5, graphs G510 and G520 each designate a relationship between the position in the longitudinal direction and the strain in the flexible member, where G510 corresponds to the flexible member whose thickness changes in the longitudinal direction, and G520 corresponds to the flexible member whose thickness is constant.

As is apparent from these graphs, when the flexible member having a constant thickness in the longitudinal direction is applied, the strain of the optical waveguide type diffraction grating device 160 is greater at a position closer to the securing member 140, but gradually reduces as the distance from the securing member 140 is longer. On the other hand, when the flexible member 151 whose thickness changes in the longitudinal direction is applied, the change in strain of the optical waveguide type diffraction grating device 160 is small in a certain range concerning the distance from the securing member 140. For example, seeing the range where the distance from the securing member 140 is 5 mm to 30 mm, the normalized strain in the optical waveguide type diffraction grating device 160 changes from 1.0 to 0.2 when the flexible member having a fixed thickness in the longitudinal direction is applied, whereas the normalized strain in the optical waveguide type diffraction grating device 160 changes only from 1.5 to 1.1 when the flexible member 151 whose thickness changes in the longitudinal direction is applied. Thus, the change in strain of the optical waveguide type diffraction grating device 160 is smaller in the latter.

Figure 6:
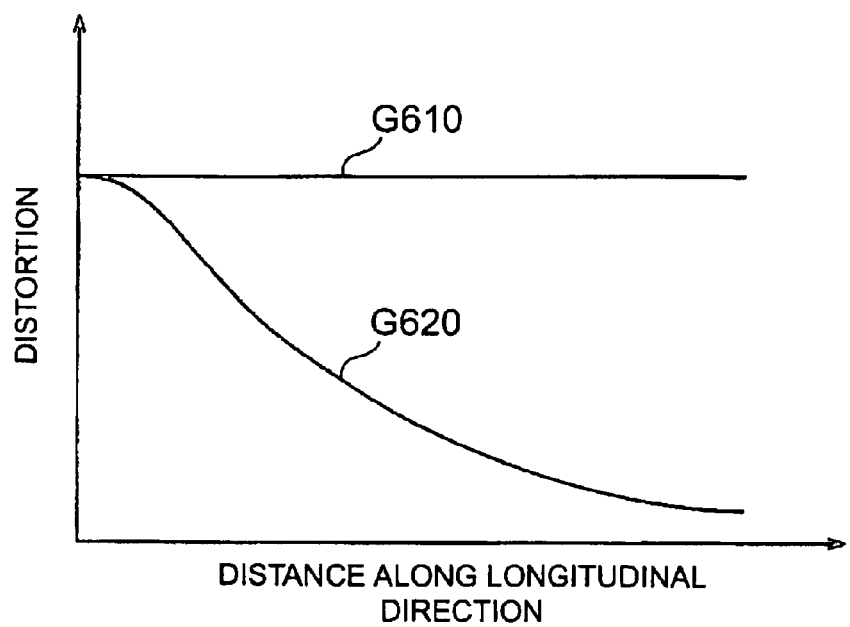
FIG. 6 is a preferable distribution of strain of the optical waveguide diffraction grating device grating device in the optical device in accordance with the second embodiment.

Thus, in the case where the thickness of the flexible member 151 linearly changes in the longitudinal direction, the stress or strain applied to the optical waveguide type diffraction grating device 160 by bending of the flexible member 151 is a little variation along the longitudinal direction. Also, if the thickness distribution of the flexible member 151 along the longitudinal direction is designed further appropriately, the stress or strain applied to the optical waveguide type diffraction grating device 160 by bending of the flexible member 151 can perform a further reduced variation along the longitudinal direction as shown in FIG. 6.

Figure 7:
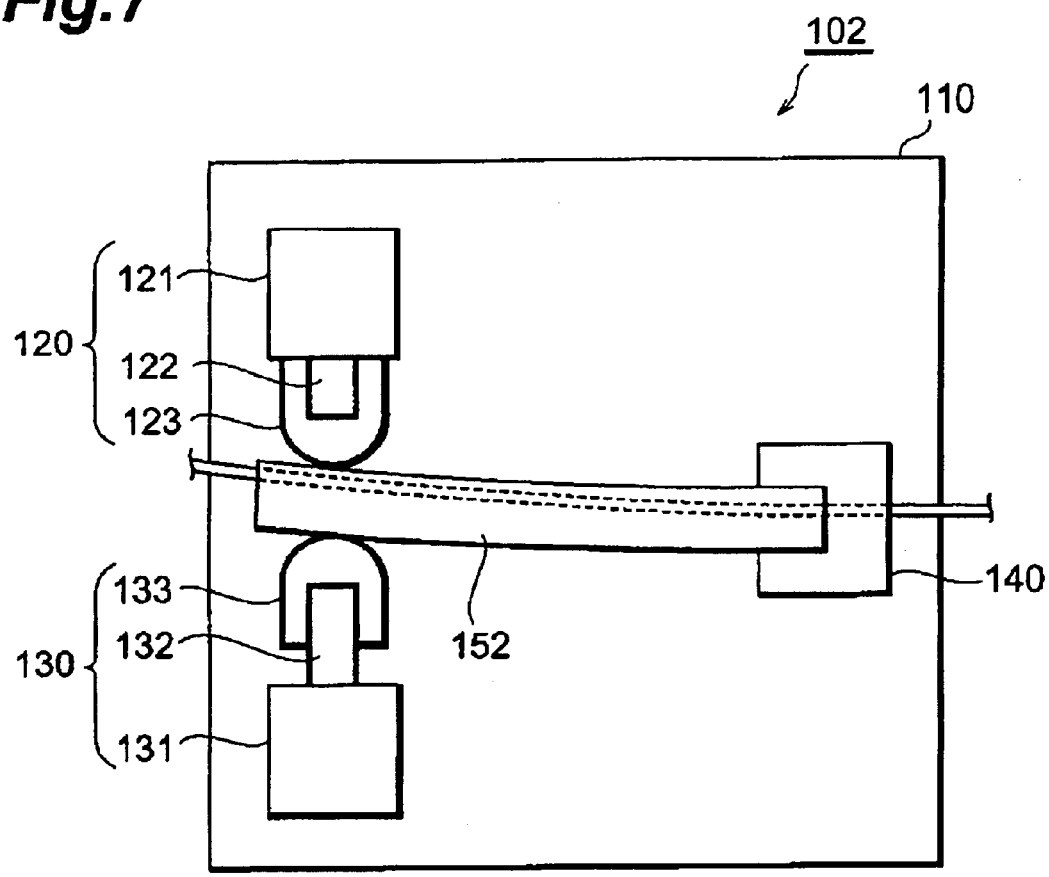
FIG. 7 is a plan view showing a configuration of a third embodiment in the optical device in accordance with the present invention.
Figure 8:
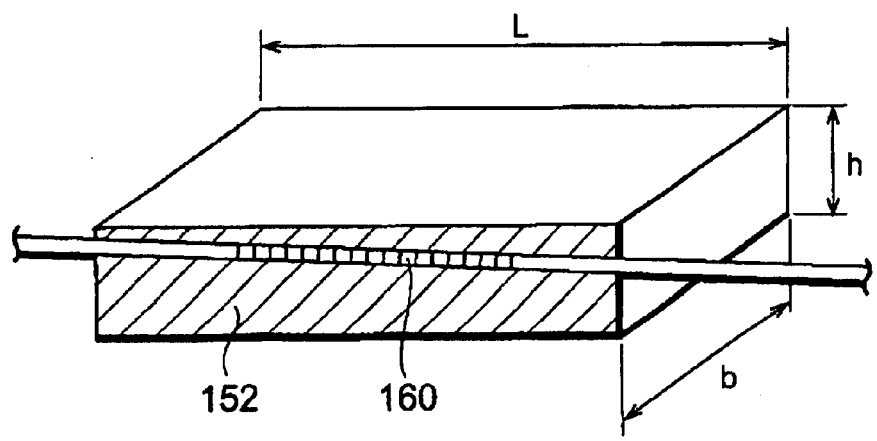
FIG. 8 is a partially-broken view showing a flexible member and an optical waveguide type diffraction grating included in the optical device in accordance with the third embodiment.

FIG. 7 is a plan view showing a configuration of a third embodiment in the optical device in accordance with this invention. FIG. 8 is a sectional view of a flexible member 152 and an optical waveguide type diffraction grating device 160 included in an optical device 102 in accordance with the third embodiment. As compared to the optical device 100 shown in FIGS. 1 and 2, the optical device 102 shown in these drawings differs from the optical device 100 in that the optical waveguide type diffraction grating device 160 is secured to the inside of the flexible member 152, and that the distance from the surface of the flexible member 152 to the optical waveguide type diffraction grating device 160 varies along the longitudinal direction of the flexible member 152. One end side of the flexible member 152 where the above-mentioned distance is longer is secured by the securing member 140, whereas the other end side of the flexible member 152 where the above-mentioned distance is shorter is displaced in the thickness direction by the solenoids 120 and 130, whereby the flexible member 152 can be bent. As depicted, it is preferable that the optical waveguide type diffraction grating device 160 is embedded and fixed within the flexible member 152. Incidentally, the flexible member 152 may be composed of two members each shaped like a wedge. In this case, when these members are formed such that one of them has a greater thickness on the securing member 140 side, and the other has a smaller thickness on the securing member 140 side, the optical waveguide type diffraction grating device 160 may be secured at the bonded portion between these two members.

Figure 9:
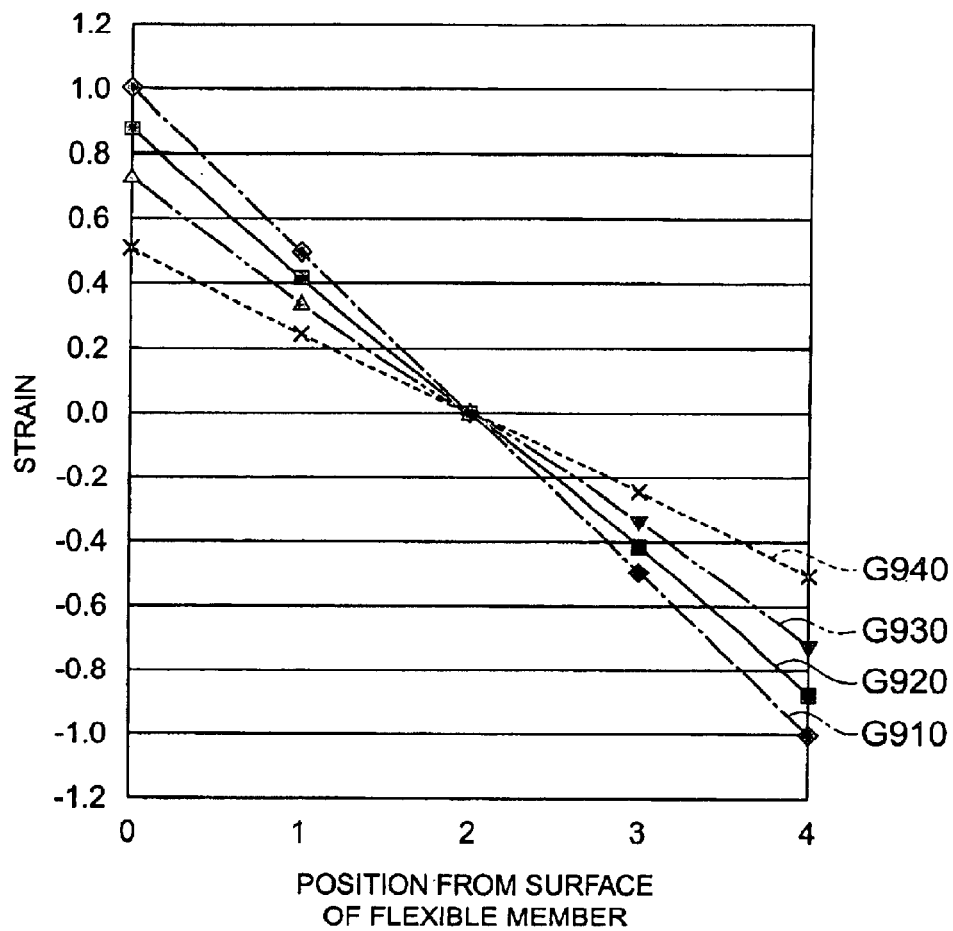
FIG. 9 is a graph showing a relationship between the distance from the surface of a flexible member to an optical waveguide type diffraction grating device and the strain of the optical waveguide type diffraction grating device.

FIG. 9 is a graph showing the relationship between the distance from the surface of the flexible member 152 to the optical waveguide type diffraction grating device 160 and the strain of the optical waveguide type diffraction grating device 160. Here, the flexible member 152 was made of SUS, the length in the bending longitudinal direction was 50 mm, the thickness was 4 mm, and the distance from the surface of the flexible member 152 to the optical waveguide type diffraction grating device 160 was each of 0 mm (surface), 1 mm, 2 mm (center), 3 mm, and 4 mm (rear face). In FIG. 9, the abscissa indicates the distance from the surface of the flexible member 152 to the optical waveguide type diffraction grating device 160, and the ordinate indicates the amount normalized with the amount of strain of the optical waveguide type diffraction grating device 160 at a position apart by 6 mm from the position secured by the securing member 140. Incidentally, in FIG. 9, graph G910 shows the strain of the optical waveguide type diffraction grating device 160 at a position where the distance from the securing position by the securing member 140 is 6 mm; graph G920 shows the strain of optical waveguide type diffraction grating device 160 at a position where the distance from the securing position by the securing member 140 is 12 mm; graph G930 shows the strain of optical waveguide type diffraction grating device 160 at a position where the distance from the securing position by the securing member 140 is 18 mm; and graph G940 shows the strain of optical waveguide type diffraction grating device 160 at a position where the distance from the securing position by the securing member 140 is 24 mm.

As is apparent from FIG. 9, the strain of the optical waveguide type diffraction grating device 160 depends on the distance from the surface of the flexible member 152 more greatly as the distance from the securing position by the securing member 140 is longer. Therefore, when the flexible member 152 is constructed so that the distance between the optical waveguide type diffraction grating device 160 and the surface of the flexible member 152 is shorter as the distance from the securing position by the securing member 140 is longer, the stress or strain applied to the optical waveguide type diffraction grating device 160 can perform a less variation along the longitudinal direction upon bending of the flexible member 152.

Figure 10:
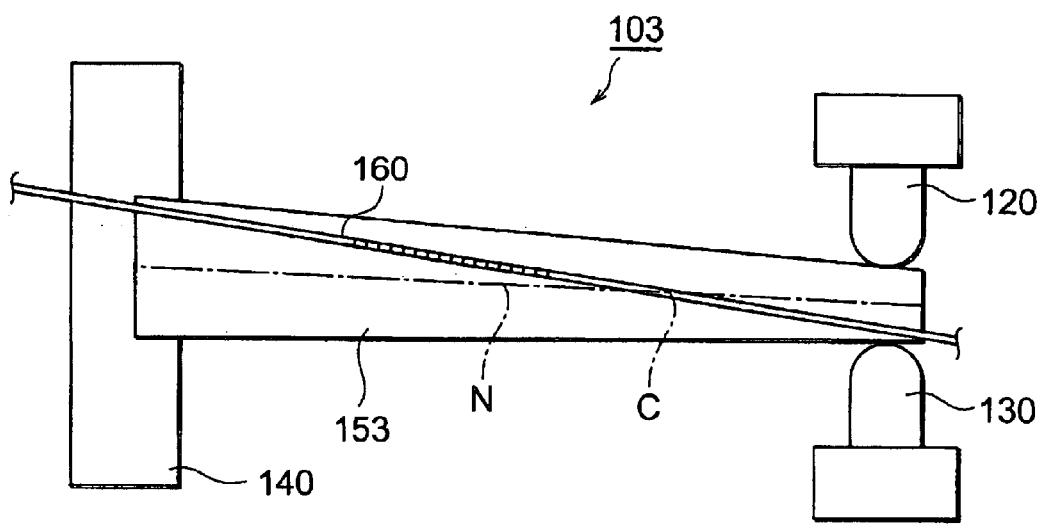
FIG. 10 is a plan view showing a configuration of a fourth embodiment in the optical device in accordance with the present invention.

Next, FIG. 10 is a plan view showing a configuration of a fourth embodiment in the optical device in accordance with this invention. An optical device 103 in accordance with the fourth embodiment includes a flexible member 153, an optical waveguide type diffraction grating device 160, a securing member 140, and bending means 120, 130.

The flexible member 153 has a flexibility, one end side thereof being secured by the securing member 140, whereas the other end side being in contact with each leading end of the bending means 120, 130. The flexible member 153 is constituted by fiber-reinforced plastics, resins, metals, and the like, for example. The respective leading ends of the bending means 120, 130 hold the other end side of the flexible member 153 therebetween, and can bend the flexible member 153 at this position by applying a stress to the flexible member 153. For instance, when the fixing means 120 positioned above the flexible member 153 presses the other end side of the flexible member 153, this flexible member 153 is bent in a upwardly convex shape. On the other hand, when the fixing means 130 positioned below the flexible member 153 presses the other end side of the flexible member 153, this flexible member 153 is bent in a downwardly convex shape. For example, it is preferable that the bending means 120, 130 each are constituted by solenoid coils, translating motors, screws, and the like, as described above.

The optical waveguide type diffraction grating device 160 has an optical fiber that is an optical waveguide and a Bragg grating formed on the optical fiber, whereby the light of a specific wavelength propagating through the optical fiber is Bragg-reflected through the Bragg grating, and thus reflected light propagates in the opposite direction. The optical waveguide type diffraction grating device 160 maybe one whose refractive index modulation grating spacings are uniform along the longitudinal direction, or may be a chirped Bragg grating whose refractive index modulation grating spacings vary along the longitudinal direction.

The optical waveguide type diffraction grating device 160 is secured to the flexible member 153 so as to obliquely intersect at a position C to a neutral plane N upon bending of the flexible member 153 under the action from the bending means 120, 130. Therefore, when the flexible member 153 is bent under the action of the bending means 120, 130, a tensile stress acts along the longitudinal direction on the optical waveguide type diffraction grating device 160 on one side of the position C, whereas a compressive stress acts thereon along the longitudinal direction on the other side of the position C.

Also, though both of the cross-sectional area and rigidity of the flexible member 153 may be uniform along the longitudinal direction, at least one of the cross-sectional area and rigidity may vary along the longitudinal direction. With this structure, a favorable distribution is effected for the distribution of tensile stress or compressive stress in the optical waveguide type diffraction grating device 160 upon bending of the flexible member 153.

Figure 11:
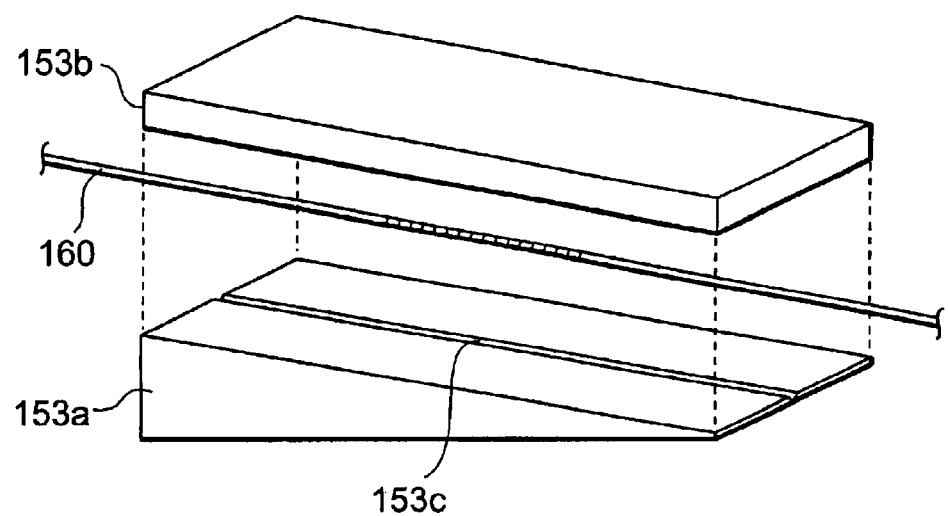
FIG. 11 is a view for explaining a securing method of an optical waveguide type diffraction grating device to a flexible member in the optical device in accordance with the fourth embodiment.
Figure 12:
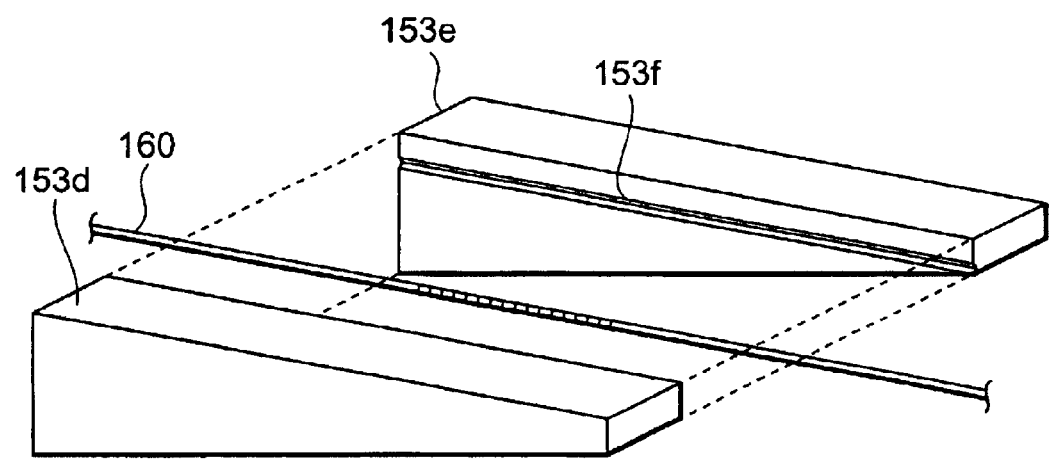
FIG. 12 is a view for explaining another securing method of an optical waveguide type diffraction grating device to a flexible member in the optical device in accordance with the fourth embodiment.

FIGS. 11 and 12 are explanatory views of a securing method of the optical waveguide type diffraction grating device 160 to the flexible member 153 in the optical device 103 in accordance with the fourth embodiment. When the flexible member 153 is made of a resin, it is preferred that the optical waveguide type diffraction grating device 160 is secured by molding with the resin inside the flexible member 153; however, the optical waveguide type diffraction grating device 160 may be secured to the flexible member 153 as shown in FIG. 11 or 12.

In the securing method shown in FIG. 11, the flexible member 153 is composed of a first member 153a and a second member 153b, and an elongated groove portion 153c is formed in the first member 153a. The optical waveguide type diffraction grating device 160 is arranged along the elongated groove portion 153c, and is secured to the flexible member 110 in such a manner that the first member 153a and the second member 153b are bonded together. In this case, the bonding face between the first member 153a and second member 153b includes a line to be provided with the optical waveguide type diffraction grating device 160 in the flexible member 153, and intersects the neutral plane N of the flexible member 153. In such a way, the optical waveguide type diffraction grating device 120 arranged in the elongated groove portion 153c on the bonding face is disposed so as to obliquely intersect the neutral plane N.

In the securing method shown in FIG. 12, the flexible member 153 is composed of a first member 153e and a second member 153d. The optical waveguide type diffraction grating device 160 is arranged along an elongated groove portion 153f formed in the first member 153e, and is secured with respect to the flexible member 153 in such a manner that the first member 153e and the second member 153d are bonded together. In this case, the bonding face between the first member 153e and second member 153d includes a line to be provided with the optical waveguide type diffraction grating device 160 in the flexible member 153, and is orthogonal to the neutral plane N of the flexible member 153. In such a way, the optical waveguide type diffraction grating device 160 arranged in the elongated groove portion 153f located on the bonding face is disposed so as to obliquely intersect the neutral plane N.

Figure 13:
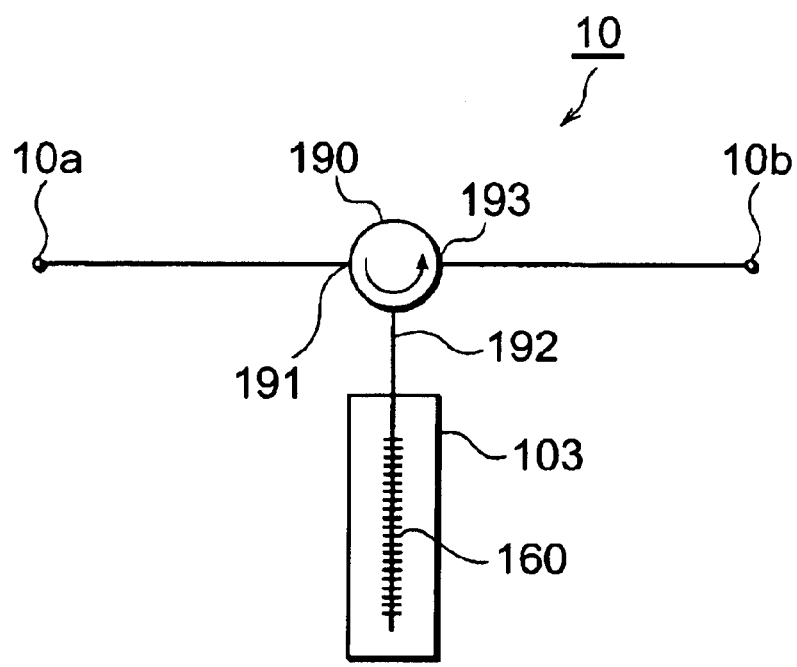
FIG. 13 is a view showing a configuration of a first embodiment (dispersion-adjusting module) of an optical module in accordance with the present invention.

An optical module in accordance with this invention, particularly a dispersion-adjusting module will now be explained. FIG. 13 is a view showing a configuration of a dispersion-adjusting module 10 as a first embodiment in the optical module in accordance with this invention. The dispersion-adjusting module 10 includes the above-mentioned optical device 103 in accordance with the fourth embodiment, and an optical circulator 190, for example. The optical circulator 190 has a first terminal 191, a second terminal 192, and a third terminal 193; light inputted from the first terminal 191 is outputted from the second terminal 192, whereas the light inputted from the second terminal 192 is outputted from the third terminal 193. The optical waveguide type diffraction grating device 160 included in the optical device 103 is connected to the second terminal 192 of the optical circulator 190.

The light from an input end 10a of the dispersion-adjusting module 10 is inputted from the first terminal 191 of the optical circulator 190, and then is outputted from the second terminal 192 to be inputted into the optical waveguide type diffraction grating device 160 of the optical device 103. In the light reached to the optical waveguide type diffraction grating device 160, the light of a specific wavelength which satisfies a Bragg condition is reflected by the optical waveguide type diffraction grating device 160, and is returned to the second terminal 192 of the optical circulator 190, and then is outputted from the output terminal 10b of the dispersion-adjusting module 10 by way of the third terminal 193.

When the optical waveguide type diffraction grating device 160 is a chirped Bragg grating, the light transmitted through the dispersion-adjusting module 10 from its input end 10a to output end 10b is one in a wavelength region which satisfies a Bragg condition at each position in the longitudinal direction of the chirped Bragg grating, and has a group delay characteristic corresponding to the dispersion characteristic of the chirped Bragg grating upon reflection of the light.

Figure 14A:
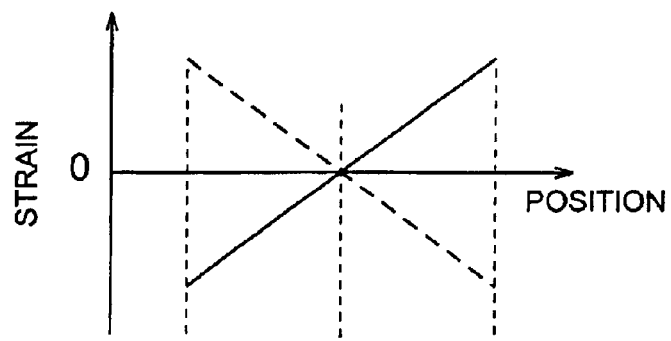
FIGS. 14A–14D are graphs for explaining an operative example of the optical module and the optical module including the same (first embodiment) in accordance with the fourth embodiment.
Figure 14B:
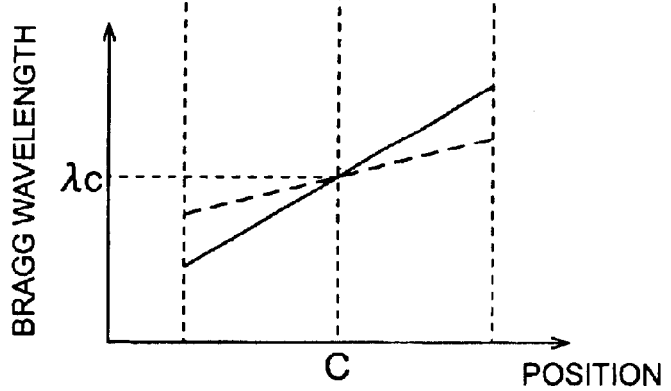
Figure 14C:
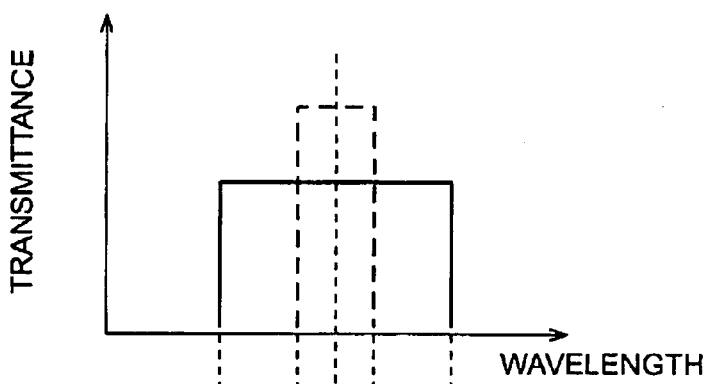
Figure 14D:
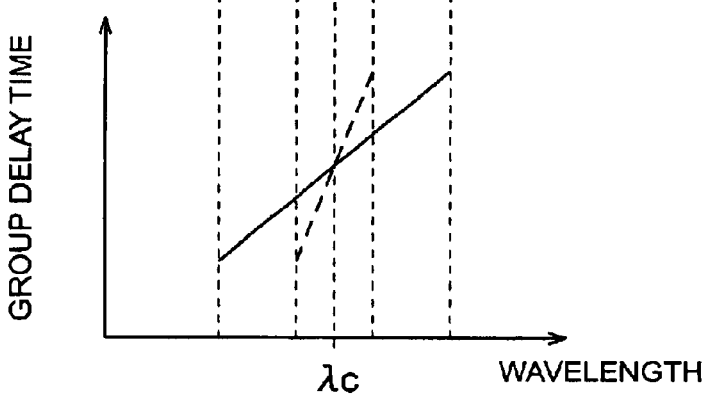

FIGS. 14A–14D are graphs for explaining an operative example of the optical device 103 and dispersion-adjusting module 10 in accordance with, the fourth embodiment when the position C intersecting the neutral plane N is located at the center of the region which is formed with refractive index modulation in the optical waveguide type diffraction grating device 160. More specifically, FIG. 14A shows the longitudinal distribution of strain in the optical waveguide type diffraction grating device 160. FIG. 14B shows the longitudinal distribution of Bragg wavelength in the optical waveguide type diffraction grating device 160. FIG. 14C shows the wavelength dependence of transmittance of light from the input end 10a to output end 10b of the dispersion-adjusting module 10. FIG. 14D shows the wavelength dependence of group delay time when light is transmitted through the dispersion-adjusting module 10 from the input end 10a to the output end lob.

As shown in FIG. 14A, when the flexible member 153 is bent under the action of the bending means 120, 130, a tensile stress acts and yields an expanding strain along the longitudinal direction on one side of the position C in the optical waveguide type diffraction grating device 160 disposed so as to obliquely intersect at the position C to the neutral plane N upon bending, whereas a compressive stress acts and yields a compressive strain along the longitudinal direction on the other side of the position C. As a result, in the optical waveguide type diffraction grating device 160, as shown in FIG. 14B, the Bragg wavelength becomes longer at each position on one side of the position C according to the degree of expanding strain, and shorter at each position on the other side of the position C according to the degree of the compressive strain. The respective longitudinal distributions (polarity and absolute value of inclination) of the strain and Bragg wavelength in the optical waveguide type diffraction grating device 160 correspond to the direction and degree of flexure of the flexible member 153. Incidentally, there are substantially no strains at the position C, whereby the Bragg wavelength $\lambda_C$ at this position C hardly changes.

And, as shown in FIG. 14C, the transmission band and transmittance of the light transmitted through the dispersion-adjusting module 10 from the input end 10a to the output end 10b vary depending on the direction and degree of flexure of the flexible member 153. Namely, as the range of Bragg wavelength along the longitudinal direction of the optical waveguide type diffraction grating device 160 is expanded (as indicated by the solid line in FIG. 14B), the transmission band of light transmitted through the dispersion-adjusting module 10 from the input end 10a to output end 10b is wider, whereby the transmittance in this band is decreased (as indicated by the solid line in FIG. 14C). By contrast, when the range of Bragg wavelength along the longitudinal direction of the optical waveguide type diffraction grating device 160 is narrowed (as indicated by the broken line in FIG. 14D), the transmission band of the light transmitted through the dispersion-adjusting module 10 from the input end 10a to the output end 10b is narrowed, thereby increasing the transmittance in this band (as indicated by the broken line in FIG. 14C). Here, since the position C is located on the center of the region formed with refractive index modulation in the optical waveguide type diffraction grating device 160, the transmission band of the dispersion-adjusting module 10 is centered at the Bragg wavelength $\lambda_C$ at the position C.

Also, as shown in FIG. 14D, the group delay time when the light transmitted through the dispersion-adjusting module 10 from the input end 10a to the output end 10b varies depending on the direction and degree of flexure of the flexible member 153. Namely, even when the transmission band changes, the maximum and minimum values of group delay time in this band hardly change, whereby the wavelength dependence of group delay time will be gentler if the transmission band is wider (as indicated by the solid line in FIG. 14D), but steeper if the transmission band is reversely narrower (as indicated by the broken line in FIG. 14D). There are substantially no strains at the position C, so that the Bragg wavelength $\lambda_C$ at this position C hardly changes, whereby the group delay time with respect to the light at the Bragg wavelength $\lambda_C$ hardly changes.

FIGS. 15A–15D are graphs for explaining an operative example of the optical device 103 and dispersion-adjusting module 10 in accordance with the fourth embodiment when the position C intersecting the neutral plane N is located on the fixed end side from the center of the region formed with refractive index modulation in the optical waveguide type diffraction grating device 160. Particularly, FIG. 15A shows the longitudinal distribution of strain in the optical waveguide type diffraction grating device 160. FIG. 15B shows the longitudinal distribution of Bragg wavelength in the optical waveguide type diffraction grating device 160. FIG. 15C shows the wavelength dependence of transmittance of light from the input end 10a to output end 10b of the dispersion-adjusting module 10. FIG. 15D shows the wavelength dependence of group delay time when light is transmitted through the dispersion-adjusting module 10 from the input end 10a to the output end lob.

As shown in FIG. 15A, when the flexible member 153 is bent under the action of the bending means 120, 130, a tensile stress acts and yields an expanding strain along the longitudinal direction on one side of the position C in the optical waveguide type diffraction grating device 160 disposed so as to obliquely intersect at the position C to the neutral plane N upon bending, whereas a compressive stress acts and yields a compressive strain along the longitudinal direction on the other side of the position C. As a result, in the optical waveguide type diffraction grating device 160, as shown in FIG. 15B, the Bragg wavelength becomes longer at each position on one side of the position C according to the degree of expanding strain, and shorter at each position on the other side of the position C according to the degree of compressive strain. The respective longitudinal distributions (polarity and absolute value of inclination) of the strain and Bragg wavelength in the optical waveguide type diffraction grating device 160 correspond to the direction and degree of flexure of the flexible member 153. Incidentally, there are substantially no strains at the position C, whereby the Bragg wavelength $\lambda_C$ at this position C hardly changes. Incidentally, since the position C is located on the fixed end of the region formed with refractive index modulation in the optical waveguide type diffraction grating device 160, the amount of change of the strain (that is, the amount of change of Bragg wavelength) is smaller on the side of the fixed end of the position C, while the amount of change of the strain (that is, the amount of change of Bragg wavelength) is larger on the side of the free end of the position C.

And, as shown in FIG. 15C, the transmission band and transmittance of the light transmitted through the dispersion-adjusting module 10 from the input end 10a to the output end 10b vary depending on the direction and degree of flexure of the flexible member 153. Namely, as the range of Bragg wavelength along the longitudinal direction of the optical waveguide type diffraction grating device 160 is wider (as indicated by the solid line in FIG. 15B), the transmission band of the light transmitted through the dispersion-adjusting module 10 from the input end 10a to output end 10b becomes wider, whereby the transmittance in this band can be decreased (as indicated by the solid line in FIG. 15C). By contrast, when the range of Bragg wavelength along the longitudinal direction of the optical waveguide type diffraction grating device 160 is narrowed (as indicated by the broken line in FIG. 15B), the transmission band of the light transmitted through the dispersion-adjusting module 10 from the input end 10a to the output end 10b becomes narrower, whereby the transmittance in this band is greater (as indicated by the broken line in FIG. 15C) Here, since the position C is located on the fixed end side of the center of the region formed with refractive index modulation in the optical waveguide type diffraction grating device 160, the transmission band of the dispersion-adjusting module 10 includes the Bragg wavelength $\lambda_C$ at the position C but is not always centered at the Bragg wavelength $\lambda_C$, whereby the change in bandwidth is smaller on one side of the wavelength $\lambda_C$ but greater on the other side of the wavelength $\lambda_C$.

Also, as shown in FIG. 15D, the group delay time when light transmitted through the dispersion-adjusting module 10 from the input end 10a to the output end 10b varies depending on the direction and degree of flexure of the flexible member 153. Namely, even when the transmission band changes, the maximum and minimum values of group delay time in this band hardly change, whereby the wavelength dependence of group delay time will be gentler if the transmission band is wider (as indicated by the solid line in FIG. 15D), but steeper if the transmission band is reversely narrower (as indicated by the broken line in FIG. 15D). There are substantially no strains at the position C, so that the Bragg wavelength $\lambda_C$ at this position C hardly changes, whereby the group delay time with respect to light at the Bragg wavelength $\lambda_C$ hardly changes.

Figure 16:
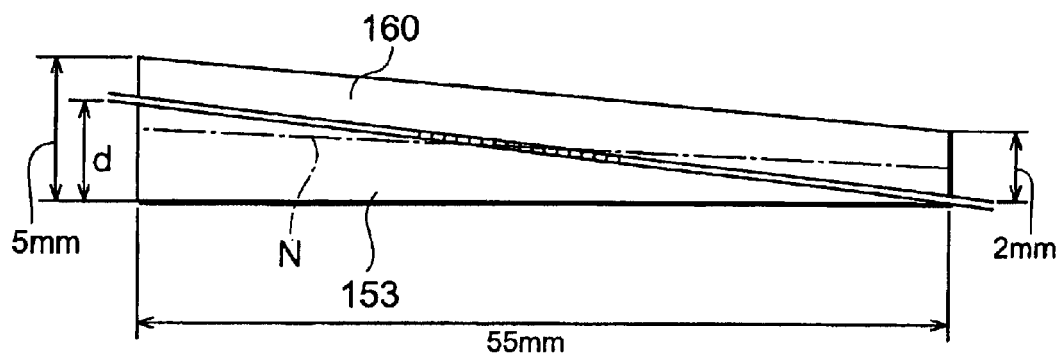
FIG. 16 is a view for explaining a positional relationship between the flexible member and the optical waveguide type diffraction grating device in the optical device in accordance with the fourth embodiment.

A plurality of specific samples of the optical device 103 in accordance with the aforementioned fourth embodiment will now be explained. FIG. 16 is a view for explaining the positional relationship between the flexible member 153 and optical waveguide type diffraction grating device 160 in the optical device 103 in accordance with the fourth embodiment. Here, in these samples, the length of the flexible member 153 between its fixed end (position secured by the securing member 140) and free end (position to which a stress was applied by the bending means 120, 130) was 55 mm. The thickness of the flexible member 153 was 5 mm at the fixed end, and 2 mm at the free end. The refractive index modulation grating spacings in the optical waveguide type diffraction grating device 160 were assumed to be uniform along the longitudinal direction.

In the first sample, the fixed end of the optical waveguide type diffraction grating device 160 was positioned where the distance d from the lower face of the flexible member 153 was 5 mm, whereas its free end was positioned at the lower face of the flexible member 153. In the second sample, the fixed end of the optical waveguide type diffraction grating device 160 was positioned where the distance d from the lower face of the flexible member 153 was 4 mm, whereas its free end was positioned at the lower face of the flexible member 153. In the third sample, the fixed end of the optical waveguide type diffraction grating device 160 was positioned where the distance d from the lower face of the flexible member 153 was 3 mm, whereas its free end was positioned at the lower face of the flexible member 153. In a comparative example, the optical waveguide type diffraction grating device 160 was attached to the upper face of the flexible member 153.

Figure 17:
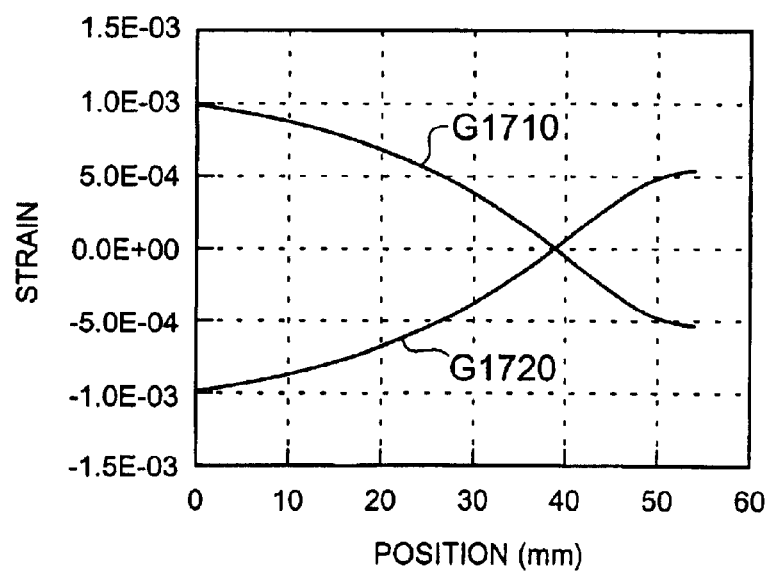
FIG. 17 is a graph showing a longitudinal distribution of strain in an optical waveguide type diffraction grating device in a first sample of the optical device in accordance with the fourth embodiment.
Figure 18:
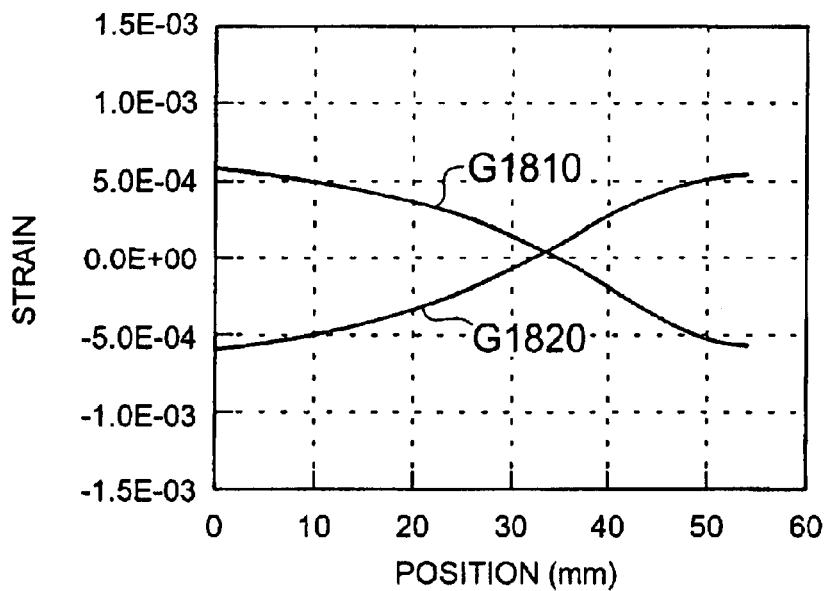
FIG. 18 is a graph showing a longitudinal distribution of strain in an optical waveguide type diffraction grating device in a second sample of the optical device in accordance with the fourth embodiment.
Figure 19:
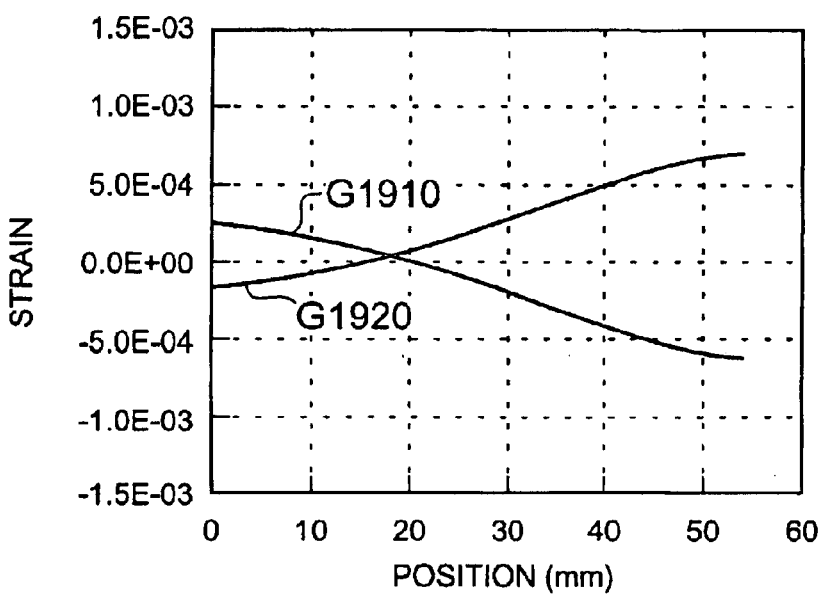
FIG. 19 is a graph showing a longitudinal distribution of strain in an optical waveguide type diffraction grating device in a third sample of the optical device in accordance with the fourth embodiment.
Figure 20:
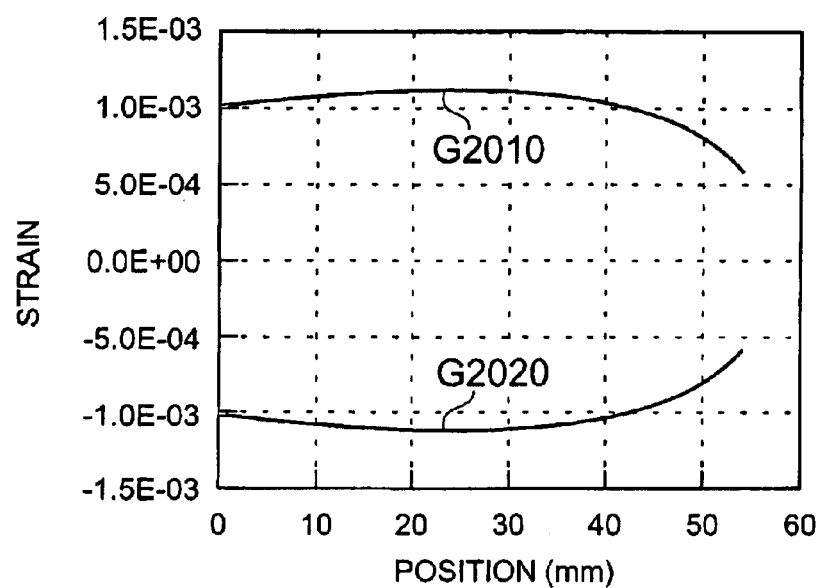
FIG. 20 is a graph showing a longitudinal distribution of strain in an optical waveguide type diffraction grating device in an optical device in accordance with a comparative example.

FIG. 17 is a graph showing a longitudinal distribution of strain in the optical waveguide type diffraction grating device 160 in the first sample. FIG. 18 is a graph showing a longitudinal distribution of strain in the optical waveguide type diffraction grating device 160 in the second sample. FIG. 19 is a graph showing a longitudinal distribution of strain in the optical waveguide type diffraction grating device 160 in the third sample. FIG. 20 is a graph showing a longitudinal distribution of strain in the optical waveguide type diffraction grating device in the comparative example. Here, in each of the first to third samples and the comparative example, the bending means 120, 130 applied displacements of +1 mm and −1 mm to the free end of the flexible member 153. Incidentally, In FIGS. 17–20, graphs G1710, G1810, G1910, and G2010 each show a strain distribution when the displacement of −1 mm is applied to the free end of the flexible member 153 by the bending means 120, 130. On the other hand, in FIGS. 17–20, graphs G1720, G1820, G1920, and G2020 each show a strain distribution when the displacement of +1 mm is applied to the free end of the flexible member 153 by the bending means 120, 130. In the comparative example, as shown in FIG. 20, the longitudinal distribution of strain in the optical waveguide type diffraction grating device was relatively flat without substantially changing its inclination in each of the cases where the free end of the flexible member was provided with the displacements of +1 mm and −1 mm, respectively. By contrast, in the first to third samples, as shown in FIGS. 17–19, the polarity of inclination of longitudinal direction of strain in the optical waveguide type diffraction grating device 160 differed between the respective cases where the free end of the flexible member 153 was provided with the displacements of +1 mm and −1 mm.

In particular, the longitudinal distribution of strain in the optical waveguide type diffraction grating device 160 was excellent in linearity in each of the second and third samples. If both or either of the cross-sectional area and rigidity of the flexible member 153 are changed along the longitudinal direction thereof, the distribution of tensile stress or compressive stress in the optical waveguide type diffraction grating device 160 upon bending of the flexible member 153 can be provided by an optimum distribution, whereby the longitudinal distribution of strain in the optical waveguide type diffraction grating device 160 can be provided by a desirable form.

Figure 21:
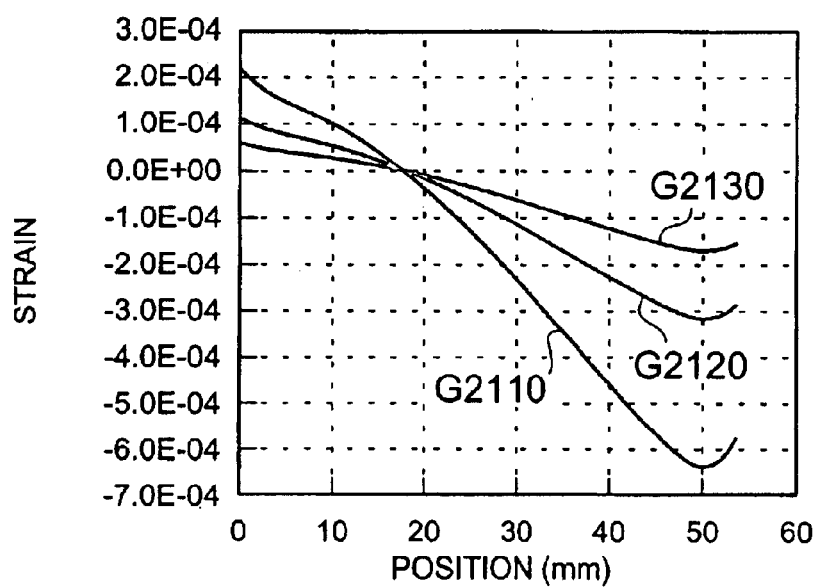
FIG. 21 is a graph showing a longitudinal distribution of strain in the optical waveguide type diffraction grating device in the third sample of the optical device in accordance with the fourth embodiment.

FIG. 21 shows a longitudinal distribution of strain in the optical waveguide type diffraction grating device 160 in the third sample. Here, the bending means 120, 130 applied displacements of −1.00 mm, −0.50 mm, and −0.25 mm to the free end of the flexible member 153. Additionally, in FIG. 21, graph G2110 shows a strain when the displacement of −1.00 mm is applied to the free end of the flexible member 153; graph G2120 shows a strain when the displacement of −0.5 mm is applied to the free end of the flexible member 153; and graph G2130 shows a strain when the displacement of −0.25 mm is applied to the free end of the flexible member 153.

As shown in this Figure, the inclination of the longitudinal distribution of strain in the optical waveguide type diffraction grating device 160 varied depending on the amount of displacement at the free end of the flexible member 153 (i.e., amount of flexure of the flexible member 153). Namely, as the absolute value of amount of displacement at the free end of the flexible member 153 was greater, the absolute value of inclination of the longitudinal distribution of strain in the optical waveguide type diffraction grating device 160 became greater. However, even when the inclination of the longitudinal distribution of strain changed in the optical waveguide type diffraction grating device 160, there were substantially no strain at the point C on the neutral plane N.

As in the foregoing, the optical device 103 and dispersion-adjusting module 10 in accordance with the fourth embodiment can adjust the inclination of a dispersion characteristic by simply bending the flexible member 153 such that the optical waveguide type diffraction grating device 160 intersects the neutral plane N, whereby the dispersion characteristic can be easily adjusted.

Figure 22:
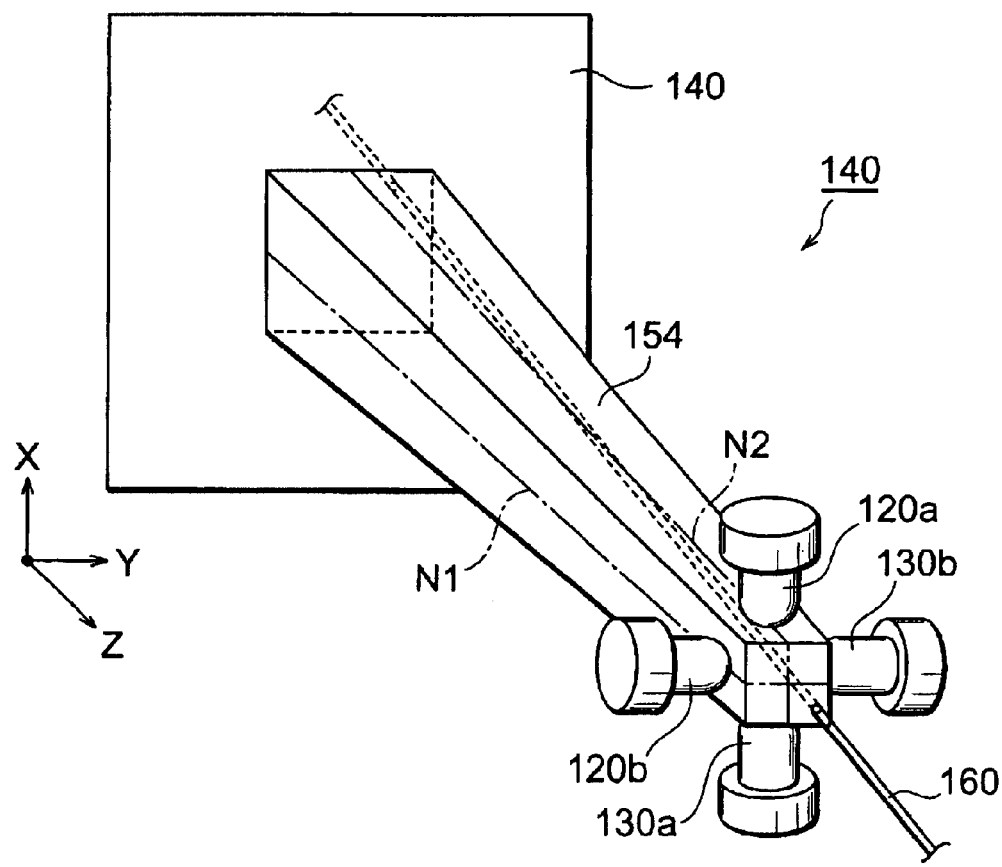
FIG. 22 is a perspective view showing a configuration of a firth embodiment in an optical module in accordance with the present invention.
Figure 23A:
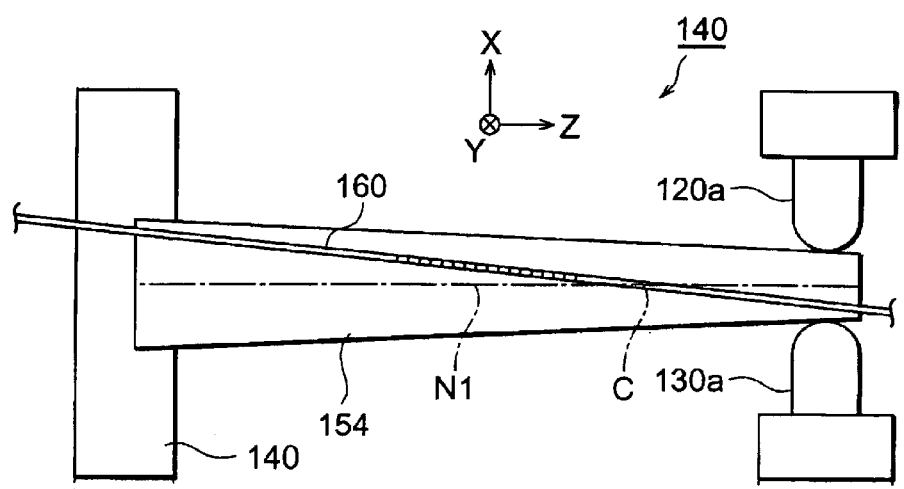
FIGS. 23A and 23B are plan views showing the configuration of the fifth embodiment in the optical device in accordance with the present invention.
Figure 23B:
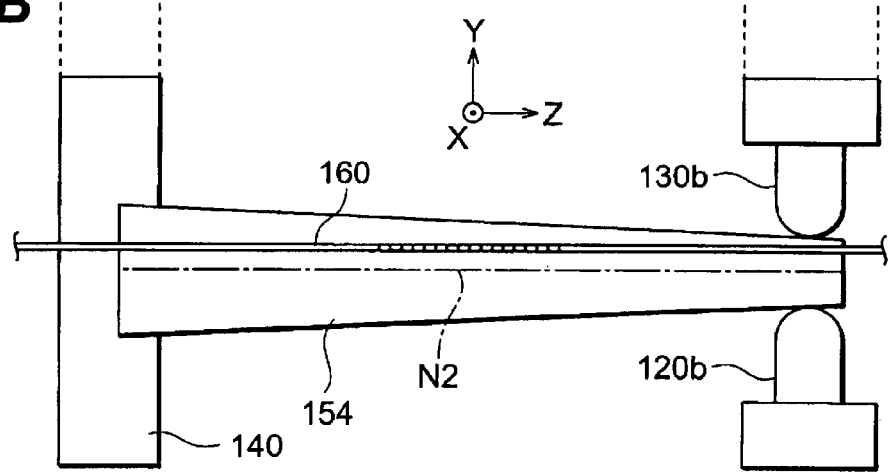

A fifth embodiment in the optical device in accordance with the present invention will now be explained. FIG. 22 is a perspective view showing a configuration of the optical device 104 in accordance with the fifth embodiment. FIGS. 23A and 23B each are a plan view showing the configuration of the optical device 104. The optical device 104 in accordance with the fifth embodiment includes a flexible member 154, an optical waveguide type diffraction grating device 160, a securing member 140, first bending means 120a, 130a, and second bending means 120b, 130b. Incidentally, an xyz orthogonal coordinate system is shown in FIGS. 22, 23A, and 23B in common for convenience of explanation. In FIG. 23A, the optical device 104 shown in FIG. 22 corresponds to a plan view seen parallel to the y axis, whereas in FIG. 23B, the optical device 104 shown in FIG. 22 corresponds to a plan view seen parallel to the x axis. The flexible member 154 extends in parallel to the z axis (z axis matches the longitudinal direction of the flexible member 154). The x axis is in parallel to the direction of stress applied to the free end of the flexible member 154 by the bending means 120a, 130a. The y axis is in parallel to the direction of stress applied to the free end of the flexible member 154 by the bending means 120b, 130b.

The flexible member 154 has a flexibility, one end side thereof being secured by the securing member 140. On the other hand, the other end side of the flexible member 154 is in contact with each leading end of the first bending means 120a, 130a, and the second bending means 120b, 130b. The flexible member 154 is constituted by fiber-reinforced plastics, resins, and the like, for example. The respective leading ends of the first bending means 120a, 130a is disposed in a state to hold the other end side of the flexible member 154 therebetween, and can bend the flexible member 154 at this position by applying a stress in parallel to the x axis to the flexible member 154. The respective leading ends of the second bending means 120b, 130b hold the other end side of the flexible member 154 therebetween, and can bend the flexible member 154 at this position by applying a stress in parallel to the y axis to the flexible member 154. As described above, it is preferable that each of the first and second bending means 120a, 120b, 130a, 130b is constituted by solenoid coils, translating motors, screws, and the like. Incidentally, the fifth embodiment has a configuration in which the first bending means 120a, 130a and the second bending means 120b, 130b apply a stress to the flexible member 154 along reference axes which are orthogonal to each other. In such a way, the configuration in which a stress is applied to the flexible member along the reference axes which are different from each other may be applied to any of the optical devices in accordance with the aforementioned first to fourth embodiments.

The optical waveguide type diffraction grating device 160 has an optical fiber that is an optical waveguide, and a Bragg grating formed in the optical fiber. By use of the Bragg grating, it Bragg-reflects light of a specific wavelength propagating through the optical fiber, and transmits thus reflected light in the opposite direction. The optical waveguide type diffraction grating device 160 may be one whose refractive index modulation grating spacings are uniform along the longitudinal direction, or a chirped Bragg grating whose refractive index modulation grating spacings vary along the longitudinal direction.

The optical waveguide type diffraction grating device 160 is secured to the flexible member 154, and is disposed so as to obliquely intersect at a position C a neutral plane N1 upon bending of the flexible member 154 when a stress is applied thereto in the x-axis direction by the first bending means 120a, 130a (see FIG. 23A). Therefore, when the flexible member 154 is bent under the action of the bending means 120a, 130a, a tensile stress acts along the longitudinal direction on the optical waveguide type diffraction grating device 160 on one side of the position C, whereas a compressive stress acts thereon along the longitudinal direction on the other side of the position C. Namely, under the action of the bending means 120a, 130a, the optical device 104 in accordance with the fifth embodiment operates in a manner similar to the optical device 103 in accordance with the aforementioned fourth embodiment (see FIGS. 14A–14D)

In addition, the optical waveguide type diffraction grating device 160 is disposed in parallel to a neutral plane N2 upon bending of the flexible member 154 when a stress is applied thereto in the y-axis direction by the second bending means 120b, 130b (see FIG. 23B). Therefore, when the flexible member 154 is bent under the action of the bending means 120b, 130b, a uniform stress acts on the optical waveguide type diffraction grating device 160 along the longitudinal direction thereof.

Though both of the cross-sectional area and rigidity of the flexible member 154 may be uniform along the longitudinal direction, it is preferable that at least one of the cross-sectional area and rigidity vary along the longitudinal direction. In such a way, the distribution of tensile stress or compressive stress in the optical waveguide type diffraction grating device 160 upon bending of the flexible member 154 can be made optimum.

The optical module (dispersion-adjusting module) including such an optical device in accordance with the fifth embodiment has a configuration substantially the same as that of the optical module (dispersion-adjusting module 10) in accordance with the first embodiment, and corresponds to a configuration such that the optical device 104 is provided in place of the optical device 103 in the configuration shown in FIG. 13. Also, in the optical device 104 in accordance with the fifth embodiment and dispersion-adjusting module including this, the operations upon bending of the flexible member 154 when a stress in the x-axis direction is applied thereto under the action of the bending means 120*a*, 130*a* are similar to those shown in FIGS. 14A–14D. In the following description, operations in the case where a stress is applied in the y-axis direction under the action of the second bending means 120*b*, 130*b* will mainly be explained.

Figure 24A:
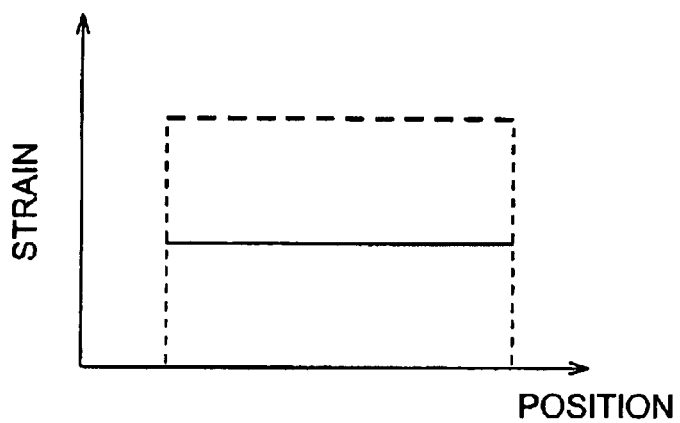
FIGS. 24A and 24B are views for explaining an operation of the optical device in accordance with the fifth embodiment.
Figure 24B:
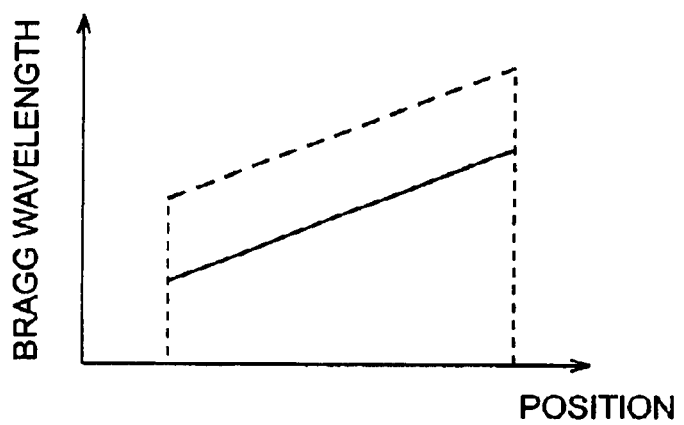
Figure 25A:
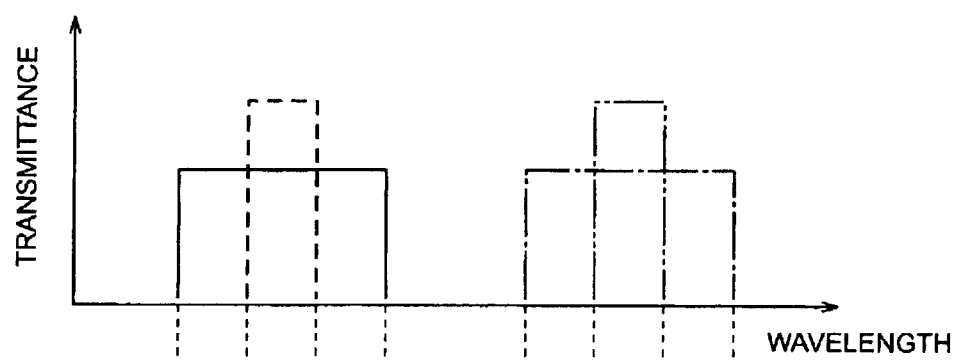
FIGS. 25A and 25B are views for explaining an operation of an optical module (dispersion-adjusting module) which is applied by the optical device in accordance with the fifth embodiment.
Figure 25B:
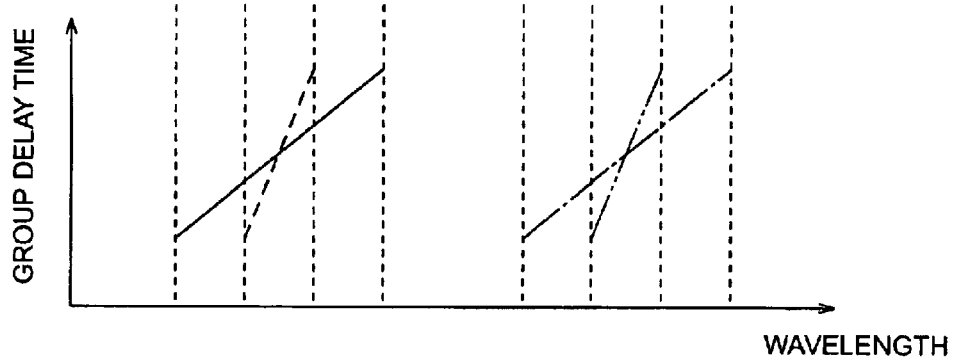

FIG. 24A and FIG. 24B are views for explaining operations of the optical device 104 in accordance with the fifth embodiment. FIG. 24A shows the longitudinal distribution of strain in the optical waveguide type diffraction grating device 160. FIG. 24B shows the longitudinal distribution of Bragg wavelength in the optical waveguide type diffraction grating device 160. In addition, FIG. 25A and FIG. 25B are views for explaining operations of the dispersion-adjusting module as an optical module which is applied by the optical device in accordance with the fifth embodiment. FIG. 25A shows the wavelength dependence of transmittance of the light through the dispersion-adjusting module from its input end to output end. FIG. 25B shows the wavelength dependence of group delay time when light is transmitted through the dispersion-adjusting module from its input end to output end.

As shown in FIG. 24A, when the flexible member 154 is bent under the action of the bending means 120*b*, 130*b*, a uniform strain occurs along the longitudinal direction in the optical waveguide type diffraction grating device 160 disposed in parallel to the neutral plane N2 upon bending. As a result, the Bragg wavelength changes uniformly according to the strain at each position in the optical waveguide type diffraction grating device 160 as shown in FIG. 24B. Each of the strain and Bragg wavelength in the optical waveguide type diffraction grating device 160 conforms to the direction and degree of flexure in the flexible member 154. Also, as shown in FIG. 25A and FIG. 25B, each of the transmission band, transmittance, and delay time of the light transmitted through the dispersion-adjusting module from its input end to output end varies depending on the direction and degree of flexure of the flexible member 154.

Namely, as can be seen from the comparison of the solid line with the broken line or the dash-single-dot line with the dash-double-dot line in FIG. 25A and FIG. 25B, if the range of Bragg wavelength along the longitudinal direction of the optical waveguide type diffraction grating device 160 broadens under the action of the first bending means 120*a*, 130*a*, the transmission band of the light transmitted through the dispersion-adjusting module from its input end to output end will widen, thereby lowering the transmittance in this band and making the wavelength dependence of group delay time gentler. By contrast, If the range of Bragg wavelength along the longitudinal direction of the optical waveguide type diffraction grating device 220 narrows under the action of the first bending means 120*a*, 130*a*, the transmission band of the light transmitted through the dispersion-adjusting module from its input end to output end will shrink, thereby increasing the transmittance in this band and making the wavelength dependence of group delay time steeper.

Also, as can be seen from the comparison of the solid line with the dash-single-dot line or the broken line with the dash-double-dot line in FIG. 25A and FIG. 25B, if the Bragg wavelength along the longitudinal direction of the optical waveguide type diffraction grating device 160 is uniformly elongated under the action of the second bending means 120*b*, 130*b*, the transmission band of the light transmitted through the dispersion-adjusting module from its input end to output end will shift to the longer wavelength side. By contrast, if the Bragg wavelength along the longitudinal direction of the optical waveguide type diffraction grating device 160 is uniformly shortened under the action of the bending means 120*b*, 130*b*, the transmission band of the light transmitted through the dispersion-adjusting module from its input end to output end will shift to the shorter wavelength side.

As described above, the optical device 104 in accordance with the fifth embodiment and dispersion-adjusting module including this can adjust the inclination of a dispersion characteristic since the optical waveguide type diffraction grating device 160 is secured to the flexible member 154 so as to intersect the neutral plane N1, and can adjust the wavelength band since the flexible member 160 is secured to the flexible member 154 so as to be in parallel to the neutral plane N2, thereby facilitating the adjustment of the dispersion characteristic (temperature compensation to adjust the dispersion characteristic caused by temperature changes).

Modified examples of the optical device in accordance with the aforementioned fourth and fifth embodiments will next be described below. In the following explanation, only the flexible member and optical waveguide type diffraction grating device will be shown without explaining the bending means. These optical devices can also be used as a constituent of the optical module of the dispersion-adjusting module and the like in a similar manner.

Figure 26:
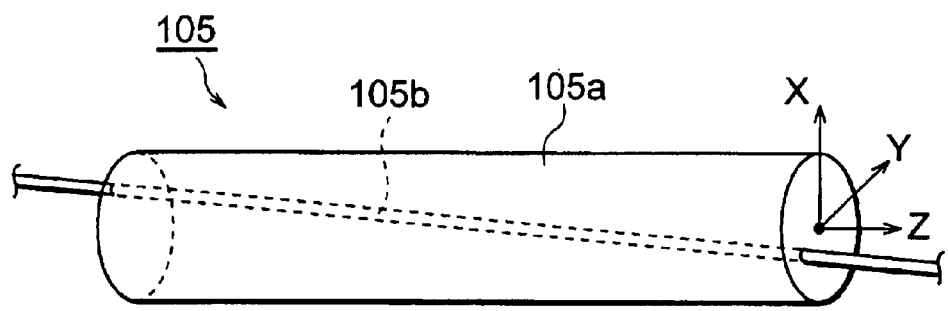
FIG. 26 is a view showing a partial configuration of a first modified example of the optical device in accordance with the fourth and fifth embodiments.

FIG. 26 is a view for explaining a part of the configuration of a flexible member 105*a* in an optical device 105 in accordance with a first modified example. The flexible member 105*a* in the optical device 105 has a cylindrical form and can bend in any optional direction. An optical waveguide type diffraction grating device 105*b* is embedded within the flexible member 105*a*. The optical waveguide type diffraction grating device 105*b* is disposed so as to obliquely intersect a neutral plane upon bending of the flexible member 105*a* when a stress is applied thereto in the x-axis direction. In addition, the optical waveguide type diffraction grating device 105*b* is disposed in parallel to a neutral plane upon bending of the flexible member 105*a* when a stress is applied thereto in the y-axis direction.

Therefore, when the flexible member 105*a* is bent in the x- or y-axis direction, the optical device 105 and the dispersion-adjusting module including the same operate similarly to the optical device 104 in accordance with the fifth embodiment. In addition, since the flexible member 105*a* can bend in any optional direction, the optical device 105 and the dispersion-adjusting module including the same can adjust the inclination and band of a dispersion characteristic at the same time by bending in a single direction.

Preferably, at least one of the cross-sectional area and Young's modulus in the flexible member 105*a* changes along the longitudinal direction thereof. Alternatively, when a metal or the like having a high Young's modulus and shaped into a truncated cone be embedded within the flexible member 105*a*, the large router diameter may be set to the fixed end but the smaller outer diameter may be set to the free end. In each of these cases, the distribution of tensile stress or compressive stress in the optical waveguide type diffraction grating device 105*b* upon bending of the flexible member 105*a* can be made optimum.

Figure 27:
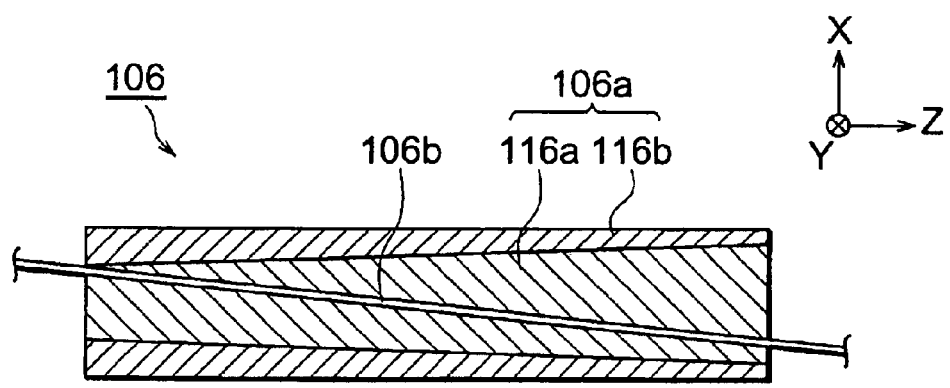
FIG. 27 is a view showing a partial configuration of a second modified example of the optical device in accordance with the fourth and fifth embodiments.

FIG. 27 is a view for explaining a part of the configuration of the optical device 106 in accordance with a second modified example. The flexible member 106*a* in the optical device 106 has a cylindrical outer form, and can bend in any optional direction. The flexible member 106*a* is composed of a pipe 116*b* in a substantially cylindrical form and having a higher Young's modulus with its inner diameter changing along the longitudinal direction thereof, and a resin 116*a* filled in the pipe 116b and having a lower Young's modulus. An optical device 420 is embedded within the resin 116a. The inner diameter of the pipe 116b is smaller on the fixed end side but greater on the free end side. The optical waveguide type diffraction grating device 106b is disposed so as to obliquely intersect a neutral plane upon bending of the flexible member 106a when a stress is applied thereto in the x-axis direction. In addition, the optical waveguide type diffraction grating device 106b is disposed in parallel to a neutral plane upon bending of the flexible member 106a when a stress is applied thereto in the y-axis direction.

Therefore, the optical device 106 and the dispersion-adjusting module including the same operate similarly to the optical device 104 in accordance with the fifth embodiment when the flexible member 106a is bent in the x- or y-axis direction. In addition, since the flexible member 106a can bend in any optional direction, the optical device 106 and the dispersion-adjusting module including the same can adjust the inclination and band of a dispersion characteristic at the same time by bending in a single direction. Also, since the inner diameter of the pipe 116b in the flexible member 106a changes along the longitudinal direction, the rigidity of the flexible member 106b changes along the longitudinal direction, whereby the optical device 106 can attain a desirable dispersion characteristic.

Figure 28:
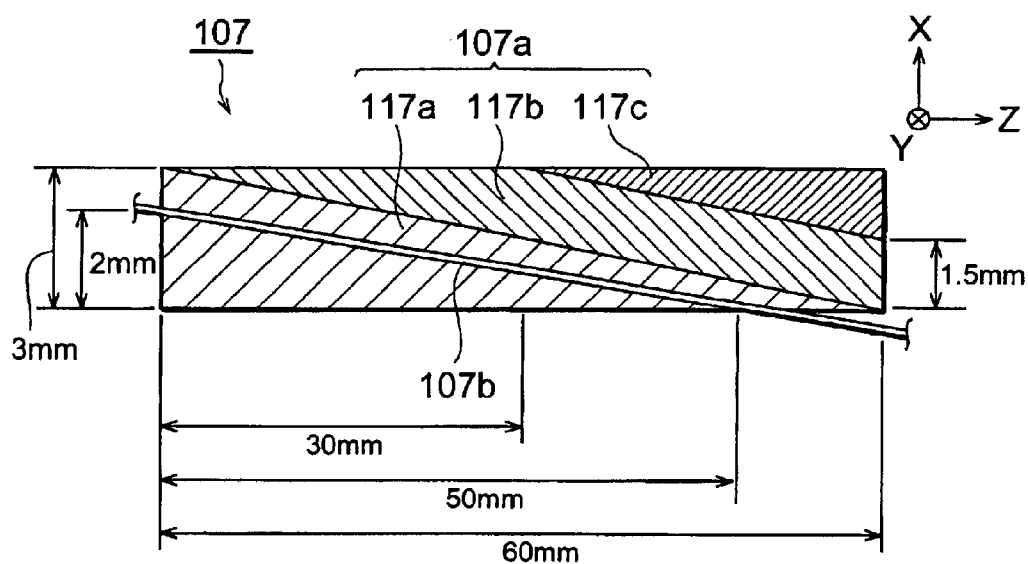
FIG. 28 is a view showing a partial configuration of a third modified example of the optical device in accordance with the fourth and fifth embodiments.

FIG. 28 is a view showing a part of the configuration of the optical device 107 in accordance with a third modified example. The flexible member 107a in the optical device 107 is one having a rectangular parallelepiped outer shape elongated in the z-axis direction, and can bend in any optional direction. The flexible member 107a has a uniform cross-sectional area along the longitudinal direction. In addition, the rigidity of the flexible member 107a varies along the longitudinal direction so as to become greater toward the fixed end and smaller toward the free end. Specifically, the flexible member 107a includes a first member 117a having a higher Young's modulus, a second member 117b having a medium Young's modulus, and a third member 117c having a lower Young's modulus. The cross-sectional area of the first member 117a having a higher Young's modulus becomes greater toward the fixed end. The cross-sectional area of the third member 117c having a lower Young's modulus becomes greater toward the free end. The second member 117b is held between the first member 117a and third member 117c, whereby the flexible member 107a as a whole has a uniform cross-sectional area along the longitudinal direction. Also, the optical waveguide type diffraction grating device 107b is disposed so as to obliquely intersect a neutral plane upon bending of the flexible member 107a when a stress is applied thereto in the x-axis direction. Therefore, the optical device 107 and the dispersion-adjusting module including the same operate similarly to the optical device 103 in accordance with the fourth embodiment when the flexible member 107a is bent in the x-axis direction. Also, since the rigidity of the flexible member 107a changes along the longitudinal direction, the optical device 107 can attain a desirable characteristic.

Figure 29:
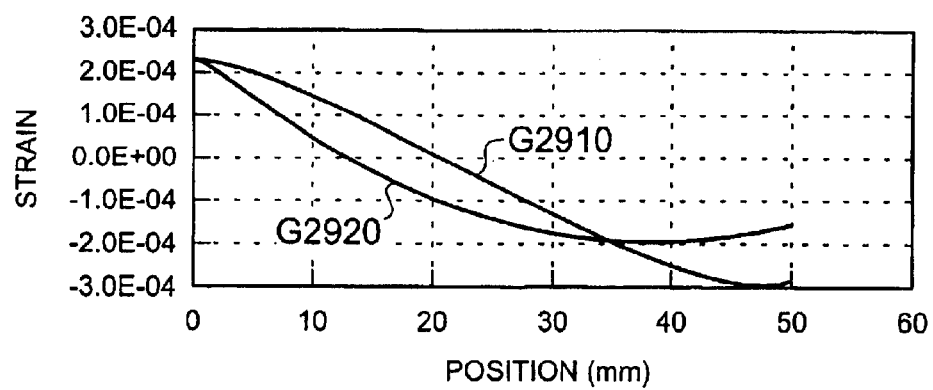
FIG. 29 is one example of a distribution of strain in an optical waveguide type diffraction grating device in the third modified example of the optical device in accordance with the fourth and fifth embodiments.

FIG. 29 is a distribution of strain in the optical waveguide type diffraction grating device 107b of the optical device 107 in accordance with the third modified example. Here, the flexible member 107a had a length of 60 mm in the z-axis direction, and a thickness of 3 mm in the x-axis direction. The first member 117a was made of a material (e.g., iron) having a Young's modulus of $20 \times 10^{10}$ Pa, and had a thickness of 2 mm in the x-axis direction at the fixed end position, with the thickness uniformly changing along the z axis. The third member 117c was made of a material (e.g., bismuth) having a Young's modulus of $3 \times 10^{10}$ Pa, a length of 30 mm in the z-axis direction, and a thickness of 1.5 mm in the x-axis direction at the fixed end position, with the thickness uniformly changing along the z axis. The second member 117b was made of a material (e.g., aluminum) having a Young's modulus of $7 \times 10^{10}$ Pa. The optical waveguide type diffraction grating device 107b was located at a position separated by 2 mm from the lower face at its fixed end position, and intersected the lower face at a position separated by 50 mm from the fixed end. As a comparative example, an optical device is prepared such that the whole flexible member is made of a material having a Young's modulus of $20 \times 10^{10}$ Pa. In FIG. 29, graphs G2910 and G2920 show respectively distributions of strain of the optical devices in accordance with the third modified example, and the comparative example. As shown in FIG. 29, the strain distribution in the optical waveguide type diffraction grating device is downward convex in the comparative example in which the whole flexible member is made of a material having a Young's modulus of $20 \times 10^{10}$ Pa with a longitudinally uniform rigidity. On the other hand, in the third modified example in which the rigidity changes longitudinally in the above-mentioned configuration, the strain distribution in the optical waveguide type diffraction grating device 107b is linear with respect to the position in the z-axis direction within the range where the distance from the fixed end is 5 mm to 35 mm. When the longitudinal distribution of rigidity in the flexible member 107a is appropriately set as such, the optical device 107 can attain a desirable dispersion characteristic.

Figure 30:
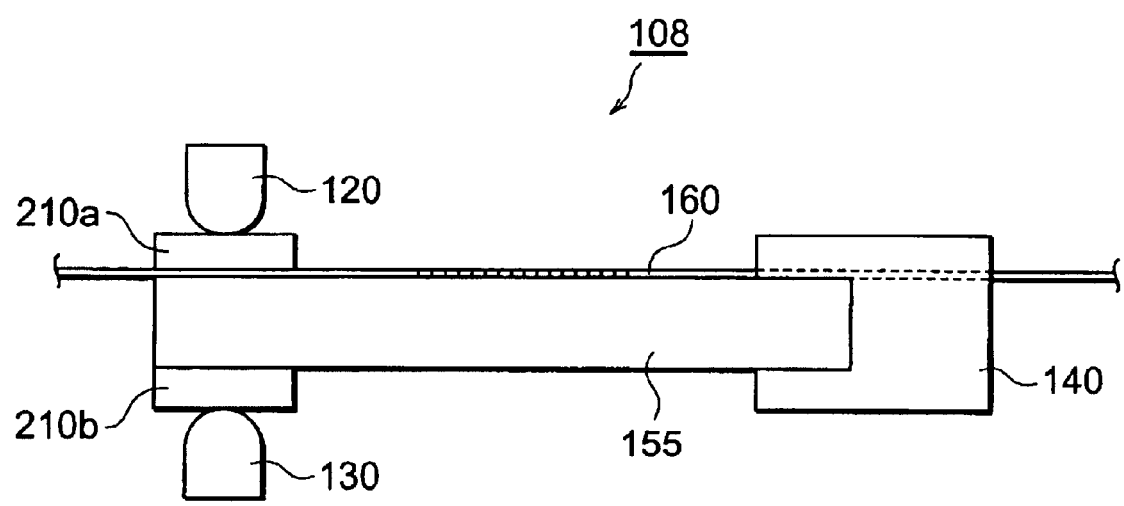
FIG. 30 is a plan view showing a configuration of a sixth embodiment in the optical device in accordance with the present invention.

FIG. 30 is a plan view showing a configuration of a sixth embodiment in the optical device in accordance with the present invention. Similarly to the optical devices 100–107 in accordance with the aforementioned embodiments, the optical device 108 in accordance with the sixth embodiment includes an optical waveguide type diffraction grating device 160, a flexible member 155 which secures the grating formation part of the optical waveguide type diffraction grating device 160, a securing member 140 which secures one end of the flexible member 155, and bending means 120, 130 such as solenoid which provides bending to the other end of the flexible member 155. In the optical device 108, when the respective leading ends of the bending means 120, 130 are in contact with the flexible member 155, the flexible member 155 is provided with the bending, and the optical characteristic of the optical waveguide type diffraction grating device 160 is adjusted by the bending applied to the flexible member 155. Normally, when the bending means 120, 130 each are a solenoid, a speed of the dislocation of the solenoid is relatively fast (It dislocates several meters by several tens milliseconds.) For this reason, these solenoids are in contact with the flexible member 155, the flexible member itself can vibrate. A stress applied to the optical waveguide type diffraction grating device 160 may vary due to the vibration of the flexible member 155.

For this reason, the optical device 108 in accordance with the sixth embodiment has shock absorbers 210a, 210b between the bending means 120, 130 and the flexible member 155 so as to absorb the impact caused by steep dislocations of the bending means 120, 130. The shock absorbers 210a, 210b can avoid effectively the occurrence of chatterings to be caused upon changing the optical characteristic in the optical waveguide type diffraction grating device 160.

Further, FIGS. 31A and 31B each are a plan view showing a configuration of a seventh embodiment in the optical device in accordance with the present invention. Similarly to the optical devices 100–108 in accordance with the aforementioned embodiments, the optical device 109 in accordance with the seventh embodiment includes an optical waveguide type diffraction grating device 160, a flexible member 156 which secures the grating formation part of the optical waveguide type diffraction grating device 160, a securing member 140 which secures one end of the flexible member 156, and bending means 120, 130 such as solenoid which provides bending to the other end of the flexible member 156. Normally, when a stress is not applied to the flexible member 156, the bending means 120, 130 is not in contact with the flexible member 156. In such a condition, the flexible member itself varies due to vibrations and so on, and the optical characteristic (e.g., central reflective wavelength) of the optical waveguide type diffraction grating device 160 may vary, which is caused by the variations of the flexible member 156.

Therefore, it is characterized in that the optical device 109 in accordance with the seven embodiment is further provided with securing portions 220a, 220b which prevent the vibrations and the like of the flexible member 156 when a stress is not applied to the flexible member 156 by the bending means 120, 130. Incidentally, in FIGS. 31A and 31B, reference numerals 230a, 230b denote a coupling portion for securing a relative position between the securing portions 220a, 220b and the bending means 120, 130.

Figure 32:
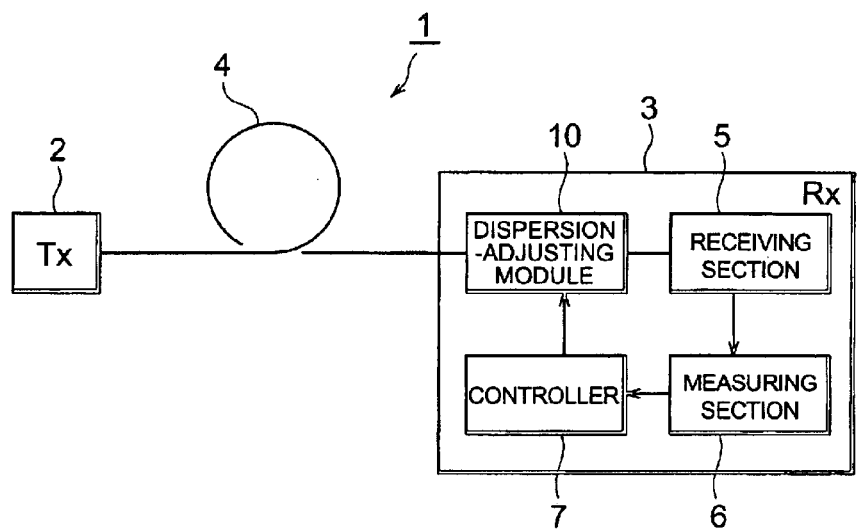
FIG. 32 is a view showing a configuration of a first embodiment in an optical transmission system in accordance with the present invention.

FIG. 32 is a diagram showing a configuration of a first embodiment in the optical transmission system in accordance with the present invention. The optical transmission system 1 in accordance with the first embodiment 1 includes an optical receiver 3, an optical transmitter 4, and an optical fiber transmission line 4 which is laid between the optical transmitter 2 and the optical receiver 3. The optical receiver 3 is provided with a dispersion-adjusting module 10 (see FIG. 10), a receiving section 5, a measuring section 6, and controller 7.

The optical transmitter 2 sends signal light to the optical fiber transmission line 4. The optical receiver 3 receives the signal light of propagated through the optical fiber transmission line 4. The dispersion-adjusting module 10 disposed within the optical receiver 3 compensates for the chromatic dispersion of the optical fiber transmission line 4. The receiving section 5 receives the signal light of its dispersion compensated for by the dispersion-adjusting module 10, and converts thus received signal light into an electric signal. Based on the electric signal outputted from the receiving section 5, the measuring section 6 measures the waveform strain of the signal light outputted from the dispersion-adjusting module 10. Then, based on the results of measurement effected by the measuring section 6, the controller 7 regulates the amount of flexure of the flexible member 153 caused by the bending means 120, 130 included in the dispersion-adjusting module 10, thereby adjusting the dispersion characteristic in the optical waveguide type diffraction grating device 160 included in the dispersion-adjusting module 10. Such a feedback operation in the dispersion-adjusting module 10, receiving section 5, measuring section 6, and controller 7 within the optical receiver 3 adjusts the dispersion characteristic of the dispersion-adjusting module 10 so as to compensate for the chromatic dispersion of the optical fiber transmission line 4.

The dispersion-adjusting module 10 used in this optical transmission system 1 in accordance with the first embodiment is an optical module includes the optical device 103 in accordance with the above-mentioned fourth embodiment, and its dispersion characteristic is adjustable. Consequently, the dispersion-adjusting module 10 can be mass-produced with a predetermined spec and, after being installed in the optical receiver 3, its dispersion characteristic can be adjusted corresponding to the dispersion characteristic of the optical fiber transmission line 4 to be subjected to dispersion compensation. Therefore, the dispersion-adjusting module 10 can be fabricated inexpensively, and the fabrication cost of the optical transmission system 1 becomes inexpensive as well. Also, when the dispersion characteristic of the optical fiber transmission line 4 to be subjected to dispersion compensation fluctuates due to temperature changes, the dispersion characteristic of the dispersion-adjusting module 10 can be adjusted in response to this fluctuation, whereby the chromatic dispersion of the optical fiber transmission line 4 can always be compensated for by the dispersion-adjusting module 10 favorably. Incidentally, when multiplex signal light of a plurality of channels is transmitted from the optical transmitter 2 to the optical receiver 3, in the optical receiver 3, after the signal light reached thereto is demultiplexed, the chromatic dispersion in each wavelength is compensated by the dispersion-adjusting module 10.

The configuration of the optical transmission system 1 in accordance with the present invention is not restricted to the above-mentioned embodiments, and various modifications are allowable. For example, the dispersion-adjusting module 10 applied in the optical transmission system 1 may be any of the other optical devices 100–102, 104–109 in place of the optical device 103 in accordance with the fourth embodiment.

Various embodiments of the optical module, and optical transmission system which can be applied by the optical device in accordance with the present invention will next be described.

Figure 33:
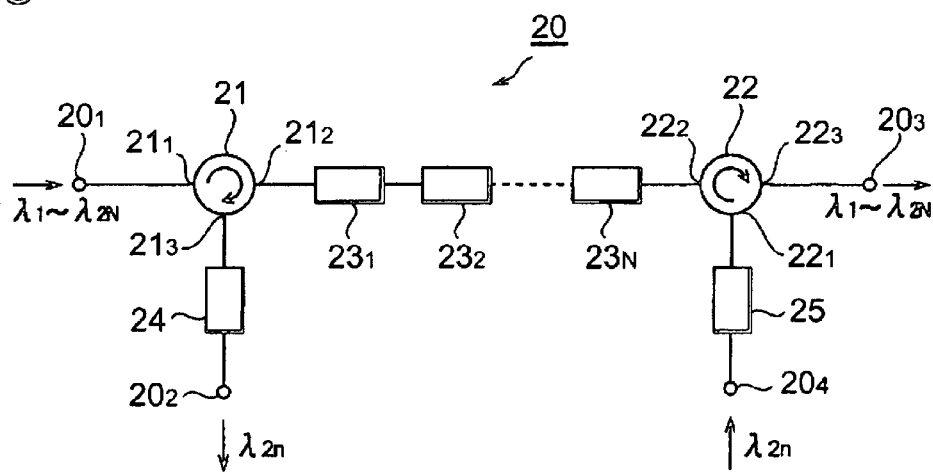
FIG. 33 is a view showing a configuration of a second embodiment (optical ADM) in the optical module in accordance with the present invention.

FIG. 33 is a diagram showing a configuration of an optical ADM20 as a second embodiment in the optical module in accordance with the present invention. The optical ADM20 includes optical circulators 21, 22 and optical devices $23_1$ to $23_N$ (where N is an integer of 1 or greater). Among them, each of the optical devices $23_1$ to $23_N$ is equivalent to the optical device 100 having the optical waveguide type diffraction grating device 160 formed with a Bragg grating. Each of equalizers 24, 25 may have the same composition as the optical device 100 having the optical waveguide type diffraction grating device 160 formed with a tilted Bragg grating or long-period grating. It is assumed that each wavelength of multiplex signal light inputted to/outputted from the optical ADM20 is defined by wavelengths of $\lambda_1$ to $\lambda_{2N}$. Incidentally, an optical waveguide type diffraction grating having a fixed reflection wavelength different from the optical devices $23_1$ to $23_N$ may be disposed between the optical circulators 21 and 22.

The optical circulator 21 has a first terminal $21_1$, a second terminal $21_2$, and a third terminal $21_3$. Light inputted from the first terminal $21_1$ is outputted from the second terminal $21_2$, whereas light inputted from the second terminal $21_2$ is outputted from the third terminal $21_3$. The first terminal $21_1$ is connected to IN terminal $20_1$ of the optical ADM20, the second terminal $21_2$ is optically connected to the optical device $23_1$, and the third terminal $21_3$ is optically connected to the equalizer 24.

The optical circulator 22 has a first terminal $22_1$, a second terminal $22_2$, and a third terminal $22_3$. Light inputted from the first terminal $22_1$ is outputted from the second terminal $22_2$, whereas light inputted from the second terminal $22_2$ is outputted from the third terminal $22_3$. The first terminal $22_1$ is optically connected to the equalizer 25, the second terminal $22_2$ is connected to the optical device $23_N$, and the third terminal $22_3$ is optically connected to OUT terminal $20_3$ of the optical ADM20.

The N optical devices $23_1$ to $23_N$ are cascaded and are disposed between the second terminal $21_2$ of the optical circulator 21 and the second terminal $22_2$ of the optical circulator 22. The optical device $23_n$ reflects one of the light of the wavelengths $\lambda_{2n-1}$ and $\lambda_{2n}$, but transmits the other therethrough (where n is any integer of at least 1 but not greater than N).

The equalizer 24 is disposed between the third terminal $21_3$ of the optical circulator 21 and DROP terminal $20_2$ of the optical ADM20, and equalizes the wavelength dependence of the losses suffered when light transmits from the first terminal $21_1$ to the third terminal $21_3$ in the optical circulator 21. The equalizer 24 is disposed between the first terminal $21_1$ of the optical circulator 22 and ADD terminal $20_4$ of the optical ADM20, and equalizes the wavelength dependence of the losses suffered when light transmits from the first terminal $22_1$ to the third terminal $22_3$ in the optical circulator 22.

This optical ADM operates as follows. Here, it is assumed that the optical device $23_n$ reflects the light of the wavelength $\lambda_{2n}$ in the wavelengths $\lambda_{2n}$ and $\lambda_{2n-1}$. At this time, the signal light of wavelengths $\lambda_1$ to $\lambda_{2N}$ inputted from IN terminal $20_1$ of the optical ADM20 is inputted through the first terminal $21_1$ of the optical circulator 21 and then is outputted from the second terminal $21_2$ thereof. In the light outputted from the second terminal $21_2$ of the optical circulator 21, the light of the wavelength $\lambda_{2n}$ is reflected by the optical device $23_n$, and then is transmitted through the second terminal $21_2$ and third terminal $21_3$ of the optical circulator 21 in turn; the light is loss-equalized in the equalizer 24, and then is outputted from the DROP terminal $20_2$ of the optical ADM20. On the other hand, the light of the wavelength $\lambda_{2n-1}$ in the light outputted from the second terminal $21_2$ of the optical circulator 21 is transmitted through the N optical devices $23_1$ to $23_N$; through the second terminal $22_2$ and the third terminal $22_3$ of the optical circulator 22, then the light is outputted from the OUT terminal $20_3$ of the optical ADM20. The light of the wavelength $\lambda_{2n}$ which is inputted through the ADD terminal $20_4$ of the optical ADM20 is loss-equalized by the equalizer 25, and then is transmitted through the first terminal $22_1$ and second terminal $22_2$ of the optical circulator 22 in turn to be reflected by the optical device $23_n$; through the second terminal $22_2$ and the third terminal $22_3$ of the optical circulator 22, then the light is outputted from the OUT terminal $20_3$ of the optical ADM20.

Thus, in the case where the optical device 23n reflects the light of the wavelength $\lambda_{2n}$ in the optical ADM 20, the signal light of wavelengths $\lambda_1$ to $\lambda_{2N}$ inputted from the IN terminal $20_1$ is demultiplexed, and the light of the wavelength $\lambda_{2n}$ is outputted from the DROP terminal $20_2$, whereas the light of the wavelength $\lambda_{2n-1}$ is multiplexed with the light of the wavelength $\lambda_{2n}$ inputted from the ADD terminal $20_4$, so as to be outputted from the OUT terminal $20_3$. By contrast, in the case where the optical device $23_n$ reflects the light of the wavelength $\lambda_{2n-1}$ in the optical ADM 20, the signal light of wavelengths $\lambda_1$ to $\lambda_{2N}$ inputted from the IN terminal $20_1$ is demultiplexed, and the light of the wavelength $\lambda_{2n-1}$ is outputted from the DROP terminal $20_2$, whereas the light of the wavelength $\lambda_{2n}$ is multiplexed with the light of the wavelength $\lambda_{2n-1}$ inputted from the ADD terminal $20_4$, to be outputted from the OUT terminal $20_3$. The optical circulator 22 and equalizer 25 will be unnecessary if only demultiplexing is carried out. The optical circulator 21 and equalizer 24 will be unnecessary if only multiplexing is carried out.

Wavelengths to be multiplexed or demultiplexed are variable in the optical ADM20 since it uses the optical devices $23_1$ to $23_N$ having variable reflection wavelengths. Also, since each optical device $23_n$ can selectively reflect any of two adjacent signal light wavelengths $\lambda_{2n-1}$ and $\lambda_{2n}$, an optical transmission system for multiplex WDM-transmitting signal light of a wavelength spacing of 1.6 nm (frequency spacing of 200 GHz), for example, is connected to each of the IN terminal $20_1$ and OUT terminal $20_3$.

Since the equalizer 24 is disposed between the third terminal $21_3$ of the optical circulator 21 and the DROP terminal $20_2$ of the optical ADM 20, the power deviation of the multiplex signal light inputted from the IN terminal $20_1$ and outputted to the DROP terminal $20_2$ is flattened. Similarly, since the equalizer 25 is disposed between the first terminal $22_1$ of the optical circulator 22 and the ADD terminal $20_4$ of the optical ADM 20, the power deviation of the multiplex signal light inputted from the ADD terminal $20_4$ and outputted to the OUT terminal $20_3$ is flattened.

Figure 34:
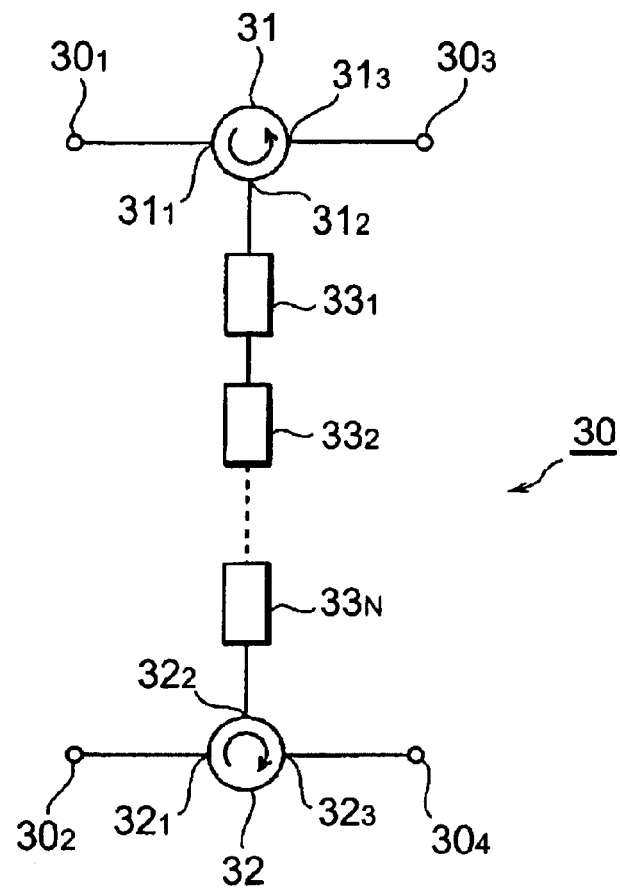
FIG. 34 is a view showing a configuration of a third embodiment (optical XC) in the optical module in accordance with the present invention.

FIG. 34 is a diagram showing a configuration of the optical XC 30 as a third embodiment in the optical module in accordance with the present invention. This optical XC30 includes optical circulators 31, 32 and optical devices $33_1$ to $33_N$ (where N is an integer of 1 or greater). Among them, each of the optical devices $33_1$ to $33_N$ has the same composition as the optical device 100 including the optical waveguide type diffraction grating device 160 having a Bragg grating. It is assumed that multiplex signal light inputted to/outputted from the optical XC30 has wavelengths of $\lambda_1$ to $\lambda_{2N}$. Incidentally, an optical waveguide type diffraction grating having a fixed reflection wavelength different from the optical devices $33_1$ to $33_N$ maybe disposed between the optical circulators 31 and 32.

The optical circulator 31 has a first terminal $31_1$, a second terminal $31_2$, and a third terminal $31_3$. The light inputted from the first terminal $31_1$ is outputted from the second terminal $31_2$, whereas the light inputted from the second terminal $31_2$ is outputted from the third terminal $31_3$. The first terminal $31_1$ is optically connected to a first input terminal $30_1$ of the optical XC30, the second terminal $31_2$ is optically connected to the optical device $33_1$, and the third terminal $31_3$ is optically connected to a first output terminal $30_3$ of the optical XC30.

The optical circulator 32 has a first terminal $32_1$, a second terminal $32_2$, and a third terminal $32_3$. The light inputted from the first terminal $32_1$ is outputted from the second terminal $32_2$, whereas light inputted from the second terminal $32_2$ is outputted from the third terminal $32_3$. The first terminal $32_1$ is connected to a second input terminal $30_2$ of the optical XC30, the second terminal $32_2$ is connected to the optical device $33_N$, and the third terminal $32_3$ is connected to a second output terminal $30_4$ of the optical XC30.

The N optical devices $33_1$ to $33_N$ are cascaded and are disposed between the second terminal $31_2$ of the optical circulator 31 and the second terminal $32_2$ of the optical circulator 32. The optical device $33_n$ reflects one of the light of the wavelengths $\lambda_{2n-1}$ and $\lambda_{2n}$ but transmits the other therethrough (where n is any integer of at least 1 but not greater than N).

The optical XC 30 operates as follows. It is assumed that the optical device $33_n$ reflects the light of the wavelength $\lambda_{2n}$ in the wavelengths $\lambda_{2n}$ and $\lambda_{2n-1}$.

In this case, the signal light of wavelengths $\lambda_1$ to $\lambda_{2N}$ inputted from the first input terminal $30_1$ of the optical XC30 is inputted through the first terminal $31_1$ of the optical circulator 31 and then is outputted from the second terminal $31_2$ thereof. In the light outputted from the second terminal $31_2$ of the optical circulator 31, the light of the wavelength $\lambda_{2n}$ is reflected by the optical device $33_n$, and is outputted from the third terminal 30₃ of the optical XC30 through the second terminal 31₂ and the third terminal 31₃ of the optical circulator 31. On the other hand, the light of the wavelength $\lambda_{2n-1}$ in the light outputted from the second terminal 31₂ of the optical circulator 31 is transmitted through the N optical devices 33₁ to 33_N, and then is outputted from the second output terminal 30₄ of the optical XC30 through the second terminal 32₂ and third terminal 32₂ of the optical circulator 32.

The signal light of wavelengths $\lambda_1$ to $\lambda_{2N}$ inputted from the second input terminal 30₂ of the optical XC30 is inputted to the first terminal 32₁ of the optical circulator 32 and then is outputted from the second terminal 32₂ thereof. In the light outputted from the second terminal 32₂ of the optical circulator 32, the light of the wavelength $\lambda_{2n}$ is reflected by the optical device 33_n, and then is outputted from the second output terminal 30₄ of the optical XC30 through the second terminal 32₂ and third terminal 32₃ of the optical circulator 32. On the other hand, the light of the wavelength $\lambda_{2n-1}$ in the light outputted from the second terminal 32₂ of the optical circulator 32 is transmitted through the N optical devices 33₁ to 33_N, and then is outputted from the first output terminal 30₃ of the optical XC30 through the second terminal 31₂ and third terminal 31₃ of the optical circulator 31.

Thus, in the case where the optical device 33_n reflects the light of the wavelength $\lambda_{2n}$ in the optical XC30, the signal light of wavelengths $\lambda_1$ to $\lambda_{2N}$ inputted from the first input terminal 30₁ is demultiplexed, and the light of the wavelength $\lambda_{2n}$ is outputted from the first output terminal 30₃, whereas the light of the wavelength $\lambda_{2n-1}$ is outputted from the second output terminal 30₄. On the other hand, the signal light of the wavelengths $\lambda_1$ to $\lambda_{2N}$ inputted from the second input terminal 30₂ is demultiplexed, and the light of the wavelength $\lambda_{2n}$, is outputted from the second output terminal 30₄, whereas the light of the wavelength $\lambda_{2n-1}$ is outputted from the first output terminal 30₃.

In the case where the optical device 33_n reflects the the light of the wavelength $\lambda_{2n-1}$, the signal light of the wavelengths $\lambda_1$ to $\lambda_{2N}$ inputted from the first input terminal 30₁ is demultiplexed, and the light of the wavelength $\lambda_{2n-1}$ is outputted from the first output terminal 30₃, whereas the light of the wavelength $\lambda_{2n}$ is outputted from the second output terminal 30₄. On the other hand, the signal light of the wavelengths $\lambda_1$ to $\lambda_{2N}$ inputted from the second input terminal 30₂ is demultiplexed, and the light of the wavelength $\lambda_{2n-1}$ is outputted from the second output terminal 30₄, whereas the light of the wavelength $\lambda_{2n}$ is outputted from the first output terminal 30₃.

Wavelengths to be multiplexed, demultiplexed, or path-changed are variable in the optical XC30 since it uses the optical devices 33₁ to 33_N having variable reflection wavelengths. Also, each optical device 33_n can selectively reflect any of two adjacent signal light wavelengths $\lambda_{2n-1}$ and $\lambda_{2n}$.

Figure 35:
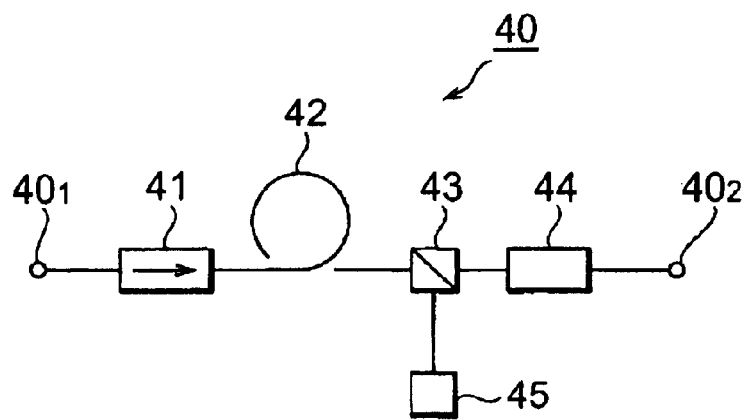
FIG. 35 is a view showing a configuration of an optical amplifier in accordance with the present invention.

Next, FIG. 35 is a diagram showing a composition of the optical amplifier in accordance with the present invention. This optical amplifier 40 includes, successively from its input terminal 40₁ to output terminal 40₂, an optical isolator 41, an amplification optical fiber (optical amplification medium) 42, an optical coupler 43, an optical device 44, and a pumping light source 45. Among them, the optical device 44 has the same composition as the optical device 100 including the optical waveguide type diffraction grating device 160 having a tilted Bragg grating or long-period grating.

The optical isolator 41 transmits therethrough light in the direction from the input terminal 40₁ to the amplification optical fiber 42 but does not transmit any light in the opposite direction. The amplification optical fiber 42 is an optical fiber having a core region doped with a fluorescent material (preferably Er element), in which the fluorescent material is exited when pumping light is supplied thereto, whereby inputted signal light is optically amplified. The optical coupler 43 outputs to the optical device 44 the signal light having arrived from the amplification optical fiber 42, and outputs to the amplification optical fiber 42 the pumping light having arrived from the pumping light source 45. The optical device 44 equalizes the gain of optical amplification in the amplification optical fiber 42. The pumping light source 45 outputs pumping light of a wavelength which can excite the fluorescent material added to the amplification optical fiber 42. In general, when the signal light wavelength is in the band of 1.55 µm, the fluorescent material added to the amplification optical fiber 32 is Er element, whereas the wavelength of pumping light outputted from the pumping light source 45 is 1.48 µm or 0.98 µm.

The optical amplifier 40 operates as follows. The pumping light outputted from the pumping light source 45 is supplied to the amplification optical fiber 42 by way of the optical coupler 43. The multiplex signal light inputted from the input terminal 40₁ is inputted to the amplification optical fiber 42 by way of the optical isolator 41, optically amplified by the amplification optical fiber 42, and then outputted from the output terminal 40₂ by way of the optical coupler 43 and optical device 44. When it is provided so that the loss spectrum in the optical device 44 has substantially the same form as that of the gain spectrum in the amplification optical fiber 42, the equalization of the gain may be achieved.

The multiplex signal light inputted from the optical amplifier 40 may fluctuate in the number of channels or the power of each signal component. In such a case, the power of pumping light supplied from the pumping light 45 to the amplification optical fiber 42 in the optical amplifier 40 is controlled so that the gain can be constant in the amplification optical fiber 42 or the optical power of outputted signal light can be constant. When the power of pumping light changes, the gain spectrum in the amplification optical fiber 42 may vary. Even in such a case, the loss spectrum in the optical device 44 is dynamically adjusted, whereby gain equalization can always be carried out in the optical amplifier 40 in accordance with this embodiment.

Figure 36:
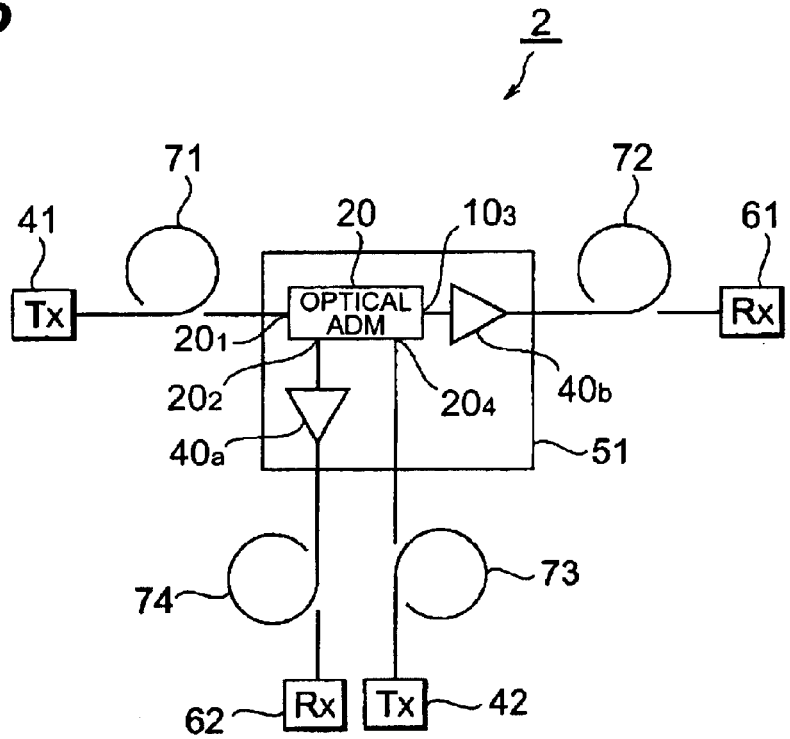
FIG. 36 is a view showing a configuration of a second embodiment in the optical transmission system in accordance with the present invention.

Next, FIG. 36 is a diagram showing a composition of a second embodiment in the optical transmission system in accordance with the present invention. This optical transmission system 2 in accordance with the second embodiment includes transmitters 41, 42, a repeater 51, and receivers 61, 62. An optical fiber transmission line 71 is laid between the transmitter 41 and the repeater 51, an optical fiber transmission line 72 is laid between the receiver 61 and the repeater 51, an optical fiber transmission line 73 is laid between the transmitter 42 and the repeater 51, and an optical fiber transmission line 74 is laid between the receiver 62 and the repeater 51.

Within the repeater 51, an optical ADM20 and optical amplifiers 40a, 40b are provided. The optical ADM 20 has the composition shown in FIG. 33. Also, the optical amplifiers 40a, 40b each have the composition shown in FIG. 35. The IN terminal 20₁ of the optical ADM 20 is optically connected to the optical fiber transmission line 71. The DROP terminal 20₂ of the optical ADM 20 is optically connected to the optical amplifier 40a. The OUT terminal 203 of the optical ADM 20 is optically connected to the optical amplifier 40b. The ADD terminal 20₄ of the optical ADM 20 is optically connected to the optical fiber transmission line 73. The optical amplifier 40a amplifies the multiplex light outputted from the DROP terminal $20_2$ of the optical ADM 20 and outputs thus amplified light to the optical fiber transmission line 74. The optical amplifier 40b amplifies the multiplex light outputted from the OUT terminal $20_3$ of the optical ADM 20 and outputs thus amplified light to the optical fiber transmission line 72. Here, any of the optical amplifiers 40a and 40b may be omitted, an optical amplifier may be provided in front of the IN terminal $20_1$ of the optical ADM 20, and an optical amplifier may be provided in front of the ADD terminal $20_4$ of the optical ADM 20.

The optical transmission system 2 in accordance with this second embodiment operates as follows. Here, it is assumed that the optical device $23_1$ in the optical ADM 20 reflects the light of the wavelength $\lambda_{2n}$ in the wavelengths $\lambda_{2n}$ and $\lambda_{2n-1}$.

The signal light of wavelengths $\lambda_1$ to $\lambda_{2N}$ outputted from the transmitter 41 propagates through the optical fiber transmission line 71, and is inputted from the IN terminal $20_1$ of the optical ADM 20 within the repeater 51. In the multiplex signal light inputted from the IN terminal $20_1$ of the optical ADM 20, the signal light of the wavelength $\lambda_{2n-1}$, is demultiplexed by the optical ADM 20, so as to be outputted from the DROP terminal $20_2$ and amplified by the optical amplifier 40a, and then propagates through the optical fiber transmission line 74, so as to reach the receiver 62. On the other hand, in the multiplex signal light inputted from the IN terminal $20_1$ of the optical ADM 20, the signal light of the wavelength $\lambda_{2n-1}$ is demultiplexed by the optical ADM 20, so as to be outputted from the OUT terminal $20_3$. The wavelength $\lambda_{2n}$ of signal light outputted from the transmitter 42 propagates through the optical fiber transmission line 73, so as to be inputted from the ADD terminal $20_4$ of the optical ADM 20 within the repeater 51, and then outputted from the OUT terminal $20_3$. The signal light of the wavelengths $\lambda_1$ to $\lambda_{2N}$ outputted from the OUT terminal $20_3$ of the optical ADM 20 is optically amplified by the optical amplifier 40b, so as to propagate through the optical fiber transmission line 72 and reach the receiver 61.

Thus, in the case where the optical device $23_n$ within the optical ADM 20 reflects the light of the wavelength $\lambda_{2n}$ in the optical transmission system 2, the signal light of the wavelength $\lambda_{2n}$ outputted from the transmitter 41 is demultiplexed by the repeater 51 and reaches the receiver 62, whereas the signal light of the wavelength $\lambda_{2n-1}$ outputted from the transmitter 41 and the signal light of the wavelength $\lambda_{2n}$ outputted from the transmitter 42 are multiplexed by the repeater 51 and reach the receiver 61. By contrast, in the case where the optical device $23_n$ within the optical ADM 20 reflects the light of the wavelength $\lambda_{2n-1}$, the signal light of the wavelength $\lambda_{2n-1}$ outputted from the transmitter 41 is demultiplexed by the repeater 51 and reaches the receiver 62, whereas the signal light of the wavelength $\lambda_{2n}$ outputted from the transmitter 41 and the signal light of the wavelength $\lambda_{2n-1}$ outputted from the transmitter 42 are multiplexed by the repeater 51 and reach the receiver 61.

In the optical transmission system 2 in accordance with the second embodiment, wavelengths to be multiplexed or demultiplexed are variable in the optical ADM 20 since it uses the optical devices $23_1$ to $23_N$ having variable reflection wavelengths. Also, since each optical device $23_n$ can selectively reflect any of two adjacent signal light wavelengths $\lambda_{2n-1}$ and $\lambda_{2n}$, each of the transmission system between the transmitter 41 and the repeater 51 and the transmission system between the receiver 61 and the repeater 51 can be an optical transmission system for WDM-transmitting multiplexed signal light having a wavelength spacing (channel spacing) of 0.8 nm (corresponding to frequency spacing of 100 GHz), whereas each of the transmission system between the transmitter 42 and the repeater 51 and the transmission system between the receiver 62 and the repeater 51 can be an optical transmission system for WDM-transmitting multiplex signal light having a wavelength spacing of 1.6 nm (corresponding to frequency spacing of 200 GHz), for example. Also, since the optical amplifiers 40a, 40b can dynamically adjust their loss spectra, gain equalization can always be carried out even when the wave number or the power of each wavelength fluctuates.

Figure 37:
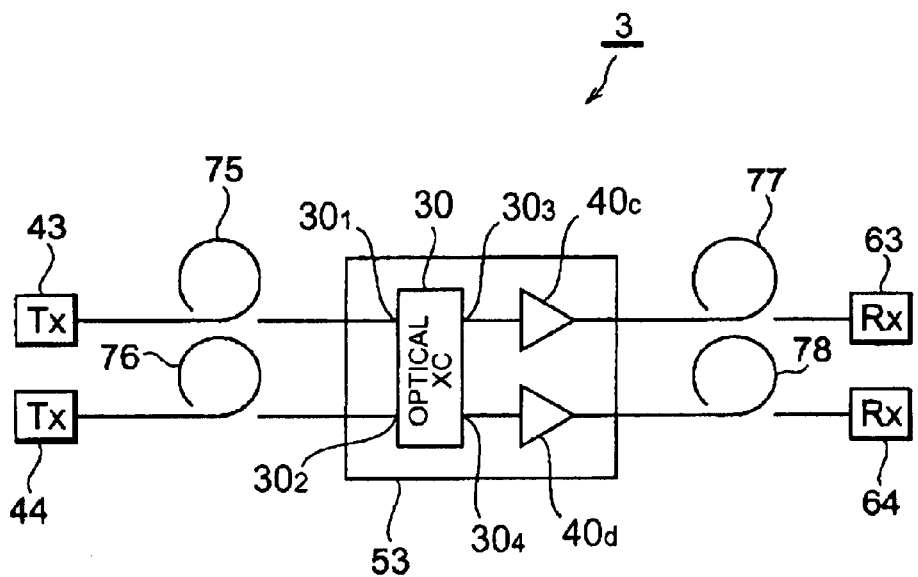
FIG. 37 is a view showing a configuration of a third embodiment in the optical transmission system in accordance with the present invention.

FIG. 37 is a diagram showing a composition of a third embodiment in the optical transmission system in accordance with the present invention. This optical transmission system 3 in accordance with the third embodiment includes transmitters 43, 44, a repeater 53, and receivers 63, 64. An optical fiber transmission line 75 is laid between the transmitter 43 and the repeater 53, an optical fiber transmission line 76 is laid between the transmitter 44 and the repeater 53, an optical fiber transmission line 77 is laid between the receiver 63 and the repeater 53, and an optical fiber transmission line 78 is laid between the receiver 63 and the repeater 53.

Within the repeater 53, an optical XC 30 and optical amplifiers 40c, 40d are provided. The optical XC 30 has the composition shown in FIG. 34. In addition, the optical amplifiers 40c, 40d each have the composition shown in FIG. 35. The first input terminal $30_1$ of the optical XC30 is optically connected to the optical fiber transmission line 75. The second input terminal $30_2$ of the optical XC30 is optically connected to the optical fiber transmission line 76. The first output terminal $30_3$ of the optical XC30 is optically connected to the optical amplifier 40c. The second output terminal $30_4$ of the optical XC30 is optically connected to the optical amplifier 40d. The optical amplifier 40c optically amplifies the multiplex signal light outputted from the first output terminal $30_3$ of the optical XC30 and outputs thus amplified light to the optical fiber transmission line 77. The optical amplifier 40d amplifies the multiplex signal light outputted from the second output terminal $30_4$ of the optical XC30 and outputs thus amplified light to the optical fiber transmission line 78. Here, any of the optical amplifiers 40c and 40d may be omitted, an optical amplifier maybe provided in front of the first input terminal $30_1$ of the optical XC30, and an optical amplifier may be provided in front of the second input terminal $30_2$ of the optical XC30.

The optical transmission system 3 operates as follows. Here, it is assumed that the optical device $33_n$ included in the optical XC30 reflects the light of the wavelength $\lambda_{2n}$ in the wavelengths $\lambda_{2n-1}$ and $\lambda_{2n}$.

The signal light of the wavelengths $\lambda_{2n-1}$ to $\lambda_{2N}$ outputted from the transmitter 43 propagates through the optical fiber transmission line 75, and is inputted from the first input terminal $30_1$ of the optical XC 30 within the repeater 53. In the multiplex signal light inputted from the first input terminal $30_1$ of the optical XC30, the signal light of the wavelength $\lambda_{2n}$ is demultiplexed by the optical XC30, so as to be outputted from the first output terminal $30_3$ and optically amplified by the optical amplifier 40c, and then propagates through the optical fiber transmission line 77, so as to reach the receiver 63. On the other hand, in the multiplex signal light inputted from the first input terminal $30_1$ of the optical XC30, the signal light of the wavelength $\lambda_{2n-1}$ is demultiplexed by the optical XC30, so as to be outputted from the second output terminal $30_4$ and optically amplified by the optical amplifier 40d, and then propagates through the optical fiber transmission line 78, so as to reach the receiver 64.

The signal light of the wavelengths $\lambda_1$ to $\lambda_{2N}$ outputted from the transmitter 44 propagates through the optical fiber transmission line 76, so as to be inputted from the second input terminal $30_2$ of the optical XC30 within the repeater 53. In the multiplex signal light inputted from the second input terminal $30_2$ of the optical XC30, the signal light of the wavelength $\lambda_{2n}$ is demultiplexed by the optical XC30, so as to be outputted from the second output terminal $30_4$ and optically amplified by the optical amplifier 40d, and then propagates through the optical fiber transmission line 78, so as to reach the receiver 64. On the other hand, in the multiplex signal light inputted from the second input terminal $30_2$ of the optical XC30, the signal light of the wavelength $\lambda_{2n-1}$ is demultiplexed by the optical XC30, so as to be outputted from the first output terminal $30_3$ and optically amplified by the optical amplifier 40c, and then propagates through the optical fiber transmission line 77 to reach the receiver 63.

Thus, in the case where the optical device $33_n$ within the optical XC30 in the optical transmission system 3 reflects the light of the wavelength $\lambda_{2n}$, the signal light of the wavelength $\lambda_{2n}$ in the signal light of wavelengths $\lambda_1$ to $\lambda_{2N}$ outputted from the transmitter 43 reaches the receiver 63 by way of the repeater 53, whereas the signal light of the wavelength $\lambda_{2n-1}$ reaches the receiver 64 by way of the repeater 53. On the other hand, the signal light of the wavelength $\lambda_{2n}$ in the signal light of wavelengths $\lambda_1$ to $\lambda_{2N}$ outputted from the transmitter 44 reaches the receiver 64 by way of the repeater 53, whereas the signal light of the wavelength $\lambda_{2n-1}$ reaches the receiver 63 by way of the repeater 53. By contrast, in the case where the optical device $33_n$ within the optical XC30 reflects the light of the wavelength $\lambda_{2n-1}$, the signal light of the wavelength $\lambda_{2n-1}$ within the signal light of wavelengths $\lambda_1$ to $\lambda_{2N}$ outputted from the transmitter 43 reaches the receiver 64 by way of the repeater 53, whereas the signal light of the wavelength $\lambda_{2n}$ reaches the receiver 64 by way of the repeater 53. On the other hand, the signal light of the wavelength $\lambda_{2n-1}$ within the signal light of wavelengths $\lambda_1$ to $\lambda_{2N}$ outputted from the transmitter 44 reaches the receiver 63 by way of the repeater 53, whereas the wavelength $\lambda_{2n}$ of signal light reaches the receiver 63 by way of the repeater 53.

In the optical transmission system 2 in accordance with the third embodiment, wavelengths to be multiplexed, demultiplexed, or path-changed are variable in the optical XC30 since it uses the optical devices $33_1$ to $33_N$ having variable reflection wavelengths. Also, each optical device $33_n$ can selectively reflect any of two adjacent signal light wavelengths $\lambda_{2n-1}$ and $\lambda_{2n}$. Also, since the optical amplifiers 40c, 40d can dynamically adjust their loss spectra, gain equalization can always be carried out even when the number of channels of signal light to be amplified or the power of each signal component varies.

Without being restricted to the above-mentioned embodiments, the present invention can be modified in various manners. For example, though the optical waveguide type diffraction grating device corresponds to the optical fiber formed with a grating, it can be replaced by a flat waveguide.

As described above, according to the present invention, an optical waveguide type diffraction grating device having an optical waveguide formed with a grating (Bragg grating, long-period grating, or tilted Bragg grating) is secured to a flexible member, and is provided with a compressive stress or tensile stress when the flexible member is bent under the action of bending means. The reflection spectrum or loss spectrum in the optical waveguide type diffraction grating device is adjusted according to thus applied stress. In the present invention, the optical waveguide type diffraction grating device is compressed/expanded by bending the flexible member, so that the amount of strain in the optical waveguide type diffraction grating device is smaller even when the amount of flexure of the flexible member is larger, whereby optical characteristics of the optical waveguide type diffraction grating device can be adjusted minutely.

In addition, In the optical waveguide type diffraction grating device disposed so as to intersect a neutral plane upon bending of the flexible member when the flexible member is bent under the action of the first bending means, a tensile stress acts along the longitudinal direction on one side of the intersection with the neutral plane and thus generates an expanding strain there, whereas a compressive stress acts along the longitudinal direction on the other side of the intersection with the neutral plane and thus generates a compressive strain there. As a result, in the optical waveguide type diffraction grating device, the Bragg wavelength becomes longer at each position on one side of the intersection according to the degree of expanding strain, whereas the Bragg wavelength becomes shorter at each position on the other side of the intersection according to the degree of compressive strain. The respective longitudinal distributions (polarity and absolute value of inclination) of the strain and Bragg wavelength in the optical waveguide type diffraction grating device correspond to the degrees of direction and flexure of the flexible member. The band, reflectance, and dispersion characteristic of the light reflected by the optical waveguide type diffraction grating device vary depending on the direction and degree of flexure of the flexible member. Further, the group delay characteristic of the dispersion-adjusting module including such an optical device varies depending on the direction and degree of flexure of the flexible member. Accordingly, the group delay characteristic maybe easily adjusted by only bending the flexible member.

Further, the optical transmission system in accordance with the present invention includes an optical module like the aforementioned dispersion-adjusting module. Particularly, in a case where the system includes the dispersion-adjusting module, a chromatic dispersion of the optical fiber transmission line is compensated by the dispersion-adjusting module, thereby performing high-quality signal light transmission. Also, since the dispersion characteristic of the dispersion-adjusting module is adjustable, the dispersion-adjusting module can be mass-produced with a predetermined spec, and the dispersion characteristic thereof can be adjusted after the installation according to the dispersion characteristic of the optical fiber transmission line to be subjected to dispersion compensation, thus fabricating the dispersion-adjusting module inexpensively, and further making the fabrication cost of the optical transmission system inexpensive also. Also, even when the dispersion characteristic of the optical fiber transmission line to be subjected to dispersion compensation fluctuates due to temperature changes, the dispersion characteristic of the dispersion-adjusting module can be adjusted corresponding to the fluctuation, whereby the chromatic dispersion of the optical fiber transmission line can always be compensated for by the dispersion-adjusting module favorably.

What is claimed is:
1. An optical device, comprising:
   an optical waveguide type diffraction grating device which has an optical waveguide and a Bragg grating provided in said optical waveguide and which Bragg- reflects with said Bragg grating light having a specific wavelength and propagating through said optical waveguide in a first direction, and transmitting thus reflected light in a second direction opposite to the first direction;

a flexible member having a flexibility, said flexible member having said optical waveguide type diffraction grating device secured at a part to which a compressive stress or tensile stress is applied upon bending, said flexible member having a shape which changes the thickness along a longitudinal direction of said flexible member; and first bending means which provides the compressive stress or tensile stress to said optical waveguide type diffraction grating device by bending said flexible member along a first reference axis corresponding to a direction of the thickness changing along the longitudinal direction, to thereby adjust the reflective wavelength in said optical waveguide type diffraction grating device, wherein said first bending means has a structure which secures one end side of said flexible member with a greater thickness, to thereby bend said flexible member by displacing the position of the other end of said flexible member with a smaller thickness along the first reference axis.

2. An optical device according to claim 1, wherein said optical waveguide type diffraction grating device has a reflective wavelength which differs between when provided with the compressive stress and when provided with the tensile stress.

3. An optical device according to claim 1, wherein said first bending member includes a solenoid.

4. An optical device comprising:

an optical waveguide type diffraction grating device which has an optical waveguide and a Bragg grating provided in said optical waveguide and which Bragg-reflects with said Bragg grating light having a specific wavelength and propagating through said optical waveguide in a first direction, and transmitting thus reflected light in a second direction opposite to the first direction;

a flexible member having a flexibility, said flexible member having said optical waveguide type diffraction grating device secured at a part to which a compressive stress or tensile stress is applied upon bending;

first bending means which provides the compressive stress or tensile stress to said optical waveguide type diffraction grating device by bending said flexible member along a first reference axis, to thereby adjust the reflective wavelength in said optical waveguide type diffraction grating device, wherein said first bending member includes a solenoid; and a shock absorber arranged between said flexible member and the solenoid included in said first bending means.

5. An optical device according to claim 1, wherein said optical waveguide type diffraction grating device is secured within said flexible member and changes distance from a surface of said flexible member along a predetermined direction of said flexible member; and wherein said first bending means has a structure which secures one end side of said flexible member where the distance between the surface of said flexible member and said optical waveguide type diffraction grating device is greater, to thereby bend said flexible member by displacing along the first reference axis the position of the other end of said flexible member where the distance is smaller.

6. An optical device comprising:

an optical waveguide type diffraction grating device which has an optical waveguide and a Bragg grating provided in said optical waveguide and which Bragg-reflects with said Bragg grating light having a specific wavelength and propagating through said optical waveguide in a first direction, and transmitting thus reflected light in a second direction opposite to the first direction;

a flexible member having a flexibility, said flexible member having said optical waveguide type diffraction grating device secured at a part to which a compressive stress or tensile stress is applied upon bending;

first bending means which provides the compressive stress or tensile stress to said optical waveguide type diffraction grating device by bending said flexible member along a first reference axis, to thereby adjust the reflective wavelength in said optical waveguide type diffraction grating device, wherein said first bending member includes a solenoid; and second bending means which provides the compressive stress or tensile stress to said optical waveguide type diffraction grating device by bending said flexible member along a second reference axis which intersects with the first reference axis, to thereby adjust the reflective wavelength in said optical waveguide type diffraction grating device.

7. An optical device according to claim 6, wherein said second bending means has a structure in which a reflective wavelength in said optical waveguide type diffraction grating device when said second bending means does not bend said flexible member is maintained between a first reflective wavelength in said optical waveguide type diffraction grating device upon applying the compressive stress and a second reflective wavelength in said optical waveguide type diffraction grating device upon applying the tensile stress.

8. An optical device according to claim 6, said second bending means includes a solenoid.

9. An optical device according to claim 8, further comprising a shock absorber arranged between said flexible member and the solenoid included in said second bending means.

10. An optical device according to claim 6, wherein said flexible member has a shape which changes the thickness along a predetermined direction, and said second bending means has a structure which secures one end side of said flexible member having a greater thickness, to thereby bending said flexible member by displacing the other end side of said flexible member having a smaller thickness along the second reference axis.

11. An optical device according to claim 6, wherein said optical waveguide type diffraction grating device is secured within said flexible member and changes distance from a surface of said flexible member along a predetermined direction of said flexible member; and wherein said second bending means has a structure which secures one end side of said flexible member where the distance between the surface of said flexible member and said optical waveguide type diffraction grating device is greater, to thereby bend said flexible member by displacing along the first reference axis the position of the other end of said flexible member where the distance is smaller.

12. An optical device according to claim 1, wherein said optical waveguide type diffraction grating device is secured to said flexible member in a state which is provided with a tensile stress even when said flexible member is not bent.

13. An optical device comprising:
an optical waveguide type diffraction grating device which has an optical waveguide and a Bragg grating provided in said optical waveguide and which Bragg-reflects with said Bragg grating light having a specific wavelength and propagating through said optical waveguide in a first direction, and transmitting thus reflected light in a second direction opposite to the first direction;
a flexible member having a flexibility, said flexible member having said optical waveguide type diffraction grating device secured at a part to which a compressive stress or tensile stress is applied upon bending;
first bending means which provides the compressive stress or tensile stress to said optical waveguide type diffraction grating device by bending said flexible member along a first reference axis, to thereby adjust the reflective wavelength in said optical waveguide type diffraction grating device, and
compensating means which compensates for a characteristic change caused by a temperature change of said optical waveguide type diffraction grating device.

14. An optical module including an optical device according to claim 1.

15. An optical module according to claim 14, further comprising equalizing means for equalizing a wavelength dependence of loss upon reflection or transmission of light in said optical device.

16. An optical transmission system including an optical module according to claim 14.

17. An optical transmission system according to claim 16, wherein a reflective wavelength in said optical waveguide type diffraction grating device when said first bending means does not bend said flexible member is maintained between a first reflective wavelength in said optical waveguide type diffraction grating device upon applying the compressive stress and a second reflective wavelength in said optical waveguide type diffraction grating device upon applying the tensile stress.

18. An optical device, comprising:
an optical waveguide type diffraction grating device having an optical waveguide and a long-period grating provided in said optical waveguide, and coupling core-mode light having a specific wavelength propagating through said optical waveguide in a first direction with cladding-mode light through said long-period grating so as to cause a loss in said core-mode light having said specific wavelength;
a flexible member having a flexibility, said flexible member having said optical waveguide type diffraction grating device secured at a part to which a compressive stress or tensile stress is applied upon bending; and
first bending means for providing a compressive stress or tensile stress to said optical waveguide type diffraction grating device by bending said flexible member along a first reference axis so as to adjust a loss spectrum in said optical waveguide type diffraction grating.

19. An optical device according to claim 18, wherein said first bending means includes a solenoid.

20. An optical device comprising:
an optical waveguide type diffraction grating device having an optical waveguide and a long-period grating provided in said optical waveguide, and coupling core-mode light having a specific wavelength propagating through said optical waveguide in a first direction with cladding-mode light through said long-period grating so as to cause a loss in said core-mode light having said specific wavelength;
a flexible member having a flexibility, said flexible member having said optical waveguide type diffraction grating device secured at a part to which a compressive stress or tensile stress is applied upon bending; and
first bending means for providing a compressive stress or tensile stress to said optical waveguide type diffraction grating device by bending said flexible member along a first reference axis so as to adjust a loss spectrum in said optical waveguide type diffraction grating, wherein said first bending means includes a solenoid; and
a shock absorber arranged between said flexible member and the solenoid included in said first bending means.

21. An optical device according to claim 18, wherein said flexible member has a shape which changes the thickness along a longitudinal direction of said flexible member, and said first bending means has a structure which secures one end side of said flexible member with a greater thickness, to thereby bend said flexible member by displacing the position of the other end of said flexible member with a smaller thickness along the first reference axis.

22. An optical device according to claim 18, wherein said optical waveguide type diffraction grating device is secured within said flexible member and changes distance from a surface of said flexible member along a predetermined direction of said flexible member; and
wherein said first bending means has a structure which secures one end side of said flexible member where the distance between the surface of said flexible member and said optical waveguide type diffraction grating device is greater, to thereby bend said flexible member by displacing along the first reference axis the position of the other end of said flexible member where the distance is smaller.

23. An optical device comprising:
an optical waveguide type diffraction grating device having an optical waveguide and a long-period grating provided in said optical waveguide, and coupling core-mode light having a specific wavelength propagating through said optical waveguide in a first direction with cladding-mode light through said long-period grating so as to cause a loss in said core-mode light having said specific wavelength;
a flexible member having a flexibility, said flexible member having said optical waveguide type diffraction grating device secured at a part to which a compressive stress or tensile stress is applied upon bending;
first bending means for providing a compressive stress or tensile stress to said optical waveguide type diffraction grating device by bending said flexible member along a first reference axis so as to adjust a loss spectrum in said optical waveguide type diffraction grating, and
second bending means which provides the compressive stress or tensile stress to said optical waveguide type diffraction grating device by bending said flexible member along a second reference axis which intersects with the first reference axis, to thereby adjust the reflective wavelength in said optical waveguide type diffraction grating device.

24. An optical device according to claim 23, wherein said second bending means includes a solenoid.

25. An optical device according to claim 24, further comprising a shock absorber arranged between said flexible member and the solenoid included in said second bending means.

26. An optical device according to claim 23, wherein said flexible member has a shape which changes the thickness along a longitudinal direction of said flexible member, and said second bending means has a structure which secures one end side of said flexible member with a greater thickness, to thereby bend said flexible member by displacing the other end side of said flexible member with a smaller thickness along the second reference axis.

27. An optical device according to claim 23, wherein said optical waveguide type diffraction grating device is secured within said flexible member and changes distance from a surface of said flexible member along a predetermined direction of said flexible member; and wherein said first bending means has a structure which secures one end side of said flexible member where the distance between the surface of said flexible member and said optical waveguide type diffraction grating device is greater, to thereby bend said flexible member by displacing along the first reference axis the position of the other end of said flexible member where the distance is smaller.

28. An optical device comprising:

an optical waveguide type diffraction grating device having an optical waveguide and a long-period grating provided in said optical waveguide, and coupling core-mode light having a specific wavelength propagating through said optical waveguide in a first direction with cladding-mode light through said long-period grating so as to cause a loss in said core-mode light having said specific wavelength;

a flexible member having a flexibility, said flexible member having said optical waveguide type diffraction grating device secured at a part to which a compressive stress or tensile stress is applied upon bending;

first bending means for providing a compressive stress or tensile stress to said optical waveguide type diffraction grating device by bending said flexible member along a first reference axis so as to adjust a loss spectrum in said optical waveguide type diffraction grating; and compensating means which compensates for a characteristic change caused by a temperature change of said optical waveguide type diffraction grating device.

29. An optical device according to claim 18, wherein said optical waveguide type diffraction grating device is secured to said flexible member in a state which is provided with a tensile stress even when said flexible member is not bent.

30. An optical amplifier, comprising:

an optical amplification medium for amplifying light; and an optical device according to claim 18 for equalizing the wavelength dependence of a gain of amplification in said optical amplification medium.

31. An optical transmission system including an optical amplifier according to claim 30.

32. An optical device, comprising:

an optical waveguide type diffraction grating device which has an optical waveguide and a Bragg grating provided in an oblique state to said optical waveguide and which Bragg-reflects with said Bragg grating light having a specific wavelength and transmitting through said optical waveguide in a first direction, to thereby cause a loss in said light of the specific wavelength;

a flexible member having a flexibility, said flexible member having said optical waveguide type diffraction grating device secured at a part to which a compressive stress or tensile stress is applied upon bending; and first bending means which provides the compressive stress or tensile stress to said optical waveguide type diffraction grating device by bending said flexible member along a first reference axis, to thereby adjust a loss spectrum in said optical waveguide type diffraction grating device.

33. An optical device claim 32, wherein said first bending means includes a solenoid.

34. An optical device comprising:

an optical waveguide type diffraction grating device which has an optical waveguide and a Bragg grating provided in an oblique state to said optical waveguide and which Bragg-reflects with said Bragg grating light having a specific wavelength and transmitting through said optical waveguide in a first direction, to thereby cause a loss in said light of the specific wavelength;

a flexible member having a flexibility, said flexible member having said optical waveguide type diffraction grating device secured at a part to which a compressive stress or tensile stress is applied upon bending;

first bending means which provides the compressive stress or tensile stress to said optical waveguide type diffraction grating device by bending said flexible member along a first reference axis, to thereby adjust a loss spectrum in said optical waveguide type diffraction grating device, wherein said first bending means includes a solenoid; and a shock absorber arranged between said flexible member and the solenoid included in said first bending means.

35. An optical device according to claim 32, wherein said flexible member has a shape which changes the thickness along a longitudinal direction of said flexible member, and said first bending means has a structure which secures one end side of said flexible member with a greater thickness, to thereby bend said flexible member by displacing the other end side of said flexible member with a smaller thickness along the first reference axis.

36. An optical device according to claim 32, wherein said optical waveguide type diffraction grating device is secured within said flexible member and changes distance from a surface of said flexible member along a predetermined direction of said flexible member; and wherein said first bending means has a structure which secures one end side of said flexible member where the distance between the surface of said flexible member and said optical waveguide type diffraction grating device is greater, to thereby bend said flexible member by displacing along the first reference axis the position of the other end of said flexible member where the distance is smaller.

37. An optical device comprising:

an optical waveguide type diffraction grating device which has an optical waveguide and a Bragg grating provided in an oblique state to said optical waveguide and which Bragg-reflects with said Bragg grating light having a specific wavelength and transmitting through said optical waveguide in a first direction, to thereby cause a loss in said light of the specific wavelength;

a flexible member having a flexibility, said flexible member having said optical waveguide type diffraction grating device secured at a part to which a compressive stress or tensile stress is applied upon bending;

first bending means which provides the compressive stress or tensile stress to said optical waveguide type diffraction grating device by bending said flexible member along a first reference axis, to thereby adjust a loss spectrum in said optical waveguide type diffraction grating device; and second bending means which provides the compressive stress or tensile stress to said optical waveguide type diffraction grating device by bending said flexible member along a second reference axis which intersects with the first reference axis, to thereby adjust the reflective wavelength in said optical waveguide type diffraction grating device.

38. An optical device according to claim 37, said second bending means includes a solenoid.

39. An optical device according to claim 38, further comprising a shock absorber arranged between said flexible member and the solenoid included in said second bending means.

40. An optical device according to claim 37, wherein said flexible member has a shape which changes the thickness along a predetermined direction, and said second bending means has a structure which secures one end side of said flexible member with a greater thickness, to thereby bend said flexible member by displacing the other end side of said flexible member with a smaller thickness along the second reference axis.

41. An optical device according to claim 37, wherein said optical waveguide type diffraction grating device is secured within said flexible member and changes distance from a surface of said flexible member along a predetermined direction of said flexible member; and wherein said first bending means has a structure which secures one end side of said flexible member where the distance between the surface of said flexible member and said optical waveguide type diffraction grating device is greater, to thereby bend said flexible member by displacing along the first reference axis the position of the other end of said flexible member where the distance is smaller.

42. An optical device comprising:

an optical waveguide type diffraction grating device which has an optical waveguide and a Bragg grating provided in an oblique state to said optical waveguide and which Bragg-reflects with said Bragg grating light having a specific wavelength and transmitting through said optical waveguide in a first direction, to thereby cause a loss in said light of the specific wavelength;

a flexible member having a flexibility, said flexible member having said optical waveguide type diffraction grating device secured at a part to which a compressive stress or tensile stress is applied upon bending;

first bending means which provides the compressive stress or tensile stress to said optical waveguide type diffraction grating device by bending said flexible member along a first reference axis, to thereby adjust a loss spectrum in said optical waveguide type diffraction grating device; and compensating means which compensates for a characteristic change caused by a temperature change of said optical waveguide type diffraction grating device.

43. An optical device according to claim 32, wherein said optical waveguide type diffraction grating device is secured to said flexible member in a state which is provided with a tensile stress even when said flexible member is not bent.

44. An optical amplifier, comprising:

an optical amplification medium for amplifying light; and
an optical device according to claim 32 for equalizing the wavelength dependence of a gain of amplification in said optical amplification medium.

45. An optical transmission system including an optical amplifier according to claim 43.

46. An optical device, comprising:

a flexible member having a flexibility;

first bending means for bending said flexible member by providing said flexible member with a stress along a first reference axis direction; and an optical waveguide type diffraction grating device disposed so as to obliquely intersect a neutral plane upon bending of said flexible member when the stress is applied thereto by said first bending means, and having an optical waveguide and a Bragg grating formed in said optical waveguide, said optical waveguide type diffraction grating device Bragg-reflecting with said Bragg grating light having a specific wavelength which propagates through said optical waveguide in said first direction, and transmitting through thus reflected light in a second direction opposite to said first direction.

47. An optical device according to claim 46, wherein said first bending means includes a solenoid.

48. An optical device further comprising:

a flexible member having a flexibility;

first bending means for bending said flexible member by providing said flexible member with a stress along a first reference axis direction;

an optical waveguide type diffraction grating device disposed so as to obliquely intersect a neutral plane upon bending of said flexible member when the stress is applied thereto by said first bending means, and having an optical waveguide and a Bragg grating formed in said optical waveguide, said optical waveguide type diffraction grating device Bragg-reflecting with said Bragg grating light having a specific wavelength which propagates through said optical waveguide in said first direction, and transmitting through thus reflected light in a second direction opposite to said first direction, wherein said first bending means includes a solenoid; and a shock absorber arranged between said flexible member and the solenoid included in said first bending means.

49. An optical device according to claim 46, wherein said first bending means has a structure which can prevent the variation of the central reflective wavelength in said optical waveguide type diffraction grating device when said first bending means does not bend said flexible member.

50. An optical device comprising:

a flexible member having a flexibility;

first bending means for bending said flexible member by providing said flexible member with a stress along a first reference axis direction; and an optical waveguide type diffraction grating device disposed so as to obliquely intersect a neutral plane upon bending of said flexible member when the stress is applied thereto by said first bending means, and having an optical waveguide and a Bragg grating formed in said optical waveguide, said optical waveguide type diffraction grating device Bragg-reflecting with said Bragg grating light having a specific wavelength which propagates through said optical waveguide in said first direction, and transmitting through thus reflected light in a second direction opposite to said first direction; and second bending means for bending said flexible member by applying a stress along a second reference axis which is different from the first reference axis.

51. An optical device according to claim 50, wherein said optical waveguide type diffraction grating device is disposed so as to be in parallel to a neutral plane upon bending of said flexible member when a stress is applied by said second bending means.

52. An optical device according to claim 50, wherein said second bending means includes a solenoid.

53. An optical device according to claim 52, further comprising a shock absorber arranged between said flexible member and the solenoid included in said second bending means.

54. An optical device according to claim 46, wherein said flexible member is made of a resin.

55. An optical device according to claim 46, flexible member is made of a resin which a part of said optical waveguide type diffraction grating device is molded.

56. An optical device according to claim 46, wherein said flexible member includes first and second members for securing said optical waveguide type diffraction grating device in a state which holds a part thereof between said first and second members.

57. An optical device according to claim 46, flexible member has an elongated groove portion for securing said optical waveguide type diffraction grating device.

58. An optical device according to claim 46, wherein said flexible member has at least one of a cross-sectional area and rigidity changing along a longitudinal direction.

59. An optical device adjusting method for adjusting an optical device according to claim 50, said method comprising the steps of:
monitoring a dispersion characteristic of light reflected by said optical waveguide type diffraction grating device, and
adjusting, according to a result of said monitoring, the amount of flexure of said flexible member caused by said first bending means.

60. A dispersion-adjusting module including an optical device according to claim 46, said dispersion-adjusting module adjusting a chromatic dispersion of light by reflecting said light with said optical waveguide type diffraction grating device included in said optical device.

61. An optical transmission system including an optical module according to claim 60.

62. An optical device, comprising:
an optical waveguide type diffraction grating device which has an optical waveguide and a Bragg grating provided in said optical waveguide and which Bragg-reflects with said Bragg grating light having a specific wavelength and propagating through said optical waveguide in a first direction, and transmitting thus reflected light in a second direction opposite to the first direction;
a flexible member having a flexibility, said flexible member having said optical waveguide type diffraction grating device secured at a part to which a compressive stress or tensile stress is applied upon bending, said flexible member having a rigidity changing along a longitudinal direction of said flexible member; and
first bending means which provides the compressive stress or tensile stress to said optical waveguide type diffraction grating device by bending said flexible member along a first reference axis, to thereby adjust the reflective wavelength in said optical waveguide type diffraction grating device.

63. An optical device according claim 62, wherein said optical waveguide type diffraction grating device has a reflective wavelength which differs between when provided with the compressive stress and when provided with the tensile stress.

64. An optical device according to claim 62, wherein said first bending member includes a solenoid.

65. An optical device according to claim 64, further comprising a shock absorber arranged between said flexible member and the solenoid included in said first bending means.

66. An optical device according to claim 62, wherein said optical waveguide type diffraction grating device is secured within said flexible member and changes distance from a surface of said flexible member along a predetermined direction of said flexible member; and wherein said first bending means has a structure which secures one end side of said flexible member where the distance between the surface of said flexible member and said optical waveguide type diffraction grating device is greater, to thereby bend said flexible member by displacing along the first reference axis the position of the other end of said flexible member where the distance is smaller.

67. An optical device according to claim 62, further comprising second bending means which provides the compressive stress or tensile stress to said optical waveguide type diffraction grating device by bending said flexible member along a second reference axis which intersects with the first reference axis, to thereby adjust the reflective wavelength in said optical waveguide type diffraction grating device.

68. An optical device according to claim 67, wherein said second bending means has a structure in which a reflective wavelength in said optical waveguide type diffraction grating device when said second bending means does not bend said flexible member is maintained between a first reflective wavelength in said optical waveguide type diffraction grating device upon applying the compressive stress and a second reflective wavelength in said optical waveguide type diffraction grating device upon applying the tensile stress.

69. An optical device according to claim 67, wherein said second bending means includes a solenoid.

70. An optical device according to claim 69, further comprising a shock absorber arranged between said flexible member and the solenoid included in said second bending means.

71. An optical device according to claim 67, wherein said flexible member has a shape which changes the thickness along a predetermined direction, and said second bending means has a structure which secures one end side of said flexible member having a greater thickness, to thereby bend said flexible member by displacing the other end side of said flexible member having a smaller thickness along the second reference axis.

72. An optical device according to claim 67, wherein said optical waveguide type diffraction grating device is secured within said flexible member and changes distance from a surface of said flexible member along a predetermined direction of said flexible member; and
wherein said second bending means has a structure which secures one end side of said flexible member where the distance between the surface of said flexible member and said optical waveguide type diffraction grating device is greater, to thereby bend said flexible member by displacing along the first reference axis the position of the other end of said flexible member where the distance is smaller.

73. An optical device according to claim 62, wherein said optical waveguide type diffraction grating device is secured to said flexible member in a state which is provided with a tensile stress even when said flexible member is not bent.

74. An optical device according to claim 73, wherein the tensile stress provided to said optical waveguide type diffraction grating device in a state where said flexible member is not bent is adjusted so as to become a predetermined optical characteristic in said optical waveguide type diffraction grating device.

75. An optical device according to claim 62, further comprising compensating means which compensates for a characteristic change caused by a temperature change of said optical waveguide type diffraction grating device.

76. An optical module including an optical device according to claim 62.

77. An optical module according to claim 76, further comprising equalizing means for equalizing a wavelength dependence of loss upon reflection or transmission of light in said optical device.

78. An optical transmission system including an optical module according to claim 76.

79. An optical transmission system according to claim 78, wherein a reflective wavelength in said optical waveguide type diffraction grating device when said first bending means does not bend said flexible member is maintained between a first reflective wavelength in said optical waveguide type diffraction grating device upon applying the compressive stress and a second reflective wavelength in said optical waveguide type diffraction grating device upon applying the tensile stress.

* * * * *